United States Patent
Kim et al.

(10) Patent No.: US 9,666,525 B2
(45) Date of Patent: May 30, 2017

(54) THREE-DIMENSIONAL SEMICONDUCTOR MEMORY DEVICE

(71) Applicants: Jeeyong Kim, Hwaseong-si (KR); Daeseok Byeon, Seongnam-si (KR); Jung-Hwan Lee, Seoul (KR); Sanghoon Ahn, Goyang-si (KR)

(72) Inventors: Jeeyong Kim, Hwaseong-si (KR); Daeseok Byeon, Seongnam-si (KR); Jung-Hwan Lee, Seoul (KR); Sanghoon Ahn, Goyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/201,994

(22) Filed: Jul. 5, 2016

(65) Prior Publication Data

US 2017/0062330 A1    Mar. 2, 2017

(30) Foreign Application Priority Data

Aug. 28, 2015  (KR) .................. 10-2015-0121914

(51) Int. Cl.
| | | |
|---|---|---|
| *H01L 29/792* | (2006.01) | |
| *H01L 23/522* | (2006.01) | |
| *H01L 27/1157* | (2017.01) | |
| *H01L 27/11582* | (2017.01) | |
| *H01L 23/528* | (2006.01) | |
| *H01L 27/11573* | (2017.01) | |

(52) U.S. Cl.
CPC ........ *H01L 23/5226* (2013.01); *H01L 23/528* (2013.01); *H01L 27/1157* (2013.01); *H01L 27/11573* (2013.01); *H01L 27/11582* (2013.01)

(58) Field of Classification Search
CPC ............ H01L 23/5226; H01L 23/1157; H01L 23/528; H01L 27/11582; H01L 27/11573
USPC ........................................................ 257/324
See application file for complete search history.

(56) References Cited

U.S. PATENT DOCUMENTS

| | | | |
|---|---|---|---|
| 7,670,924 B2 | 3/2010 | Demos et al. |
| 7,679,133 B2 | 3/2010 | Son et al. |
| 8,553,466 B2 | 10/2013 | Han et al. |
| 8,559,235 B2 | 10/2013 | Yoon et al. |
| 8,643,084 B2 | 2/2014 | Shin et al. |
| 8,654,587 B2 | 2/2014 | Yoon et al. |
| 8,658,499 B2 | 2/2014 | Makala et al. |
| 8,778,749 B2 | 7/2014 | Pachamuthu et al. |
| 8,912,591 B2 | 12/2014 | Baek et al. |
| 8,933,501 B2 | 1/2015 | Makala et al. |

(Continued)

FOREIGN PATENT DOCUMENTS

JP           5420436 B2      2/2014

*Primary Examiner* — David S Blum
(74) *Attorney, Agent, or Firm* — Harness, Dickey & Pierce, P.L.C

(57) ABSTRACT

Three-dimensional (3D) semiconductor memory devices capable of improving reliability may be provided. For example, a three dimensional (3D) memory device, in which a plurality of memory cell strings are vertically arranged, may include a substrate, a stack structure of alternating a plurality of interlayer dielectric (ILD) layers and a plurality of gate electrodes, at least one of the ILD layers including pores, a vertical structure penetrating the stack structure and electrically connected to the substrate, and a data storage layer between the stack structure and the vertical structure.

20 Claims, 43 Drawing Sheets

(56) References Cited

U.S. PATENT DOCUMENTS

| | | |
|---|---|---|
| 2011/0233648 A1 | 9/2011 | Seol et al. |
| 2012/0156890 A1 | 6/2012 | Yim et al. |
| 2014/0061759 A1 | 3/2014 | Lee et al. |
| 2014/0134852 A1 | 5/2014 | Izawa et al. |
| 2015/0099339 A1 | 4/2015 | Kim et al. |
| 2016/0329101 A1* | 11/2016 | Sakakibara ........ G11C 16/0483 |

* cited by examiner

THREE-DIMENSIONAL SEMICONDUCTOR MEMORY DEVICE

CROSS-REFERENCE TO RELATED APPLICATION

This U.S. non-provisional patent application claims priority under 35 U.S.C. §119 to Korean Patent Application No. 10-2015-0121914, filed on Aug. 28, 2015, in the Korean Intellectual Property Office, the disclosure of which is hereby incorporated by reference in its entirety.

BACKGROUND

The inventive concepts relate to a three-dimensional (3D) semiconductor memory device and, more particularly, to a 3D semiconductor memory device with improved reliability.

Semiconductor devices have been highly integrated to satisfy consumer demands for improved performances and/or lower manufacturing costs. For example, to reduce a bit cost (e.g., manufacturing cost per bit) of semiconductor devices, semiconductor devices are desired to have increased densities. In conventional two-dimensional (2D) or planar semiconductor memory devices, integration densities of the semiconductor devices are primarily determined by an area occupied by a unit memory cell. In other words, the integration densities of the 2D or planar semiconductor memory devices are generally limited by a level of a patterning process (e.g., a resolution of a patterning process). In order to from fine patterns, extremely expensive apparatuses are generally used and this may set practical limitations on increasing integration densities for 2D or planar semiconductor memory devices. Thus, three-dimensional (3D) semiconductor memory devices having three-dimensionally arranged memory cells have been developed.

SUMMARY

Some example embodiments of the inventive concepts may provide a three-dimensional (3D) semiconductor memory device capable of improving reliability.

According to an example embodiment, a three dimensional (3D) memory device, in which a plurality of memory cell strings are vertically arranged, may include a substrate, a stack structure on the substrate, the stack structure including a plurality of interlayer dielectric (ILD) layers and a plurality of gate electrodes alternately stacked on each other, at least one of the ILD layers including pores, a vertical structure penetrating the stack structure and electrically connected to the substrate, and a data storage layer between the stack structure and the vertical structure.

In some example embodiments, the pores included in the at least one of the ILD layers may have a substantially uniformly distribution. The pores may have different densities with respect to regions in the at least one of the ILD.

In some example embodiments, the at least one of the ILD layers may include a material having a smaller dielectric constant relative to silicon oxide.

In some example embodiments, the at least one of the ILD layers may include a first sub-ILD layer and a second sub-ILD layer, the first and second sub-ILD layers may be different from each other in terms of at least one of dielectric constants, thicknesses, porosities, and pore sizes.

In some example embodiments, the at least one of the ILD layers may include a first sub-ILD layer and a second sub-ILD layer, the first sub-ILD layer may have a dielectric constant comparable to silicon oxide, and the second sub-ILD layer may include the pores and has a dielectric constant smaller than the first sub-ILD layer.

In some example embodiments, a first ILD layer from among the ILD layers, one gate electrode from among the gate electrodes on the first ILD layer, and a second ILD layer from among the ILD layers on the one gate electrode may have a thickness relationship such that thicknesses of the first ILD layer, the gate electrode, and the second ILD layer increase in an order named.

In some example embodiments, at least two of the ILD layers may have substantially different thicknesses from each other.

In some example embodiments, side surfaces of the ILD layers may protrude past side surfaces of the gate electrodes.

In some example embodiments, the at least one of the ILD layers including pores may include at least one of a top ILD layer including the pores and being located at a top of the stack structure, a center ILD layer including the pores and being at a center of the stack structure, and a bottom ILD layer including the pores and being located at a bottom of the stack structure.

In some example embodiments, the at least one of the ILD layer including the pores may be provided in plurality in a sparse manner.

In some example embodiments, every other one of the ILD layers may include pores such that the at least one of the ILD layers including pores is a multitude of ILD layers including the pores.

In some example embodiments, the vertical structure may include a first portion and a second portion, the first portion may have a pipe shape and be closed at a bottom thereof, the second portion may have a pipe shape and be connected to the first portion, and the first portion may electrically connect the second portion to the substrate.

In some example embodiments, the closed bottom of the first portion may be lower than a top surface of the substrate.

In some example embodiments, the data storage layer may include a first portion extending between the vertical structure and the stack structure and a second portion horizontally extending between the ILD layers and the gate electrodes.

In some example embodiments, a dielectric constant of the at least one of the ILD layers may be lower than a dielectric constant of the data storage layer.

In some example embodiments, the 3D memory device may further include a common source plug penetrating the stack structure while being spaced apart from the vertical structure, the common source plug electrically connected to the vertical structure through the substrate and a sidewall insulating spacer between the common source plug and the stack structure.

In some example embodiments, a dielectric constant of the ILD layers may be lower than a dielectric constant of the sidewall insulating spacer.

According to an example embodiment, a three dimensional (3D) memory device, in which a plurality of memory cell strings are vertically arranged, may include peripheral circuitry, and a cell array structure on the peripheral circuitry and electrically connected to the peripheral circuitry. The cell array structure may include a substrate, a stack structure including a plurality of interlayer dielectric (ILD) layers and a plurality of gate electrodes alternately stacked, at least one of the ILD layers including pores, a vertical structure penetrating the stack structure and electrically connected to the substrate, and a data storage layer between the stack structure and the vertical structure.

In some example embodiments, the pores may be substantially uniformly distributed in the at least one of the ILD layers. The pores may be distributed in different densities according to regions in the at least one of the ILD layers.

In some example embodiments, the at least one of the ILD layers may include a material having a dielectric constant smaller than silicon oxide.

In some example embodiments, when the at least one of the ILD layers includes a first sub-ILD layer and a second sub-ILD layer, the first and second sub-ILD layers may be different from each other in terms of at least one of dielectric constants, thicknesses, porosities, and pore sizes.

In some example embodiments, the at least one of the ILD layers may include a first sub-ILD layer and a second sub-ILD layer, the first sub-ILD layer may have a dielectric constant comparable to silicon oxide, and the second sub-ILD layer may have a dielectric constant smaller than silicon oxide.

In some example embodiments, the peripheral circuitry may include at least one of a row decoder, a column decoder, a page buffer, and a control circuit.

According to an example embodiments, a three dimensional (3D) memory device, in which a plurality of memory cell strings are vertically arranged, may include a substrate, a stack structure on the substrate, the stack structure including a plurality of interlayer dielectric (ILD) layers and a plurality of gate electrodes alternately stacked on each other, the ILD layers including at least one non-porous ILD layer having a first dielectric constant and at least one porous ILD layer having a second dielectric constant, the second dielectric constant being smaller than the first dielectric constant, vertical structure penetrating the stack structure and electrically connected to the substrate, and a data storage layer between the stack structure and the vertical structure.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
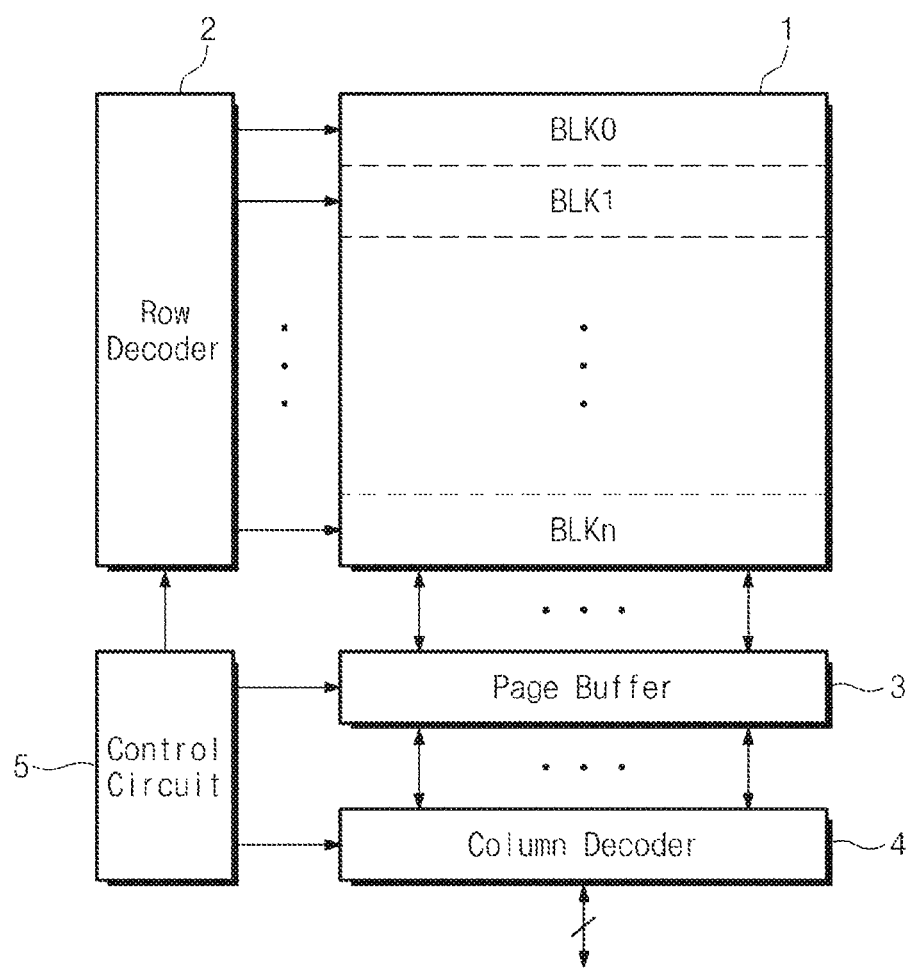
FIG. 1 is a schematic block diagram illustrating a three-dimensional (3D) semiconductor memory device according to an example embodiment of the inventive concepts.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are merely provided so that this disclosure will be thorough and complete, and will fully convey the scope of example embodiments to those skilled in the art. In the drawings, the sizes and relative sizes of the various layers and regions may have been exaggerated for clarity. Like numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. In addition, it will be understood that when an element such as a layer, region or substrate is referred to as being "on" another element, it can be directly on the other element or intervening elements may be present. In contrast, the term "directly" means that there are no intervening elements.

Moreover, some example embodiments are described herein with reference to cross-sectional views and/or plan views that are idealized example views. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Expressions such as "at least one of," when preceding a list of elements, modify the entire list of elements and do not modify the individual elements of the list.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of arrays of memory cells having an active area disposed above the substrate and circuitry associated with the operation of those memory cells, whether such associated circuitry is above or within such substrate. The layers of each level of the array may be directly deposited on the layers of each underlying level of the array. The term "monolithic" means that layers of each level of the array are directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648.

Some example embodiments of the inventive concepts will now be described more fully hereinafter with reference to the accompanying drawings.

FIG. 1 is a schematic block diagram illustrating a three-dimensional (3D) semiconductor memory device according to an example embodiment of the inventive concepts.

Referring to FIG. 1, a 3D semiconductor memory device may include a memory cell array 1, a row decoder 2, a page buffer 3, a column decoder 4, and a control circuit 5.

The memory cell array 1 may include a plurality of memory blocks BLK0 to BLKn. Each of the memory blocks BLK0 to BLKn may include a plurality of memory cells, a plurality of word lines, and a plurality of bit lines. The word lines and the bit lines may be electrically connected to the memory cells.

The row decoder 2 may decode an address signal inputted from an external system to select one of the word lines. The address signal decoded in the row decoder 2 may be provided to a row driver (not shown). The row driver may provide word line voltages generated from a voltage generation circuit (not shown) to the selected word line and unselected word lines in response to a control signal of the control circuit 5. The row decoder 2 may be connected in common to the plurality of memory blocks BLK0 to BLKn and may provide driving signals to the word lines of one memory block selected by a block selection signal.

The page buffer 3 may be connected to the memory cell array 1 through the bit lines to sense data stored in the memory cells. The page buffer 3 may be connected to a bit line selected by an address signal decoded in the column decoder 4. According to an operation mode, the page buffer 3 may temporarily store data to be stored in the memory cells or may sense data stored in the memory cells. For example, the page buffer 3 may be operated as a write driver during a program operation mode and may be operated as a sense amplifier during a sensing operation mode. The page buffer 3 may receive a power (e.g., a voltage or a current)

from the control circuit 5 and may provide the received power to the selected bit line.

The column decoder 4 may provide a data-transmitting path between the page buffer 3 and an external device (e.g., a memory controller). The column decoder 4 may decode an inputted address signal to select one of the bit lines. The column decoder 4 may be connected in common to the plurality of memory blocks BLK0 to BLKn and may provide data to the bit lines of the memory block selected by the block selection signal.

The control circuit 5 may control overall operations of the 3D semiconductor memory device. The control circuit 5 may receive control signals and an external voltage and may operate in response to the received control signals. The control circuit 5 may include a voltage generator that generates voltages (e.g., a program voltage, a sensing voltage, and an erase voltage) used for internal operations by means of the external voltage. The control circuit 5 may control a sensing operation, a write operation, and/or an erase operation in response to the control signals.

Figure 2:
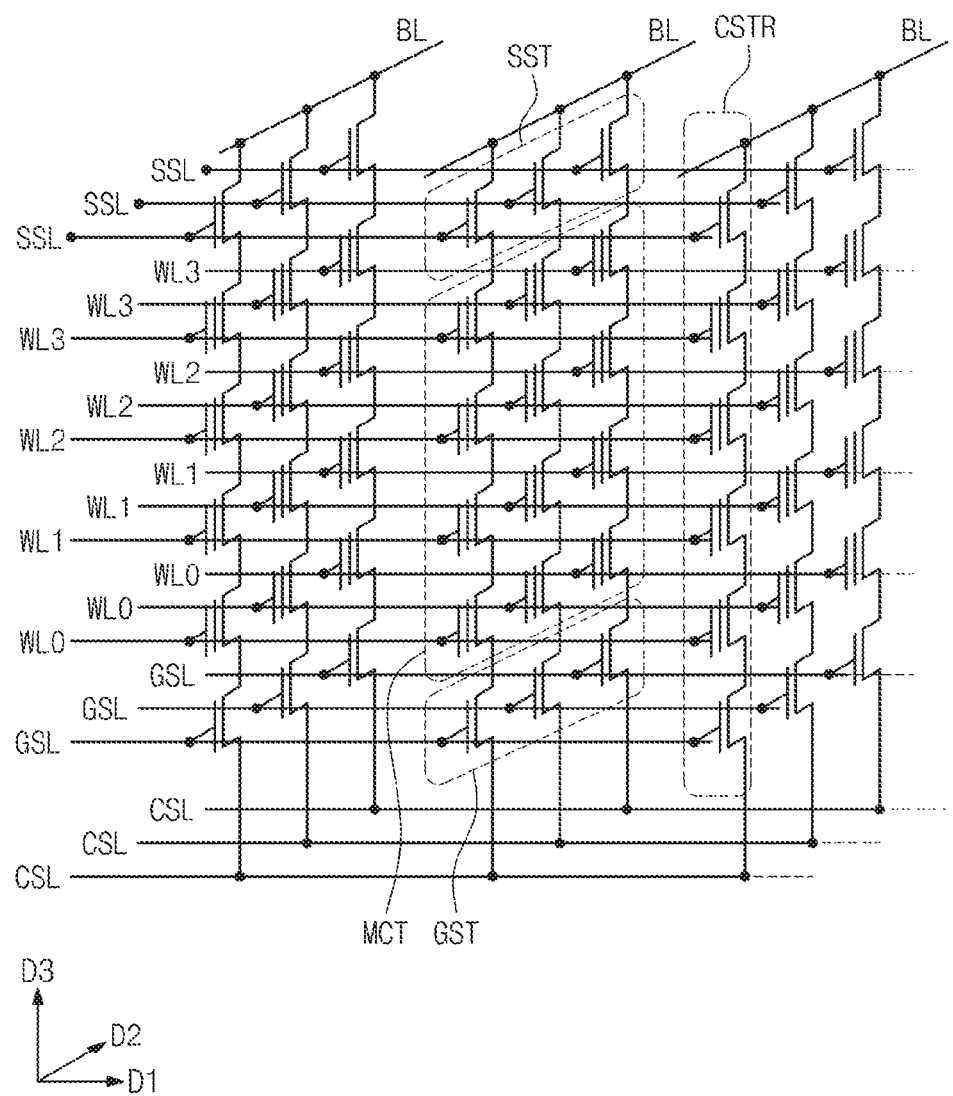
FIG. 2 is a circuit diagram illustrating a cell array of a 3D semiconductor memory device according to an example embodiment of the inventive concepts.

FIG. 2 is a circuit diagram illustrating a cell array of a 3D semiconductor memory device according to an example embodiment of the inventive concepts.

Referring to FIG. 2, a cell array of a 3D semiconductor memory device according to an example embodiment of the inventive concept may include a common source line CSL, a plurality of bit lines BL, and a plurality of cell strings CSTR connected between the common source line CSL and the bit lines BL.

The bit lines BL may be two-dimensionally arranged. A plurality of the cell strings CSTR may be connected in parallel to each of the bit lines BL. The cell strings CSTR may be connected in common to the common source line CSL. In other words, a plurality of the cell strings CSTR may be disposed between one common source line CSL and the plurality of bit lines BL. In an example embodiment, the common source line CSL may be two-dimensionally provided in plurality. The same voltage may be applied to the plurality of the common source lines CSL. Alternatively, the common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT interposed between the ground and string selection transistors GST and SST. The ground selection transistor GST, the memory cell transistors MCT and the string selection transistor SST may be connected in series to each other in the order named.

The common source line CSL may be connected in common to sources of the ground selection transistors GST. A ground selection line GSL, a plurality of word lines WL0 to WL3 and a string selection line SSL, which are disposed between the common source line CSL and the bit lines BL, may be used as gate electrodes of the ground selection transistor GST, the memory cell transistors MCT and the string selection transistor SST, respectively. Each of the memory cell transistors MCT may include a data storage element.

Figure 3:
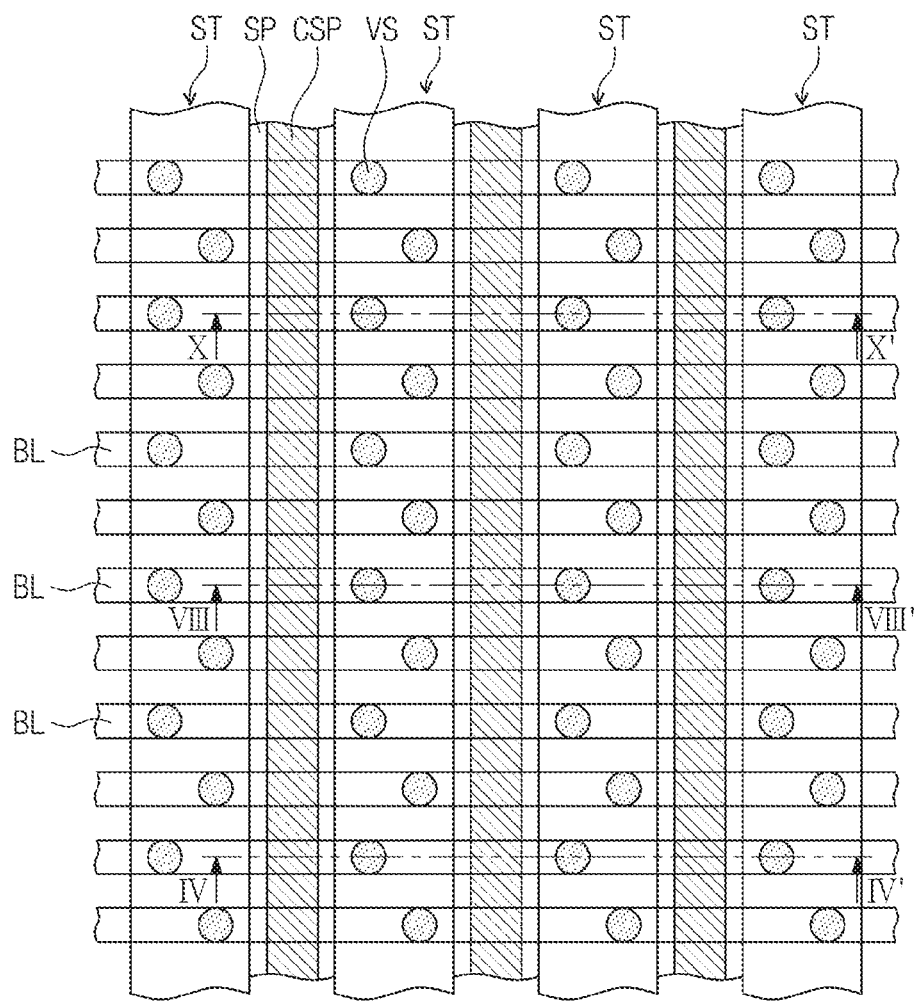
FIG. 3 is a plan view illustrating a 3D semiconductor memory device according to an example embodiment of the inventive concepts.
Figure 4:
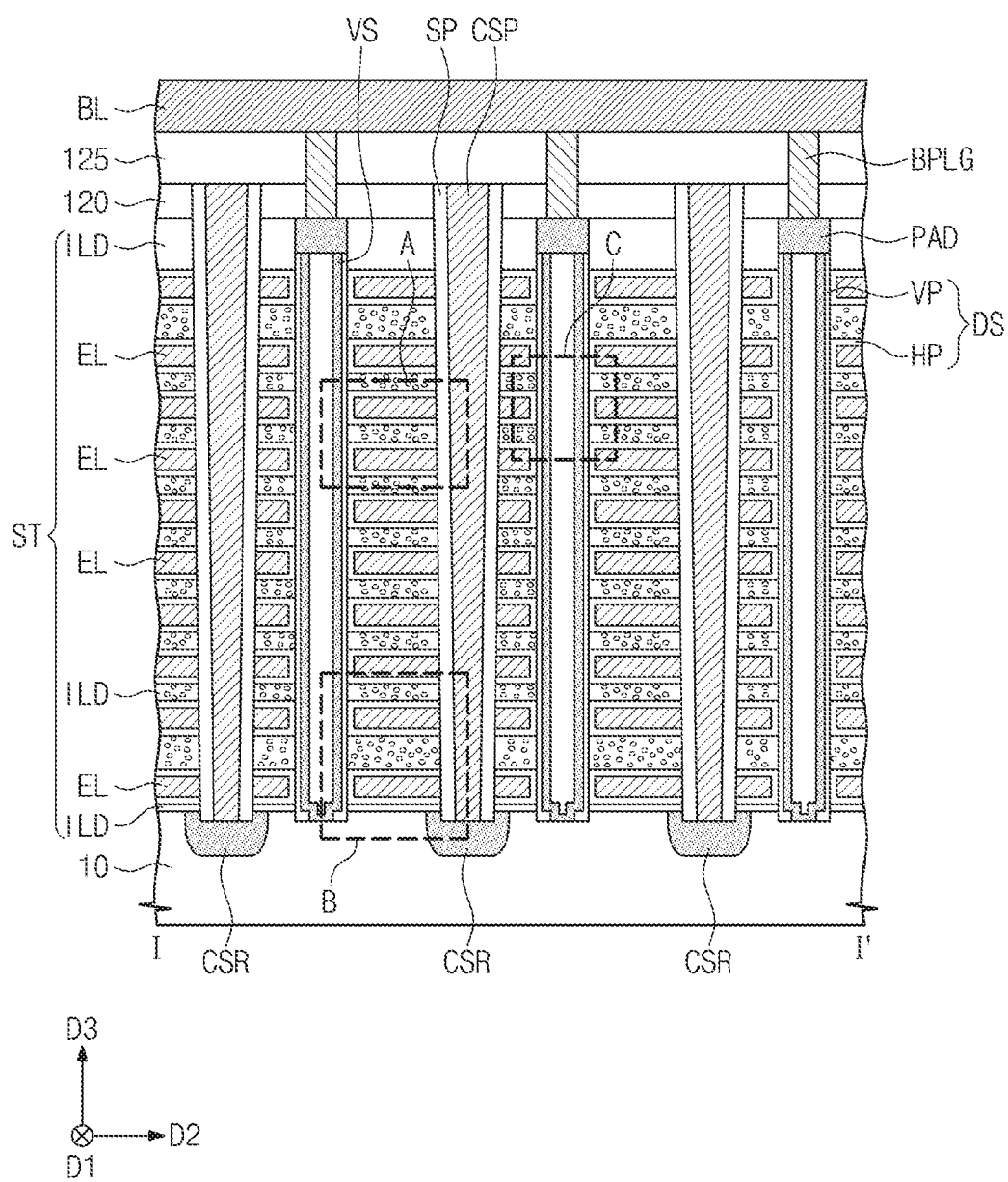
FIG. 4 is a cross-sectional view taken along line IV-IV' of FIG. 3 to illustrate a 3D semiconductor memory device according to an example embodiment of the inventive concepts.

FIG. 3 is a plan view illustrating a 3D semiconductor memory device according to an example embodiment of the inventive concepts. FIG. 4 is a cross-sectional view taken along a line IV-IV' of FIG. 3 to illustrate a 3D semiconductor memory device according to an example embodiment of the inventive concepts. FIGS. 5A to 5L are enlarged views of a portion 'A' of FIG. 4. FIGS. 6A to 6C are enlarged views of a portion 'B' of FIG. 4. FIGS. 7A to 7E are enlarged views of a portion 'C' of FIG. 4.

Referring to FIGS. 3 and 4, stack structures ST may be disposed on a substrate 10 to extend in parallel in a first direction D1 and may be spaced apart from each other in a second direction D2.

The substrate 10 may be a bulk silicon substrate, a silicon-on-insulator (SOI) substrate, a germanium substrate, a germanium-on-insulator (GOI) substrate, a silicon-germanium substrate, or a substrate including an epitaxial layer obtained by performing a selective epitaxial growth (SEG) process. The substrate 10 may be formed of a semiconductor material including at least one of, but not limited to, silicon (Si), germanium (Ge), silicon-germanium (SiGe), gallium-arsenic (GaAs), indium-gallium-arsenic (InGaAs), aluminum-gallium-arsenic (AlGaAs), or any combination thereof.

Each of the stack structures ST may include a plurality of horizontal electrodes EL vertically stacked on the substrate 10 and a plurality of insulating layers ILD disposed between the horizontal electrodes EL. In other words, the horizontal electrodes EL may be stacked in a third direction D3 which is perpendicular to a top surface of the substrate 10. In the stack structures ST, thicknesses of the insulating layers ILD may be changed according to characteristics of the 3D semiconductor memory device. In some example embodiments, the lowermost one of the insulating layers ILD may be thinner than other ones of the insulating layers ILD, and the other ones of the insulating layers ILD may have the substantially same thickness. In other example embodiments, one or some of the insulating layers ILD may be thicker than the other one(s) of the insulating layers ILD.

According to some example embodiments, the insulating layers ILD may be formed of a dielectric material, a dielectric constant of which is lower than that of silicon oxide. The insulating layer ILD may be formed of one or more layers. The insulating layers ILD may have a dielectric constant of about 1.0 to about 3.0 and may include at least one of an organic material, an inorganic material, and an organic-inorganic hybrid material. The insulating layer ILD may be a porous insulating layer or a non-porous insulating layer.

In some example embodiments, the insulating layer ILD may be formed of an impurity-doped oxide. For example, the impurity-doped oxide may include fluorine-doped oxide (or fluorine-doped silicate glass (FSG)), carbon-doped oxide, silicon oxide, hydrogen silsesquioxane (SiO:H; HSQ), methyl silsesquioxane (SiO:CH3; MSQ), or a-SiOC (SiOC:H). In some example embodiments, the insulating layer ILD may be formed of an organic polymer having a low dielectric constant (i.e., a low-k organic polymer). For example, the low-k organic polymer may include polyallylether-based resin, ring-shaped fluorine resin, siloxane copolymer, polyallylether fluoride-based resin, polypentafluorostylene, polytetrafluorostylene-based resin, polyimide fluoride resin, polynaphthalene fluoride, or polycide.

According to some example embodiments of the inventive concepts, because the dielectric constant of the insulating layers ILD of the stack structures ST is reduced, parasitic capacitances between the vertically stacked horizontal electrodes EL may be reduced during operation of the 3D semiconductor memory device. Some example embodiments of the insulating layers ILD of the 3D semiconductor memory device will be described in detail with reference to FIGS. 5A to 5L and 6A to 6C.

According to some example embodiment, vertical structures VS may penetrate each of the stack structures ST to be connected to the substrate 10. The vertical structures VS may extend along the third direction D3, which is perpendicular to the top surface of the substrate 10. In some example embodiments, the vertical structures VS may include a semiconductor material. Bottom surfaces of the vertical structures VS may be disposed at a level between a top surface and a bottom surface of the substrate 10. In other words, the bottom surfaces of the vertical structures VS may be lower than the top surface of the substrate 10. Contact pads PAD may be disposed on the top ends of the vertical structures VS and connected to bit line contact plugs BPLG.

In some example embodiments, each of the vertical structures VS may include a first semiconductor pattern SP1 in contact with the substrate 10 and a second semiconductor pattern SP2 disposed between the first semiconductor pattern SP1 and a data storage layer DS, as illustrated in FIGS. 5A to 5L and 6A to 6C. The first semiconductor pattern SP1 may have, for example, a pillar shape, a hollow pipe (e.g., a cylinder) shape, or a hollow macaroni shape. A bottom end of the first semiconductor pattern SP1 may be closed, and the inside of the first semiconductor pattern SP1 may be filled with a filling insulation pattern VI. The first semiconductor pattern SP1 may be in contact with an inner sidewall of the second semiconductor pattern SP2 and the substrate 10. In other word, the first semiconductor pattern SP1 may electrically connect the second semiconductor pattern SP2 to the substrate 10. A bottom surface of the first semiconductor pattern SP1 may be disposed at a level lower than the top surface of the substrate 10. The second semiconductor pattern SP2 may have a pipe or macaroni shape having opened top and bottom ends. The first and second semiconductor patterns SP1 and SP2 may be undoped or may be doped with dopants of the same conductivity type as those of the substrate 10. The first and second semiconductor patterns SP1 and SP2 may be in, for example, a polycrystalline state or a single-crystalline state.

The data storage layer DS may be disposed between the stack structure ST and the vertical structure VS. The data storage layer DS may include a vertical insulating pattern VP penetrating the stack structure ST, and a horizontal insulating pattern HP extending from between the vertical insulating pattern VP and each of the horizontal electrodes EL onto top and bottom surfaces of each of the horizontal electrodes EL. In some example embodiments, the vertical insulating pattern VP of the data storage layer DS may surround a sidewall of the vertical structure VS and may be in direct contact with the substrate 10, as illustrated in FIGS. 6A to 6C. The data storage layer DS according to some example embodiments of the inventive concepts will be described later in more detail with reference to FIGS. 7A to 7E.

Each of common source regions CSR may be disposed in the substrate 10 between the stack structures ST adjacent to each other. The common source regions CSR may extend in the first direction D1. The substrate 10 may be doped with dopants of a first conductivity type (e.g., P-type dopants), and the common source regions CSR may be formed by doping the substrate 10 with dopants of a second conductivity type (e.g., N-type dopants such as arsenic (As) or phosphorus (P)).

A common source plug CSP may be connected to each of the common source region CSR, and sidewall insulating spacers SP may be disposed between the common source plug CSP and the stack structures ST, respectively. In some example embodiments, the common source plug CSP may have a substantially uniform upper width and extend in the first direction D1. The sidewall insulating spacers SP may face each other between the stack structures ST adjacent to each other. For example, an insulating layer may be formed on a sidewall and a bottom of a space provided between the stack structures ST adjacent to each other, and the common source plug CSP may be formed to penetrate the insulating layer on the bottom of the space to form the sidewall insulating spacer SP. Thus, the common source plug CSP may be locally connected to the common source region CSR.

An upper filling insulation layer 120 and a capping insulating layer 125 may cover the plurality of stack structures ST, and bit lines BL may be disposed on the capping insulating layer 125. The bit lines BL may extend in the second direction D2 to intersect with the stack structures ST. The bit lines BL may be electrically connected to the vertical structures VS through the bit line contact plugs BPLG.

In some example embodiments, the 3D semiconductor memory device may be a Vertical NAND flash memory device. In this case, the horizontal electrodes EL may be used as control gate electrodes of the memory cell transistors of MCT of FIG. 2. In an example embodiment, the horizontal electrodes EL between the uppermost horizontal electrode EL and the lowermost horizontal electrode EL may be used as the control gate electrodes and word lines connecting the control gate electrodes. The horizontal electrodes EL may be coupled to the vertical structures VS to constitute the memory cell transistors MCT of FIG. 2. In each of the stack structures ST, the lowermost and uppermost horizontal electrodes EL may be used as gate electrodes of the selection transistors SST and GST of FIG. 2. For example, the uppermost horizontal electrode EL may be used as the gate electrode of the string selection transistor SST of FIG. 2 controlling electrical connection between the bit line BL and the vertical structure VS, and the lowermost horizontal electrode EL may be used as the gate electrode of the ground selection transistor GST of FIG. 2 controlling electrical connection between the common source region CSR and the vertical structure VS.

In the 3D semiconductor memory device described above, at least one of the insulating layers ILD may include a low-k dielectric layer having a dielectric constant lower than that of silicon oxide. For example, at least one of the insulating layers ILD may include a low-k dielectric layer having pores P. In some example embodiments, an insulating layer including pore generators (e.g., porogens) may be formed, and then, the porogens may be removed to form pores in the insulating layer ILD. Sizes (e.g., diameters) of the pores P in the insulating layer ILD may be in a range of several nm to several hundred nm. Because the dielectric constant k of the porous low-k dielectric layer decreases as the sizes of the pores P increase, a parasitic capacitance between vertically adjacent horizontal electrodes EL may be reduced. For example, the porous low-k dielectric layer may include at least one of a SiOCH layer, a SiOC layer, and a SiOF layer. The sizes (e.g., diameters) of the pores P in the porous low-k dielectric layer may be in a range of several nm to hundreds nm. For example, the porous low-k dielectric layer may have a porosity of 5 vol % to 50 vol %. Further, the porous low-k dielectric layer may include pores P of various sizes. In some example embodiments, the uniformity of the pores P in the porous low-k dielectric layer may be controlled.

Furthermore, the horizontal electrodes EL and the insulating layers ILD constituting the stack structure ST may have tensile stress and compressive stress, and thus stress applied to the substrate 10 may increase as the number of the stacked horizontal electrodes EL and the number of the stacked insulating layers ILD increase. As a result, a warpage phenomenon of the substrate 10 may occur. In the event that at least one of the insulating layers ILD in the stack structure ST is formed to include the pores P, the stress of the insulating layers ILD (e.g., the stress of the stack structure ST) may be controlled.

Referring to FIGS. 5A to 5L, a thickness t1 of one or some of the insulating layers ILD constituting the stack structure ST may be smaller than a thickness t2 of each horizontal electrode EL. In some example embodiments, a horizontal thickness of each insulating layer ILD (i.e., a distance from the sidewall of the vertical structure VS to the sidewall of the insulating layer ILD adjacent to the common source plug CSP) may be greater than a horizontal thickness of each horizontal electrode EL in the stack structure ST. Thus, the sidewall of the stack structure ST adjacent to the common source plug CSP may have a plurality of recessed regions. Here, each of the recessed regions may be defined by the insulating layers ILD vertically adjacent to each other and the horizontal electrode EL disposed between the vertically adjacent insulating layers ILD, and the recessed regions may be filled with the sidewall insulating spacer SP. In other example embodiments, horizontal thicknesses of the horizontal electrodes EL from the sidewall of the vertical structure VS may be substantially equal to horizontal thicknesses of the insulating layers ILD from the sidewall of the vertical structure VS.

The insulating layers ILD may include the pores P and may have a lower dielectric constant than at least one layer (e.g., the horizontal insulating pattern HP) included in the data storage layer DS. Further, the dielectric constant of the insulating layers ILD may be lower than that of the sidewall insulating spacer SP.

Figure 5A:
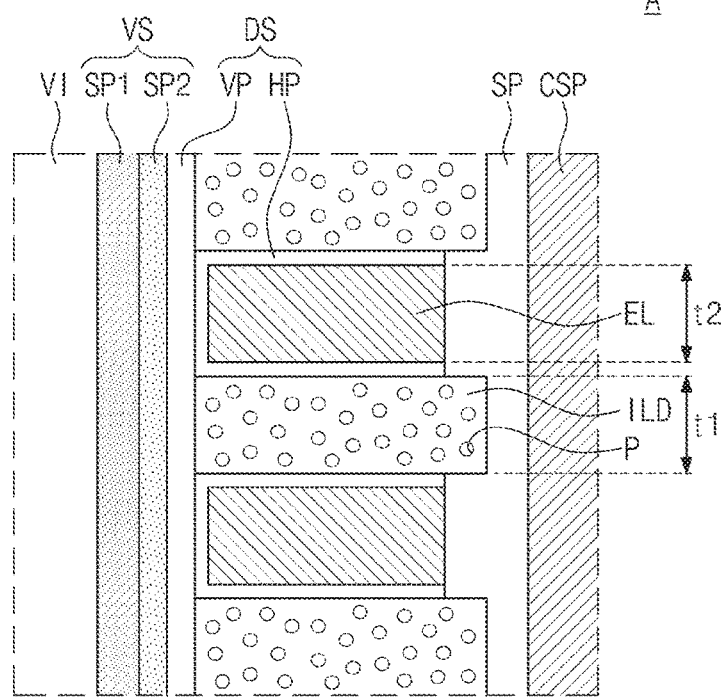
FIGS. 5A to 5L are enlarged views of a portion 'A' of FIG. 4.
Figure 5B:
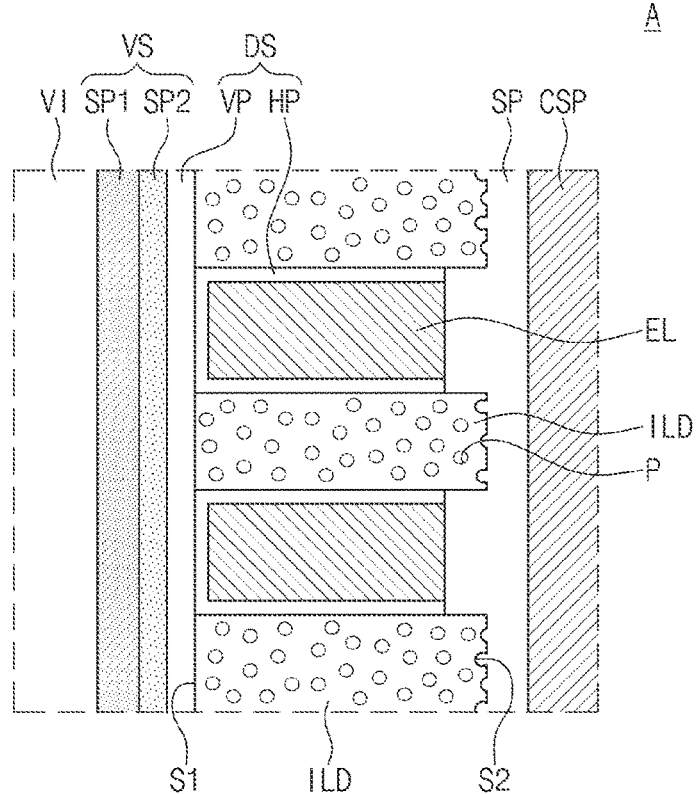
Figure 6A:
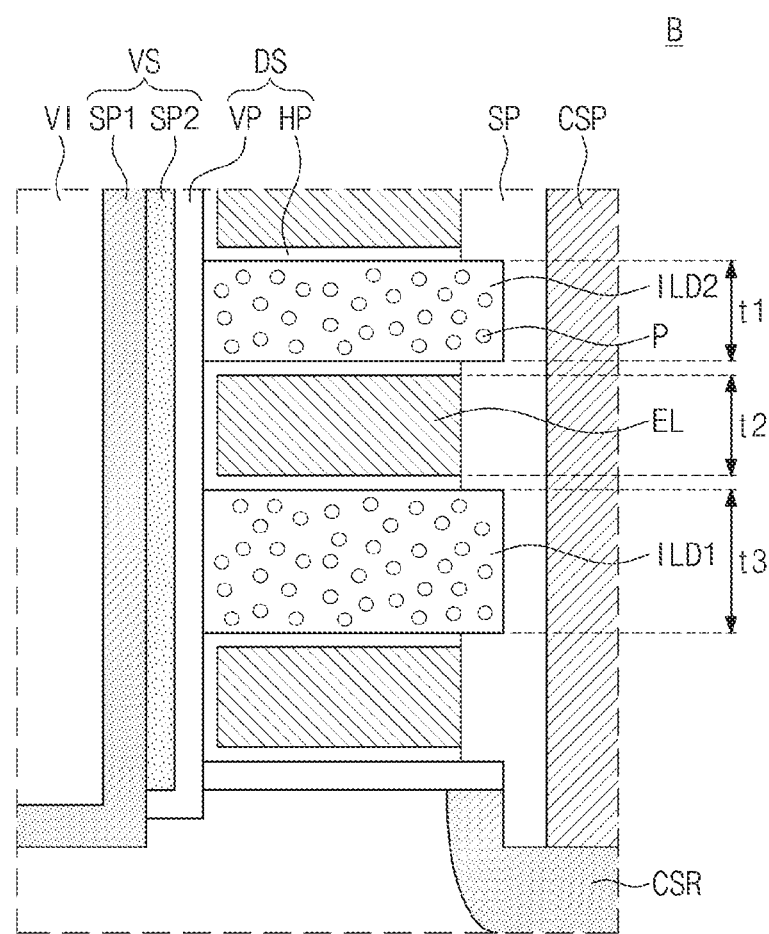
FIGS. 6A to 6C are enlarged views of a portion 'B' of FIG. 4.
Figure 6B:
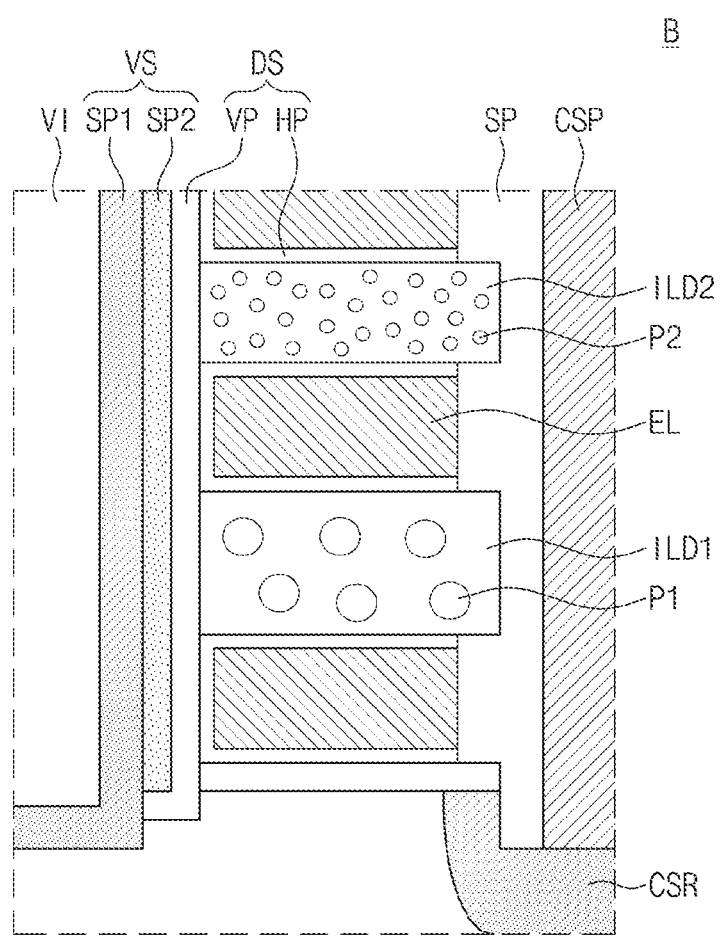
Figure 6C:
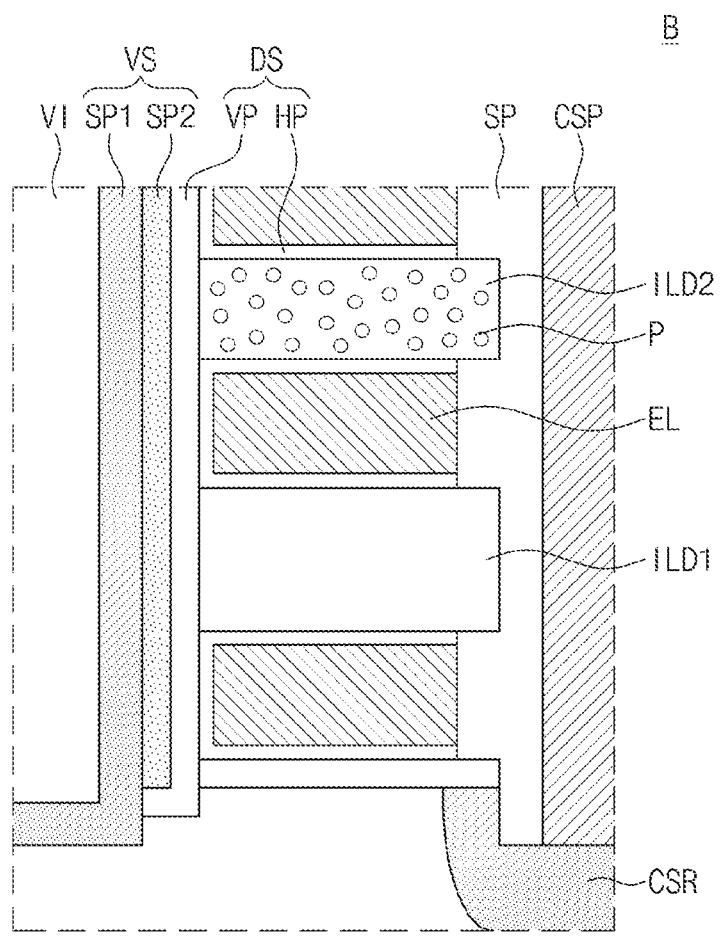

According to the example embodiment illustrated in FIG. 5B, each of the insulating layers ILD may have a first sidewall S1 adjacent to the vertical structure VS and a second sidewall S2 adjacent to the common source plug CSP. Here, the second sidewall S2 may have concave regions formed by exposed pores P, and the concave regions may be filled with the sidewall insulating spacer SP. In other word, the insulating layer ILD including the pores P may have the second sidewall S2 which is uneven.

Figure 5C:
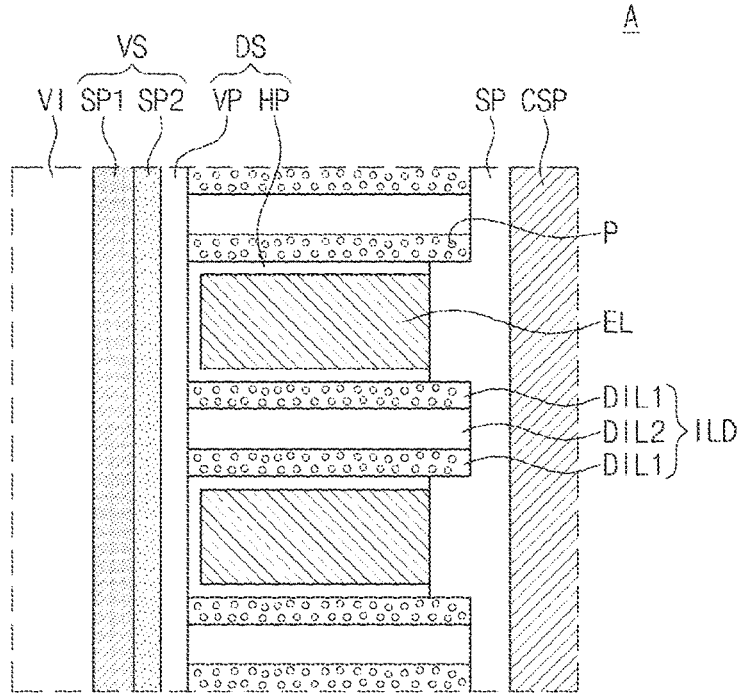
Figure 5D:
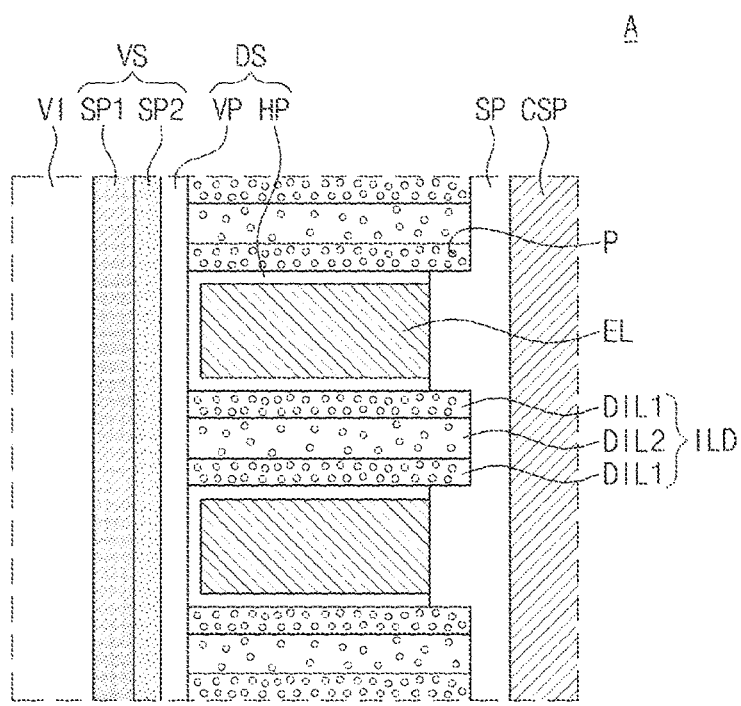
Figure 5E:
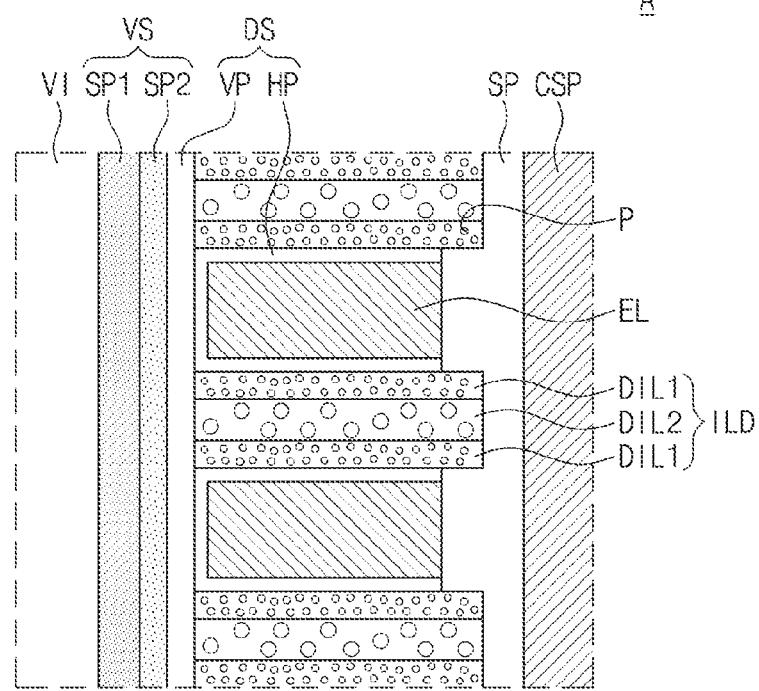

According to the example embodiments illustrated in FIGS. 5C, 5D, and 5E, each of the insulating layers ILD constituting the stack structure ST may include first dielectric layers DIL1 and a second dielectric layer DIL2, and the insulating layers ILD are disposed between the horizontal electrodes EL vertically adjacent to each other.

In some example embodiments, at least two first dielectric layers DIL1 may be disposed between the horizontal electrodes EL vertically adjacent to each other, and the second dielectric layer DIL2 may be disposed between the at least two first dielectric layers DIL1. As illustrated in FIGS. 5C, 5D, and 5E, a thickness of the first dielectric layer DIL1 may be different from that of the second dielectric layer DIL2. According to other example embodiments, the thicknesses of the first and second dielectric layers DIL1 and DIL2 may be substantially equal to each other.

In some example embodiments, the first dielectric layer DIL1 and the second dielectric layer DIL2 may have dielectric constants different from each other. In an example embodiment, the first dielectric layers DIL1 may be porous low-k dielectric layers and the second dielectric layer DIL2 may be a non-porous low-k dielectric layer, as illustrated in FIG. 5C. The dielectric constant of the first dielectric layers DIL1 may be lower than that of the second dielectric layer DIL2.

Because the non-porous low-k dielectric layer is disposed between the porous low-k dielectric layers including the pores P, the vertically adjacent horizontal electrodes EL may be prevented from collapsing. Furthermore, the compressive stress of the porous low-k dielectric layer including the pores P may be less than that of the non-porous low-k dielectric layer. In other word, the compressive stress of the first dielectric layers DIL1 may be less than that of the second dielectric layer DIL2.

Referring to FIG. 5D, the first and second dielectric layers DIL1 and DIL2 may include the pores P in a way that a porosity of the first dielectric layers DIL1 is greater than that of the second dielectric layer DIL2. Thus, the dielectric constant of the dielectric layers DIL1 may be lower than that of the second dielectric layer DIL2.

Referring to FIG. 5E, the first and second dielectric layers DIL1 and DIL2 may include the pores P, and sizes of the pores P of the first dielectric layers DIL1 may be smaller than those of the pores P of the second dielectric layer DIL2.

Figure 5F:
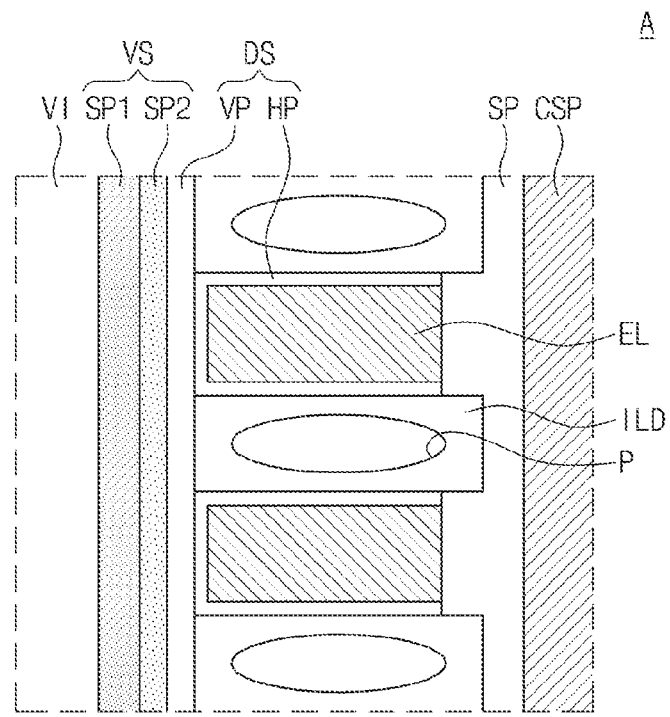
Figure 5G:
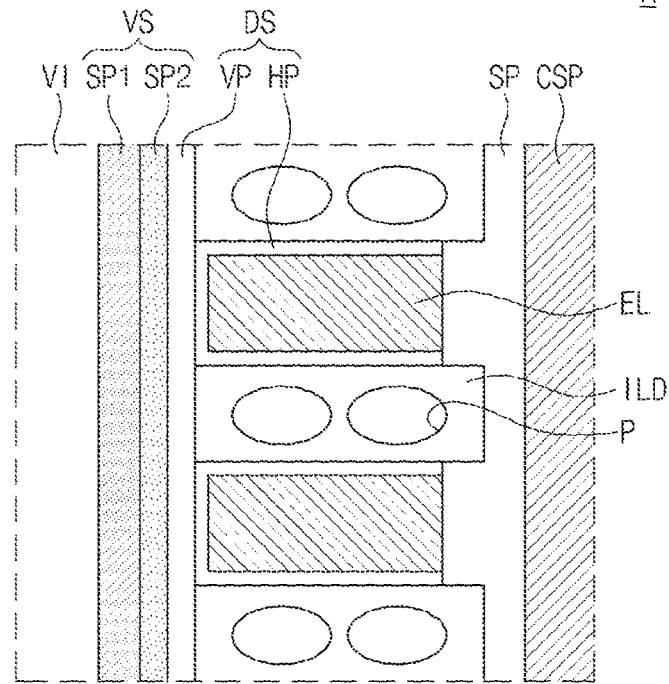
Figure 5H:
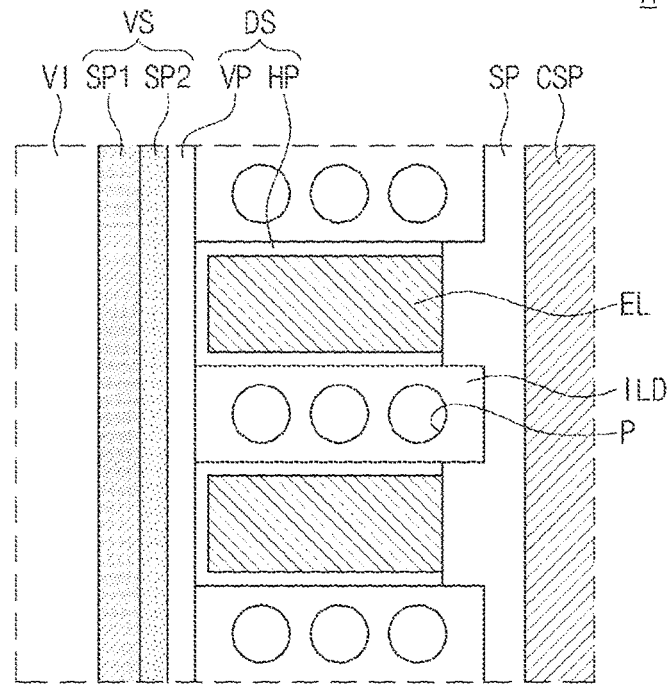
Figure 5I:
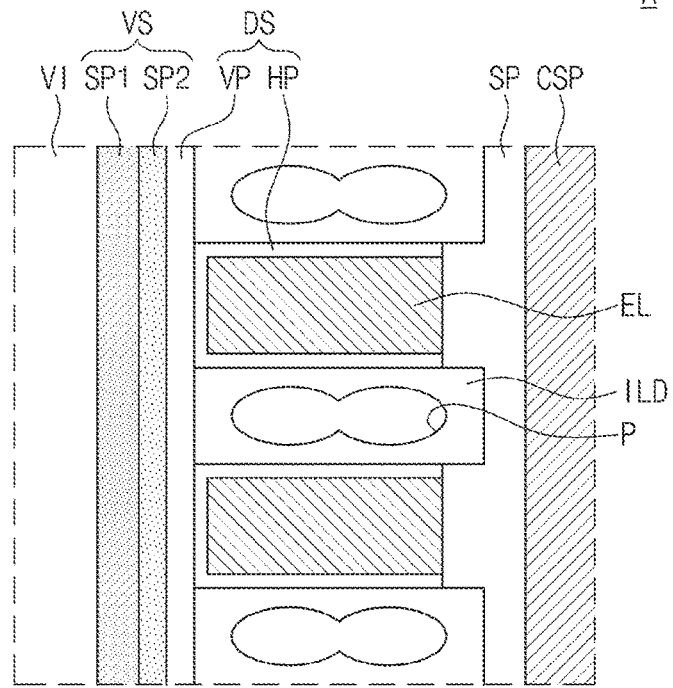
Figure 5J:
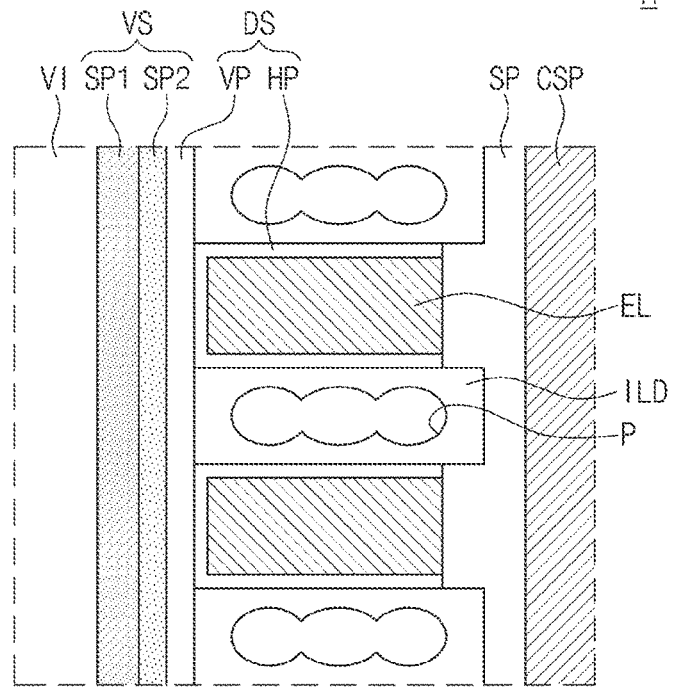
Figure 5K:
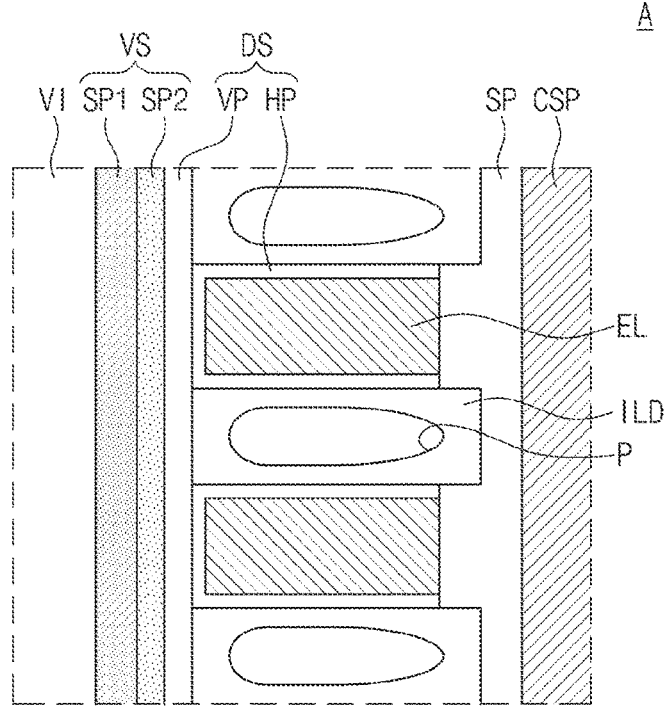
Figure 5L:
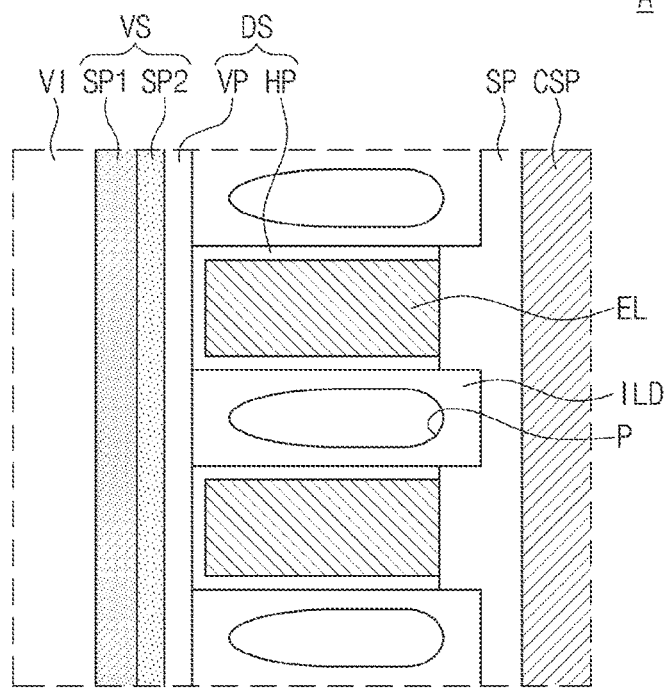

In some example embodiments, each of the insulating layers ILD may include one or more pores P. The number of the pores P of the insulating layer ILD may be changed, as illustrated in FIGS. 5F to 5H. Further, the pores P of the insulating layer ILD may have various shapes, as illustrated in FIGS. 5I to 5L.

Referring to FIGS. 6A, 6B, and 6C, the insulating layers constituting the stack structure ST may include a first insulating layer ILD1 and a second insulating layer IDL2. The second insulating layer ILD2 may have a first thickness t1, and the first insulating layer ILD1 may have a third thickness t3 greater than the first thickness t1. The horizontal electrode EL between the first and second insulating layers ILD1 and ILD2 may have a second thickness t2 that is greater than the first thickness t1 and smaller than the third thickness t3. In some example embodiments, the first insulating layer ILD1 may be disposed between one horizontal electrode EL used as the word line WL of FIG. 2 and one horizontal electrode EL used as the ground or string selection line GSL or SSL of FIG. 2. The second insulating layer ILD2 may be disposed between the horizontal electrodes EL used as the word lines WL of FIG. 2.

Referring to FIG. 6A, the first and second insulating layers ILD1 and ILD2 may include the pores P. The sizes of the pores P of the first insulating layer ILD1 may be substantially equal to those of the pores P of the second insulating layer ILD2. In other words, a porosity of the first insulating layer ILD1 may be substantially equal to that of the second insulating layer ILD2. In some example embodiments, the first insulating layer ILD1 may have first pores P1 and the second insulating layer ILD2 may have second pores P2 smaller than the first pores P1, as illustrated in FIG. 6B. Because the sizes of the first pores P1 are different from those of the second pores P2, the first and second insulating layers ILD1 and ILD2 may have dielectric constants different from each other even when the first and second insulating layers ILD1 and ILD2 are formed of the same material. In the example embodiment illustrated in FIG. 6C, the first insulating layer ILD1 may be a non-porous layer, and the second insulating layer ILD2 may be a porous layer. For example, the first insulating layer ILD1 may be a non-porous low-k dielectric layer and the second insulating layer ILD2 may be a porous low-k dielectric layer.

Hereinafter, the data storage layers according to various example embodiments of the inventive concepts will be described with reference to FIGS. 7A to 7E.

According to some example embodiments of the inventive concepts, the 3D semiconductor memory device may be a NAND flash memory device. For example, the data storage layer DS between the stack structure ST and the vertical structure VS may include a tunnel insulating layer TIL, a charge storage layer CIL, and a blocking insulating layer BK. Data stored in the data storage layer DS may be changed using Flower-Nordheim tunneling caused by a voltage difference between the horizontal electrode EL and the vertical structure VS including the semiconductor material.

Figure 7A:
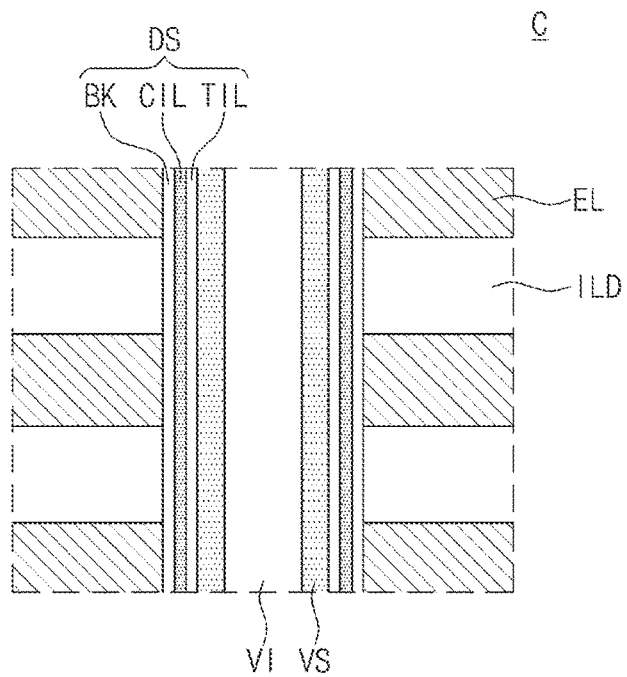
FIGS. 7A to 7E are enlarged views of a portion 'C' of FIG. 4.

According to the example embodiment illustrated in FIG. 7A, the tunnel insulating layer TIL, the charge storage layer CIL, and the blocking insulating layer BK may extend from between the horizontal electrode EL and the vertical structure VS to between the insulating layer ILD and the vertical structure VS. In some example embodiments, the insulating layers ILD may be in direct contact with the horizontal electrodes EL.

Figure 7B:
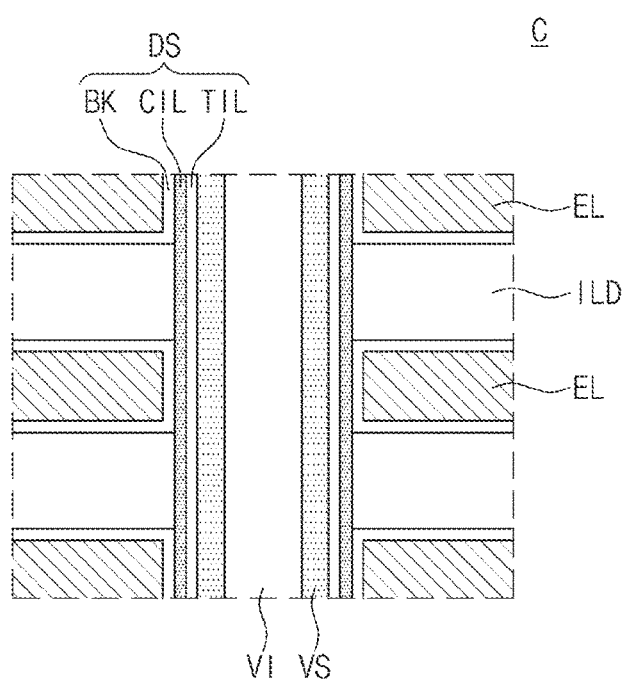

According to the example embodiment illustrated in FIG. 7B, the tunnel insulating layer TIL and the charge storage layer CIL may extend from between the horizontal electrode EL and the vertical structure VS to between the insulating layer ILD and the vertical structure VS. The blocking insulating layer BK may extend between the horizontal electrode EL and the vertical structure VS, for example, onto top and bottom surfaces of the horizontal electrode EL.

Figure 7C:
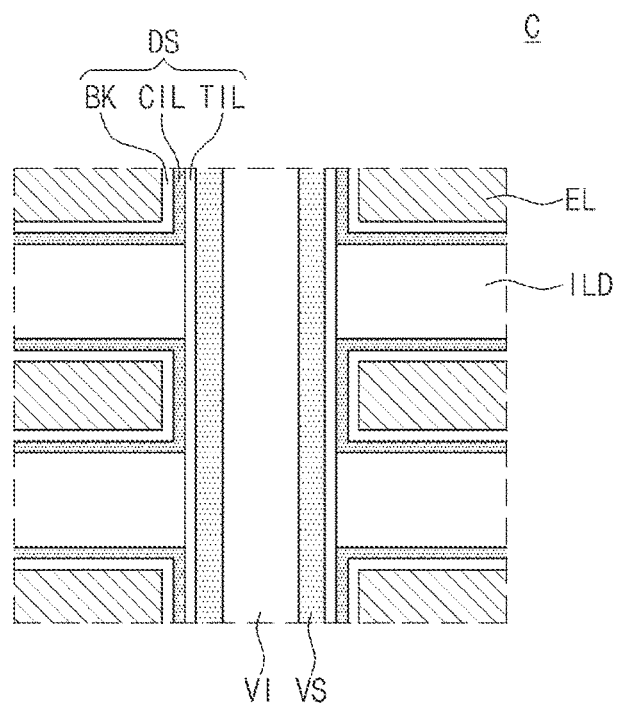

According to the example embodiment illustrated in FIG. 7C, the tunnel insulating layer TIL may extend from between the horizontal electrode EL and the vertical structure VS to between the insulating layer ILD and the vertical structure VS. The charge storage layer CIL and the blocking insulating layer BK may extend between the horizontal electrode EL and the vertical structure VS, for example, onto the top and bottom surfaces of the horizontal electrode EL.

Figure 7D:
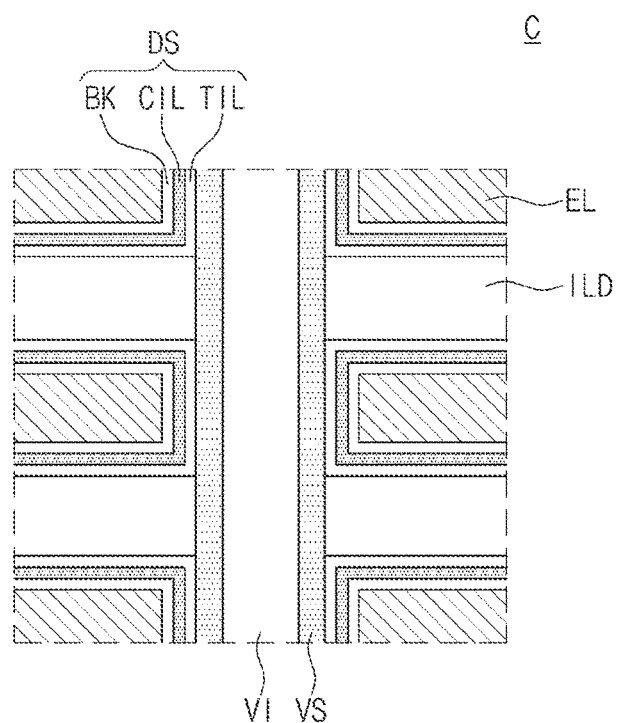

According to the example embodiment illustrated in FIG. 7D, the tunnel insulating layer TIL, the charge storage layer CIL, and the blocking insulating layer BK may extend between the horizontal electrode EL and the vertical structure VS, for example onto the top and bottom surfaces of the horizontal electrode EL.

Figure 7E:
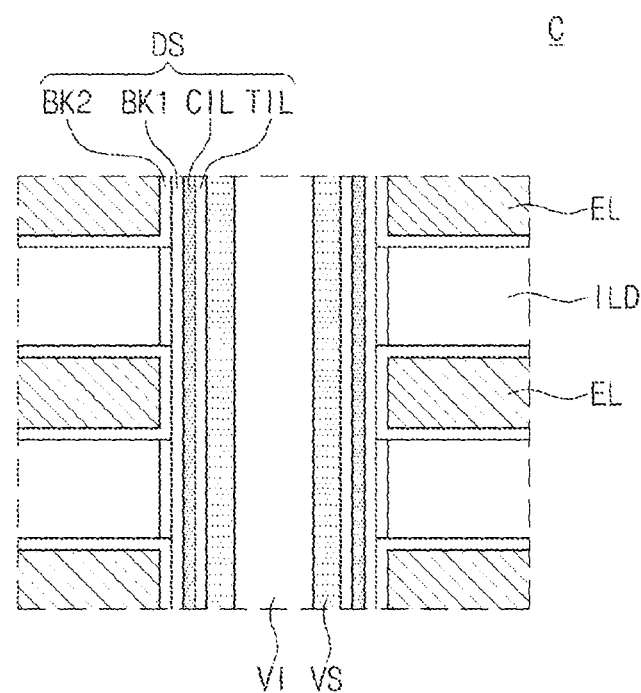

According to the example embodiment illustrated in FIG. 7E, the data storage layer DS may include first and second blocking insulating layers BK1 and BK2 that are formed of different materials from each other. The tunnel insulating layer TIL, the charge storage layer CIL, and the first blocking insulating layer BK1 may extend from between the horizontal electrode EL and the vertical structure VS to between the insulating layer ILD and the vertical structure VS. The second blocking insulating layer BK2 may extend between the horizontal electrode EL and the first blocking insulating layer BK1, for example, onto top and bottom surfaces of the horizontal electrode EL.

In the data storage layers DS illustrated in FIGS. 7A to 7E, the charge storage layer CIL may include at least one selected from a group consisting of trap site-rich insulating layers and insulating layers including nano particles and may be formed by, for example, a chemical vapor deposition (CVD) process or an atomic layer deposition (ALD) process. For example, the charge storage layer CIL may include at least one of a trap insulating layer, a floating gate electrode, or an insulating layer including conductive nano dots. For example, the charge storage layer CIL may include at least one of, but not limited to, a silicon nitride layer, a silicon oxynitride layer, a silicon-rich nitride layer, a nano-crystalline silicon layer, and a laminated trap layer.

The tunnel insulating layer TIL may include at least one of materials having energy band gaps greater than that of the charge storage layer CIL and may be formed by, for example, a CVD process or an ALD process. For example, the tunnel insulating layer TIL may include a silicon oxide layer formed using, for example, the CVD process or the ALD process. In some example embodiments, the tunnel insulating layer TIL may include one of high-k dielectric layers (e.g., an aluminum oxide layer or a hafnium oxide layer).

The blocking insulating layer BK may include at least one of materials having energy band gaps smaller than that of the tunnel insulating layer TIL and greater than that of the charge storage layer CIL. The blocking insulating layer BK may include at least one of high-k dielectric layers (e.g., an aluminum oxide layer or a hafnium oxide layer). The blocking insulating layer BK may be formed using, for example, a CVD process or an ALD process. At least one of the layers TIL, CIL, and BK may be formed using a wet oxidation process.

When the data storage layer DS includes the first and second blocking insulating layers BK1 and BK2 as illustrated in FIG. 7E, the first blocking insulating layer BK1 may include at least one of the high-k dielectric layers (e.g., an aluminum oxide layer and a hafnium oxide layer), and the second blocking insulating layer BK2 may include a material having a lower dielectric constant than the first blocking insulating layer BK1. In some example embodiments, the second blocking insulating layer BK2 may include at least one of the high-k dielectric layers, and the first blocking insulating layer BK1 may include a material having a lower dielectric constant than the second blocking insulating layer BK2.

Data stored in the data storage layer DS described with reference to FIGS. 7A to 7E may be changed using the Flower-Nordheim tunneling caused by the voltage difference between the horizontal electrode EL and the vertical structure VS including the semiconductor material. In some example embodiments, the data storage layer DS may be a thin layer capable of storing data based on another operation principle. For example, the data storage layer DS may include a thin layer for a phase-change memory device or a thin layer for a variable resistance memory device.

Figure 8:
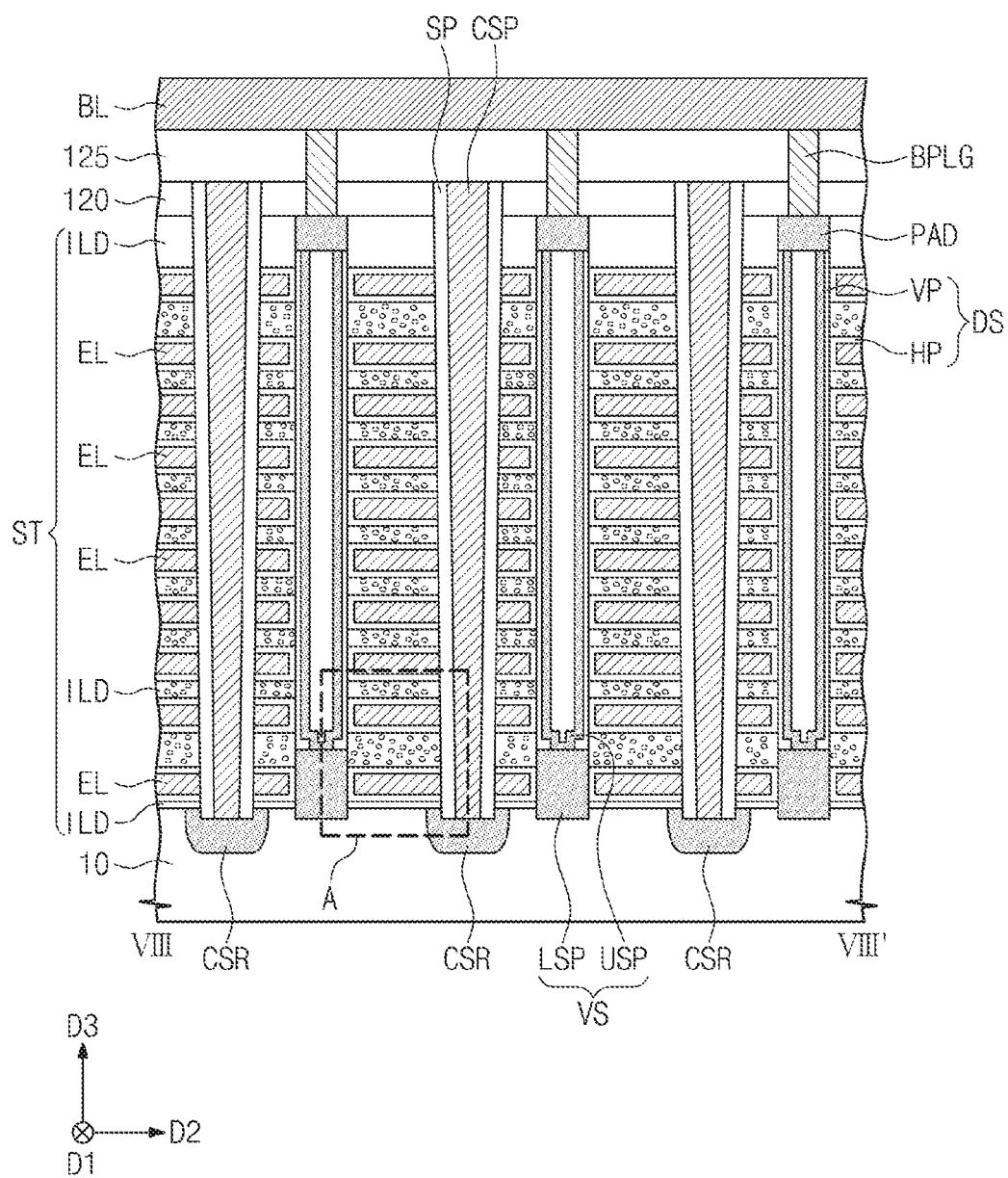
FIG. 8 is a cross-sectional view taken along line VIII-VIII' of FIG. 3 to illustrate a 3D semiconductor memory device according to another example embodiment of the inventive concepts.
Figure 9A:
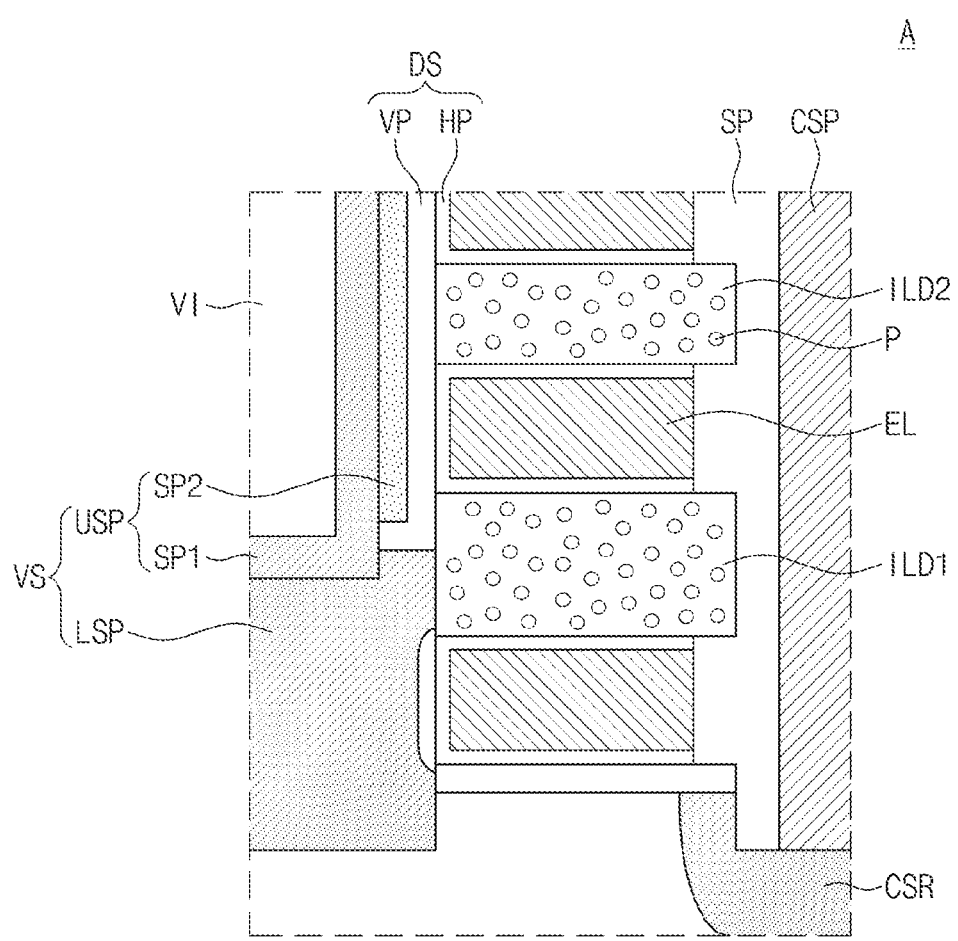
FIGS. 9A and 9B are enlarged views of a portion 'A' of FIG. 8.
Figure 9B:
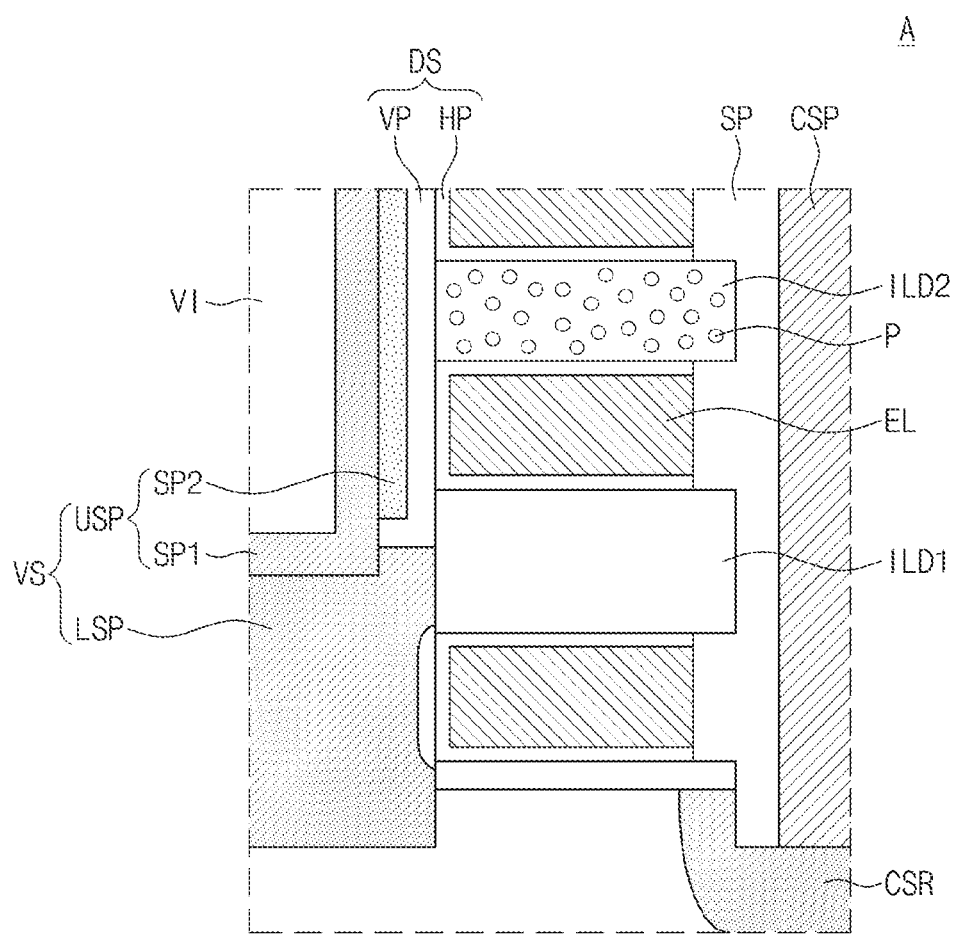

FIG. 8 is a cross-sectional view taken along a line VIII-VIII' of FIG. 3 to illustrate a 3D semiconductor memory device according to another example embodiment of the inventive concepts. FIGS. 9A and 9B are enlarged views of a portion 'A' of FIG. 8. The descriptions to the same technical features as in the example embodiments of FIGS. 4, 5A to 5L, 6A to 6C, and 7A to 7E will be omitted or mentioned briefly for the purpose of ease and convenience of explanation.

Referring to FIGS. 8, 9A, and 9B, each of vertical structures VS may include a lower semiconductor pattern LSP penetrating a lower portion of the stack structure ST and connected to the substrate 10 and an upper semiconductor pattern USP penetrating an upper portion of the stack structure ST and connected to the lower semiconductor pattern LSP.

The upper semiconductor pattern USP may have, for example, a hollow pipe (e.g., a cylinder) shape or a hollow macaroni shape. A bottom end of the upper semiconductor pattern USP may be in a closed state. An inner space of the upper semiconductor pattern USP may be filled with a filling insulation pattern VI. A bottom surface of the upper semiconductor pattern USP may be disposed at a level lower than a top surface of the lower semiconductor pattern LSP. For example, a bottom end portion of the upper semiconductor pattern USP may be inserted into an upper portion of the lower semiconductor pattern LSP. The upper semiconductor pattern USP may be formed of a semiconductor material. For example, the upper semiconductor pattern USP may include silicon (Si), germanium (Ge), or a mixture thereof. The upper semiconductor pattern USP may be doped with dopants or may be an intrinsic semiconductor not doped with dopants. The upper semiconductor pattern USP may have a structure including at least one of a single-crystalline structure, an amorphous structure, and a poly-crystalline structure. A conductive pad PAD may be disposed on a top end of the upper semiconductor pattern USP. The conductive pad PAD may be a dopant region doped with dopants or may be formed of a conductive material.

The upper semiconductor pattern USP may include a first semiconductor pattern SP1 and a second semiconductor pattern SP2. The first semiconductor pattern SP1 may be connected to the lower semiconductor pattern LSP and may have a pipe (e.g. a cylinder) or macaronic shape having a closed bottom end. An inner space of the first semiconductor pattern SP1 may be filled with the filling insulation pattern VI. The first semiconductor pattern SP1 may be in contact with an inner sidewall of the second semiconductor pattern SP2 and the lower semiconductor pattern LSP. Thus, the first semiconductor pattern SP1 may electrically connect the second semiconductor pattern SP2 to the lower semiconductor pattern LSP. The second semiconductor pattern SP2 may cover an inner sidewall of the stack structure ST. The second semiconductor pattern SP2 may have a pipe (e.g., a cylinder) or macaroni shape having opened top and bottom ends. The second semiconductor pattern SP2 may be spaced apart from the lower semiconductor pattern LSP. The first and second semiconductor patterns SP1 and SP2 may be undoped or doped with dopants having the same conductivity type as dopants of the substrate 10. For example, the first and second semiconductor patterns SP1 and SP2 may be in at least one of a poly-crystalline and single-crystalline state.

The lower semiconductor pattern LSP may be used as a channel region of the ground selection transistor GST of FIG. 2. The lower semiconductor pattern LSP may be formed of a semiconductor material having the same conductivity type as the substrate 10. In some example embodiments, the lower semiconductor pattern LSP may be an epitaxial pattern formed using, for example an epitaxial or laser crystallization technique using the substrate 10 as a seed. In this case, the lower semiconductor pattern LSP may have a single-crystalline structure or a poly-crystalline structure, a grain size of which is greater than that of a semiconductor material formed using a CVD technique. In some example embodiments, the lower semiconductor pattern LSP may be formed of a poly-crystalline semiconductor material (e.g., poly-crystalline silicon). In some example embodiments, the insulating layer (e.g., ILD1) adjacent to the lower semiconductor pattern LSP may be in direct contact with one sidewall of the lower semiconductor pattern LSP.

In some example embodiments, the lower semiconductor pattern LSP may have a pillar shape penetrating the lowermost horizontal electrode EL. Here, a bottom surface of the lower semiconductor pattern LSP may be lower than the top surface of the substrate 10. The top surface of the lower semiconductor pattern LSP may be higher than the top surface of the lowermost horizontal electrode EL.

The data storage layer DS may be disposed between the stack structure ST and the vertical structure VS. The data storage layer DS may include a vertical insulating pattern VP penetrating the stack structure ST and a horizontal insulating pattern HP extending between the vertical insulating pattern VP and each of the horizontal electrode EL to top and bottom surfaces of each of the horizontal electrodes EL. In some example embodiments, the vertical insulating pattern VP of the data storage layer DS may surround the upper semiconductor pattern USP and may be disposed on the lower semiconductor pattern LSP.

Referring to FIGS. 9A and 9B, the insulating layers ILD of the stack structure ST may include a first insulating layer ILD1 having a first thickness and a second insulating layer ILD2 having a second thickness smaller than the first thickness, as described with reference to FIGS. 6A to 6C. In some example embodiments, the first insulating layer ILD1 may be adjacent to the lower semiconductor pattern LSP, and the second insulating layer ILD2 may be adjacent to the upper semiconductor pattern USP. The first and second insulating layers ILD1 and ILD2 may include pores P, as illustrated in FIG. 9A. The first insulating layer ILD1 may be a non-porous layer and the second insulating layer ILD2 may be a porous layer, as illustrated in FIG. 9B. Thus, a dielectric constant of the second insulating layer ILD2 may be lower than that of the first insulating layer ILD1.

Figure 10:
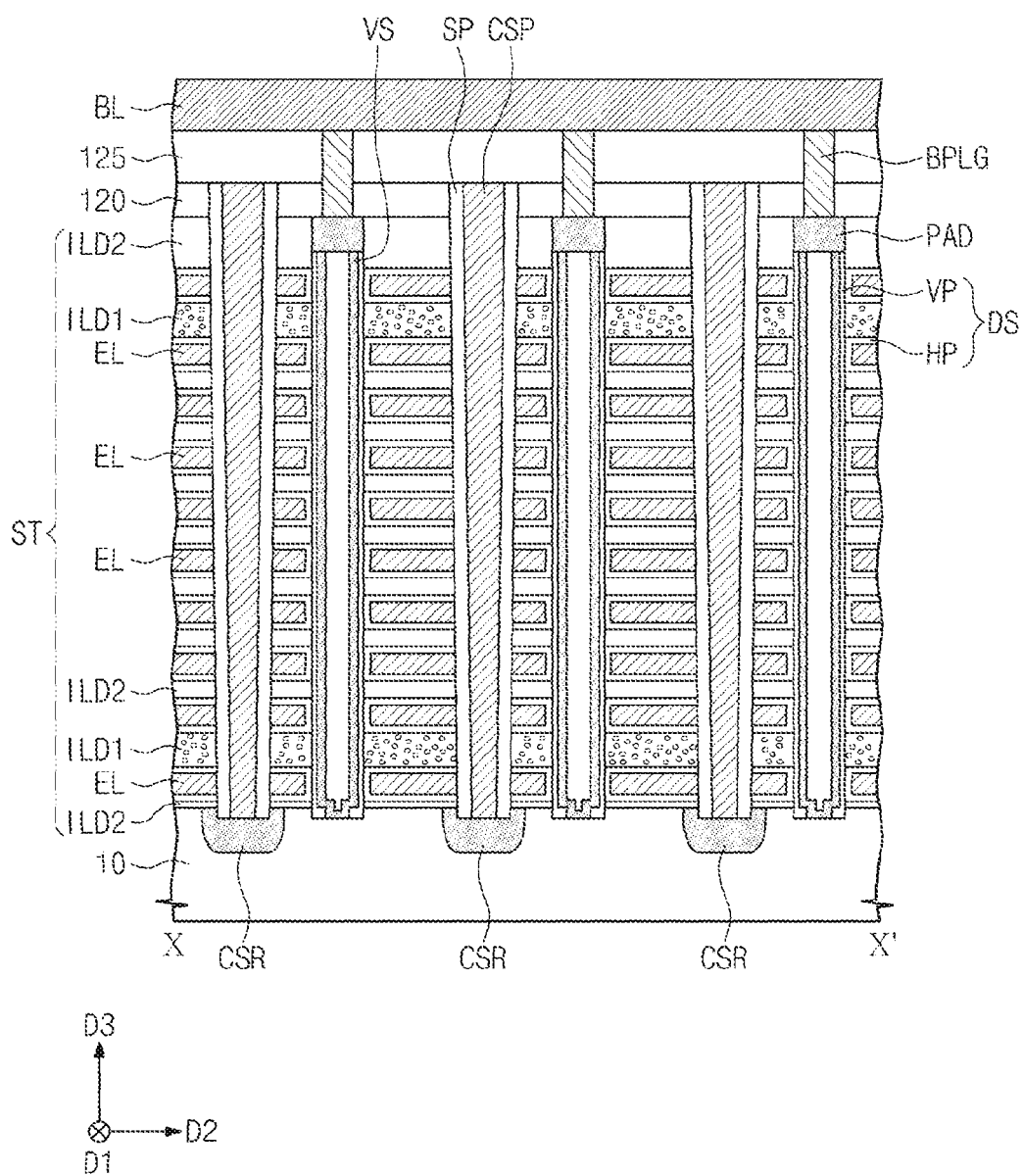
FIG. 10 is a cross-sectional view taken along line X-X' of FIG. 3 to illustrate a 3D semiconductor memory device according to still another example embodiment of the inventive concepts.

FIG. 10 is a cross-sectional view taken along a line X-X' of FIG. 3 to illustrate a 3D semiconductor memory device according to still another example embodiment of the inventive concepts. The descriptions to the same technical features as in the example embodiments of FIGS. 4, 5A to 5L, 6A to 6C, and 7A to 7E will be omitted or mentioned briefly for the purpose of ease and convenience of explanation.

Referring to FIG. 10, each of stack structures ST may include vertically stacked horizontal electrodes EL disposed on a substrate 10. The stack structure ST may include first insulating layers ILD1 having a first dielectric constant and second insulating layers ILD2 having a second dielectric constant different from the first dielectric constant. In some example embodiments, the first dielectric constant is lower than the second dielectric constant, and the first insulating layers ILD1 may be thicker than the second insulating layers ILD2. For example, each of the first insulating layers ILD1 may be a porous insulating layer having pores P, and each of the second insulating layers ILD2 may be a non-porous insulating layer.

In some example embodiments, the first insulating layers ILD1 having the pores P may be disposed between the horizontal electrode EL used as the lowermost word line WL of FIG. 2 and the horizontal electrode EL used as the ground selection line GSL of FIG. 2 and/or between the horizontal electrode EL used as the uppermost word line WL of FIG. 2 and the horizontal electrode EL used as the string selection line SSL of FIG. 2. The second insulating layers ILD2 including the non-porous insulating layers may be disposed between the electrodes WL used as the word lines WL of FIG. 2.

Vertical structures VS may penetrate the stack structures ST and connected to the substrate 10, and each of common source plugs CSP extending in one direction may be disposed between the stack structures ST adjacent to each other. Further, the data storage layer DS may be disposed between the vertical structure VS and the stack structure ST. The first and second insulating layers ILD1 and ILD2 may be in contact with the vertical insulating pattern VP of the data storage layer DS.

FIGS. 11A to 11D are cross-sectional views illustrating example stack structures of a 3D semiconductor memory device according to some example embodiments of the inventive concepts. Hereinafter, the descriptions to the same technical features as in the example embodiments of FIGS. 4, 5A to 5L, 6A to 6C, and 7A to 7E will be omitted or mentioned briefly for the purpose of ease and convenience of explanation.

Referring to FIGS. 11A to 11D, a stack structure ST may be disposed on a substrate 10 and may include horizontal electrodes EL and insulating layers ILD1 and ILD2 which are alternately stacked on the substrate 10 in a direction perpendicular to the top surface of the substrate 10. The stack structure ST may include a lower region LR, an upper region UR, and an intermediate region MR between the lower and upper regions LR and UR. According to an example embodiment of the inventive concepts, the horizontal electrodes EL in the stack structure ST may have tensile stress, and the insulating layers ILD1 and ILD2 may have compressive stress. Stress applied to the substrate 10 may increase as the number of the horizontal electrodes EL and the number of the insulating layers ILD1 and ILD2 alternately stacked increase. Thus, in order to reduce the stress applied to the substrate 10 controlling the stresses of the insulating layers ILD1 and ILD2 may be desired.

According to some example embodiments, the stack structure ST may include at least one first insulating layer ILD1 having a first dielectric constant and at least one second insulating layers ILD2 having a second dielectric constant different from the first dielectric constant. Each of the first and second insulating layers ILD1 and ILD2 may be disposed between the horizontal electrodes EL vertically adjacent to each other. Mechanical strength and stress of the first insulating layer ILD1 may be different from those of the second insulating layer ILD2. For example, the first insulating layers ILD1 may have a first compressive stress, and the second insulating layers ILD2 may have a second compressive stress greater than the first compressive stress. In some example embodiments, the first insulating layers ILD1 may be porous insulating layers having pores P, and the second insulating layers ILD2 may be non-porous insulating layers.

Figure 11A:
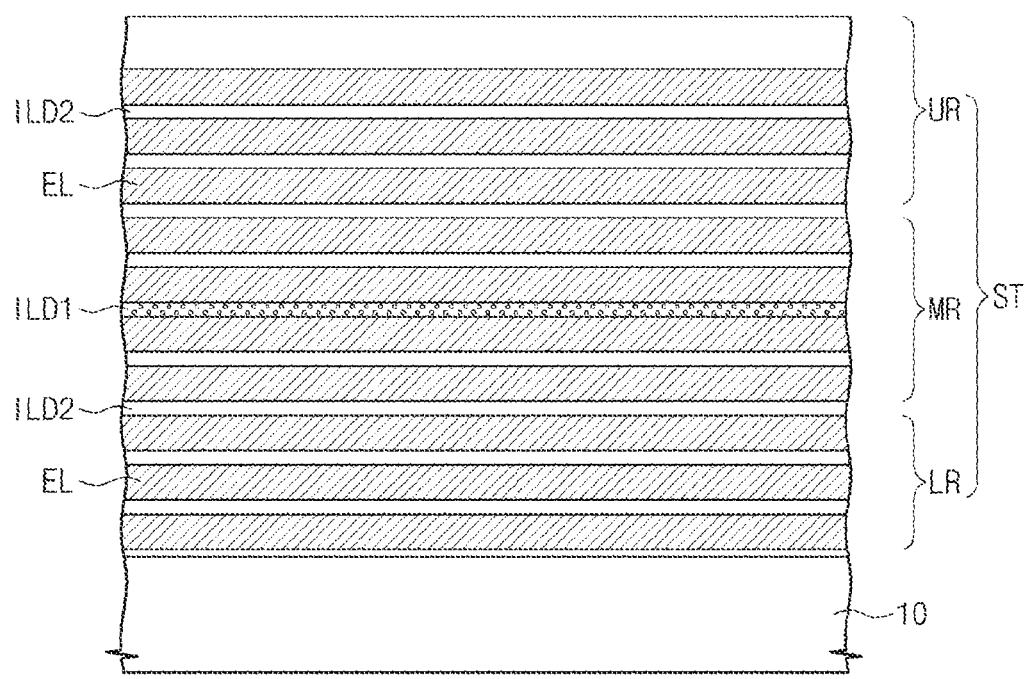
FIGS. 11A to 11D are cross-sectional views illustrating example stack structures of a 3D semiconductor memory device according to some example embodiments of the inventive concepts.
Figure 11B:
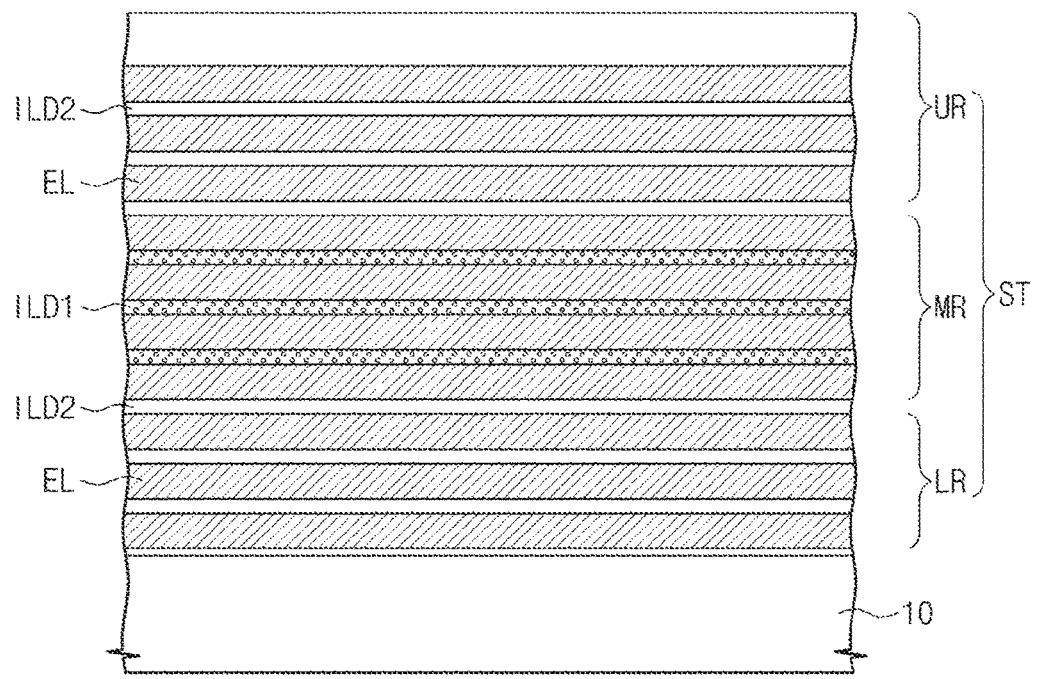

The stress applied to the substrate 10 may be controlled according to positions of the first and second insulating layers ILD1 and ILD2. In some example embodiments, the first insulating layer ILD1 may be disposed in the indeterminate region MR of the stack structure ST, as illustrated in FIG. 11A. In some example embodiments, a plurality of the first insulating layers ILD1 disposed in the indeterminate region MR of the stack structure ST, as illustrated in FIG. 11B. According to the example embodiments illustrated in FIGS. 11A and 11B, the compressive stress of the intermediate region MR of the stack structure ST may be less than those of the upper and lower regions UR and LR of the stack structure ST.

Figure 11C:
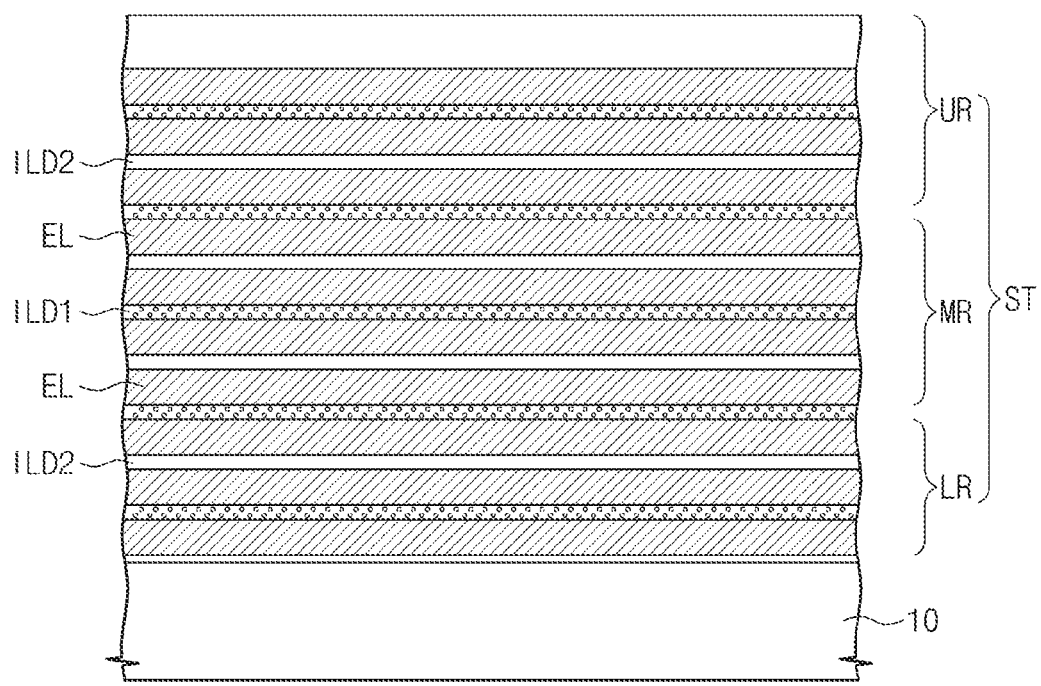

Referring to FIG. 11C, the first insulating layers ILD1 and the second insulating layers ILD2 may be alternately disposed in the stack structure ST. Accordingly, the first and second insulating layers ILD1 and ILD2 may be disposed in each of the lower, intermediate and upper regions LR, MR and UR of the stack structure ST.

Figure 11D:
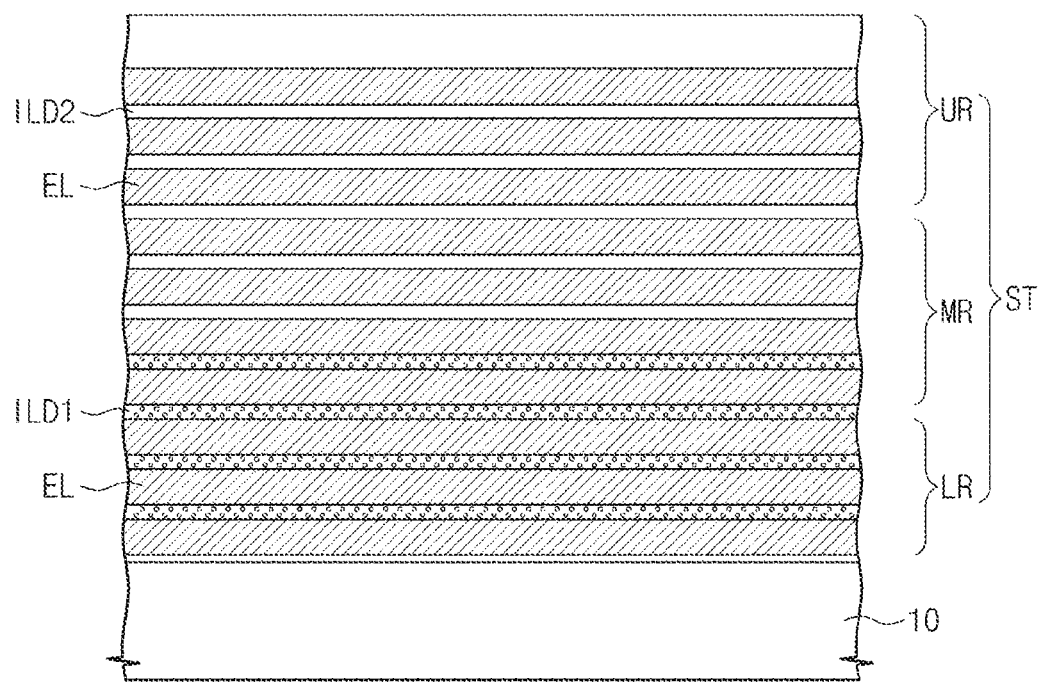

Referring to FIG. 11D, a plurality of the first insulating layers ILD1 may be disposed in the lower region LR of the stack structure ST, and a plurality of the second insulating layers ILD2 may be disposed in the upper region UR of the stack structure ST. Thus, the compressive stress of the lower region LR of the stack structure ST may be less than that of the upper region UR of the stack structure ST.

Referring back to FIG. 10, the first insulating layers ILD1 may be disposed in the upper region UR and the lower region LR of the stack structure ST. In this case, the compressive stresses of the upper and lower regions UR and LR of the stack structure ST may be less than that of the intermediate region MR of the stack structure ST.

Figure 12:
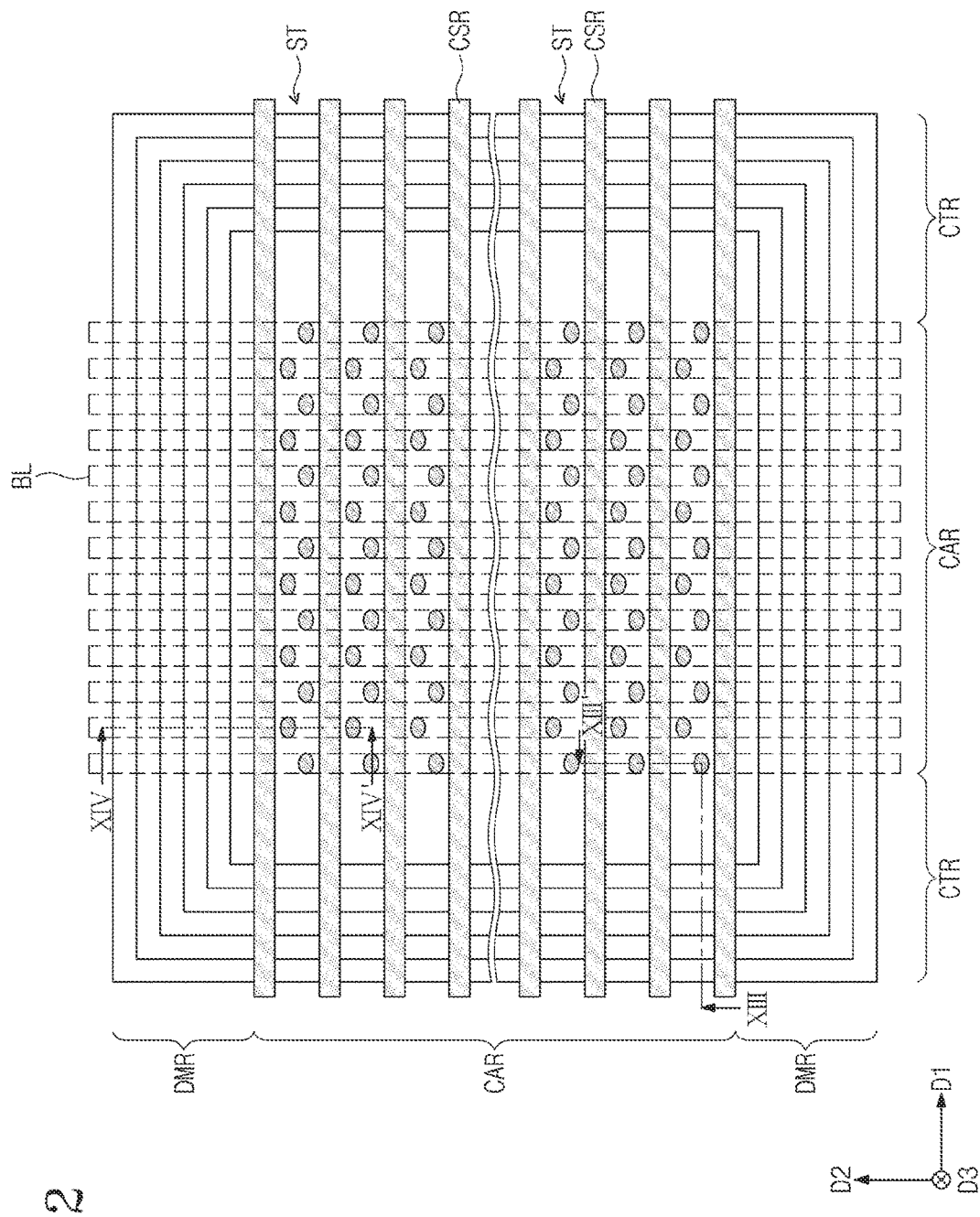
FIG. 12 is a plan view illustrating a 3D semiconductor memory device according to an example embodiment of the inventive concepts.
Figure 13:
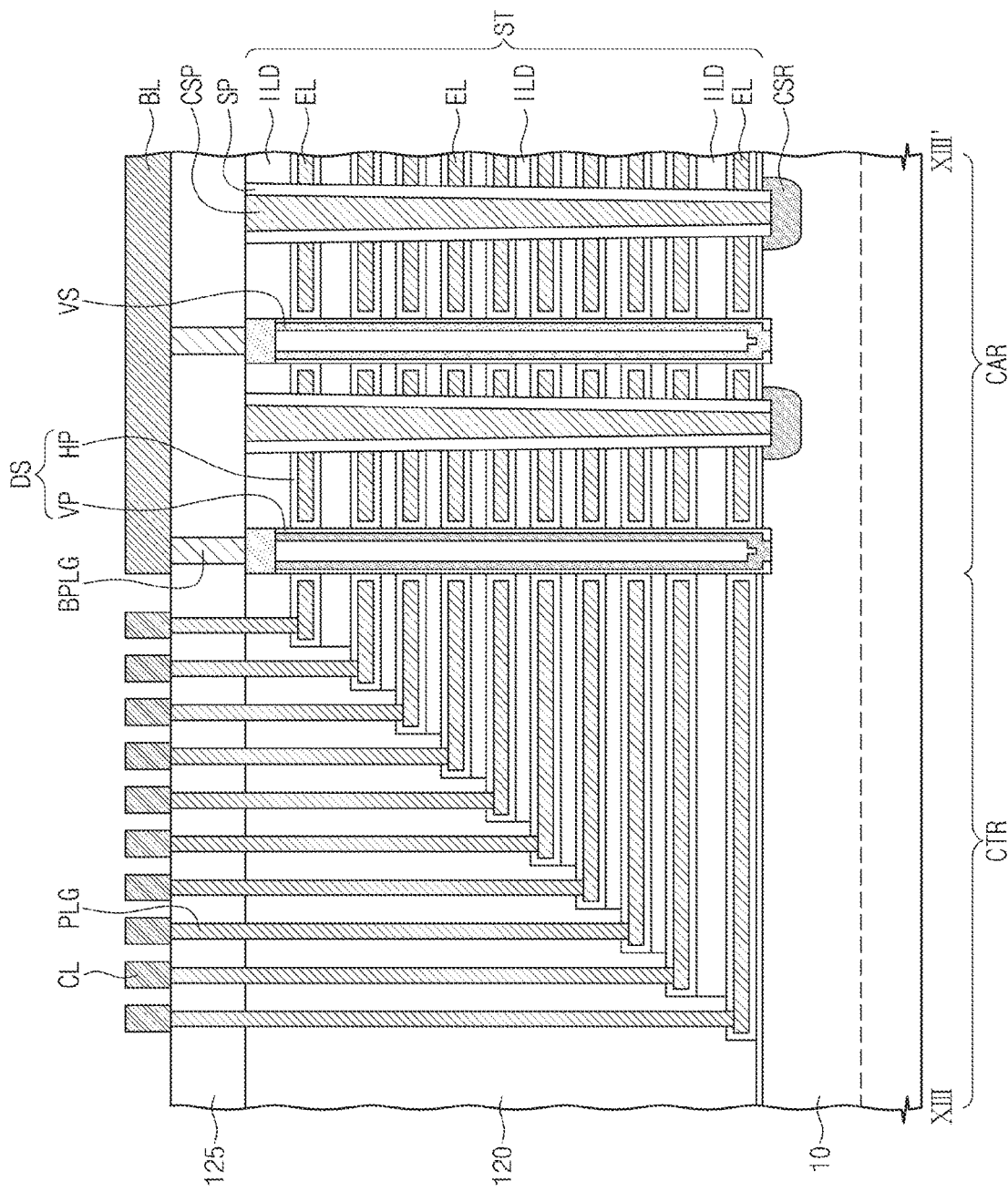
FIG. 13 is a cross-sectional view taken along a line XIII-XIII' of FIG. 12 to illustrate a 3D semiconductor memory device according to an example embodiment of the inventive concepts.
Figure 14:
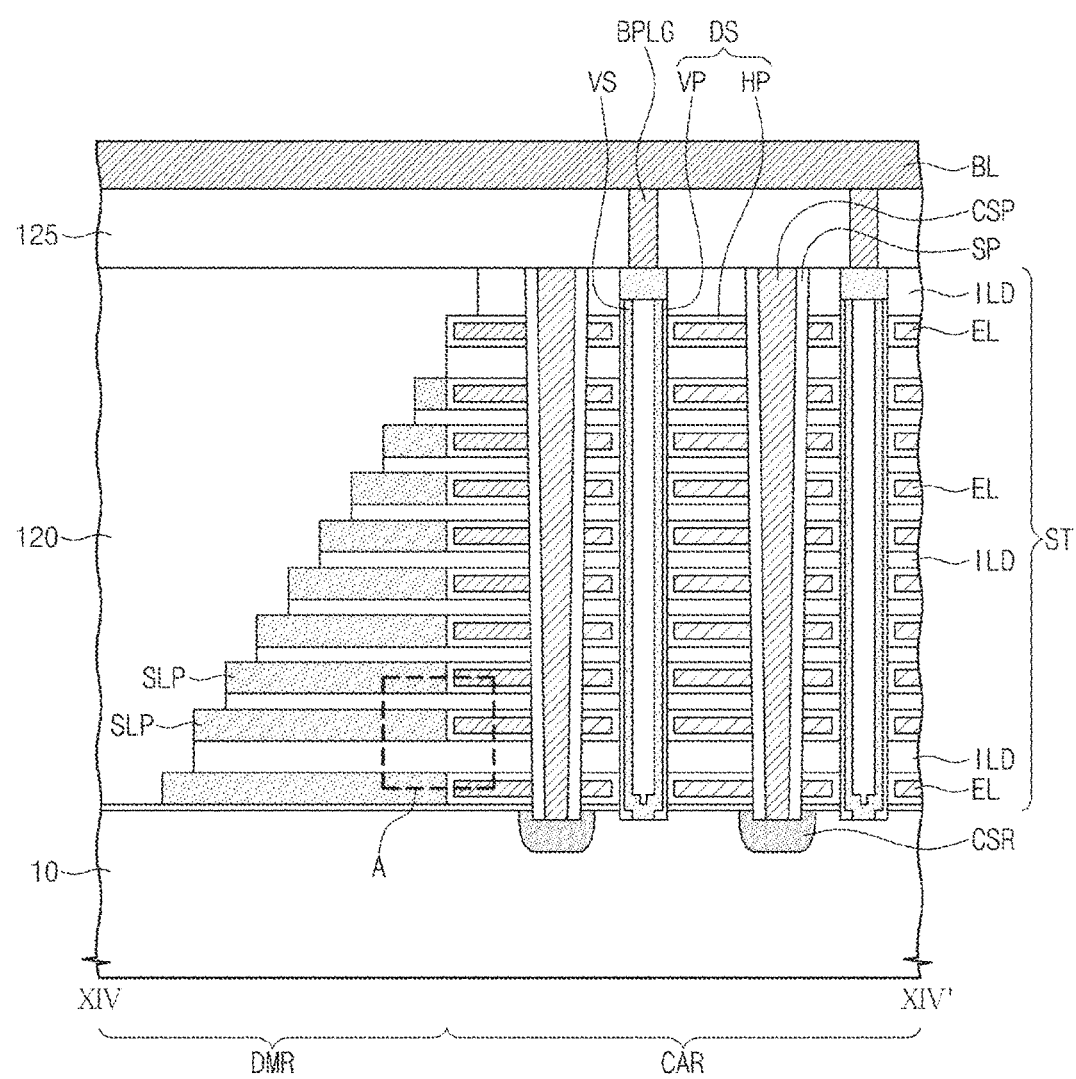
FIG. 14 is a cross-sectional view taken along a line XIV-XIV' of FIG. 12 to illustrate a 3D semiconductor memory device according to an example embodiment of the inventive concepts.
Figure 15:
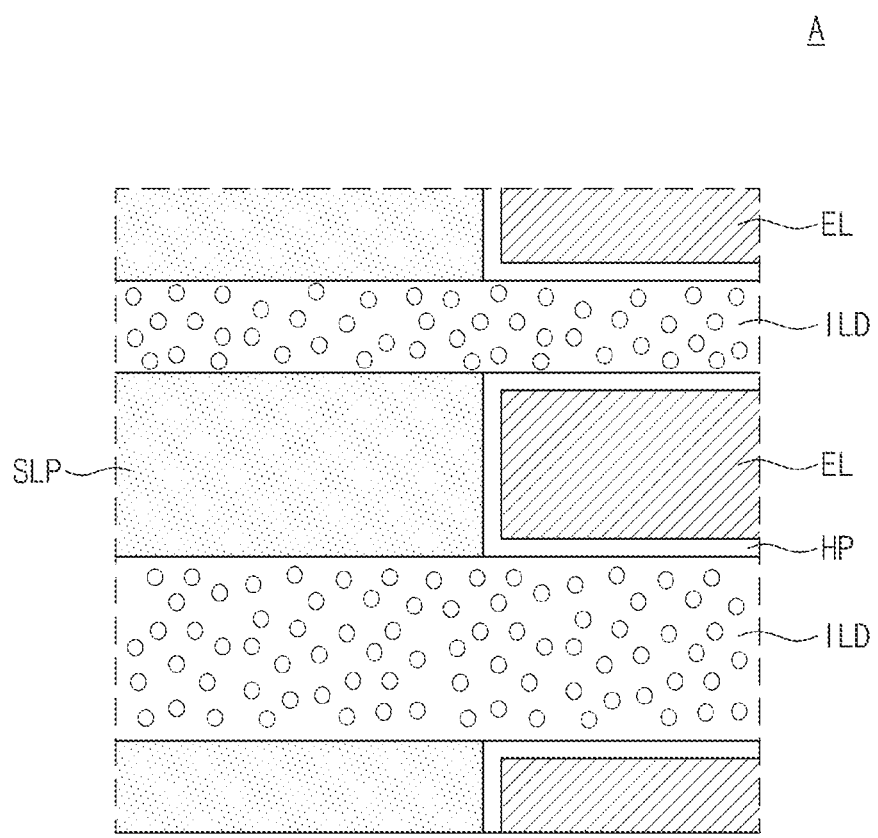
FIG. 15 is an enlarged view of a portion 'A' of FIG. 14.

FIG. 12 is a plan view illustrating a 3D semiconductor memory device according to an example embodiment of the inventive concepts. FIGS. 13 and 14 are cross-sectional views taken along lines XIII-XIII' and XIV-XIV' of FIG. 12, respectively, to illustrate a 3D semiconductor memory device according to some example embodiments of the inventive concepts. FIG. 15 is an enlarged view of a portion 'XV' of FIG. 14. The descriptions to the same technical features as in the embodiments of FIGS. 4, 5A to 5L, 6A to 6C, and 7A to 7E will be omitted or mentioned briefly for the purpose of ease and convenience of explanation.

Referring to FIGS. 12, 13, and 14, a substrate 10 may include a cell array region CAR and contact regions CTR disposed at, for example, both sides of the cell array region CAR in a first direction D1. Further, the substrate 10 may include dummy regions DMR disposed at both sides of the cell array region CAR in a second direction D2 perpendicular to the first direction D2.

Each of stack structures ST may include horizontal electrodes EL and insulating layers ILD which are alternately stacked on the substrate 10 in a direction perpendicular to the top surface of the substrate 10. At least one of the insulating layers ILD may be a low-k dielectric layer having pores, as described above. Further, one or some of the insulating layers ILD may be thicker than other one or more of the insulating layers ILD.

The stack structures ST may extend from the cell array region CAR into the contact region CTR and the dummy region DMR. The stack structures ST may have stepwise structures in the contact region CTR and the dummy region DMR. For example, in the contact region CTR and the dummy region DMR, sidewalls of the horizontal electrodes EL may be spaced apart from each other in a plan view, and plan areas of the horizontal electrodes EL may decrease stepwise as a vertical height from the substrate 10 increases.

In some example embodiments, a distance between the sidewalls of the horizontal electrodes EL in the contact region CTR may be greater than a distance between the sidewalls of the horizontal electrodes EL in the dummy region DMR when viewed from a plan view. Thus, a gradient of a sidewall profile of the stack structure ST in the contact region CTR may be greater than a gradient of a sidewall profile of the stack structure ST in the dummy region DMR. In other example embodiments, the distance between the sidewalls of the horizontal electrodes EL in the contact region CTR may be substantially equal to the distance between the sidewalls of the horizontal electrodes EL in the dummy region DMR when viewed from a plan view. Thus, the gradient of the sidewall profile of the stack structure ST in the contact region CTR may be substantially equal to the gradient of the sidewall profile of the stack structure ST in the dummy region DMR.

According to an example embodiment, the vertical structures VS may penetrate the stack structures ST and connected to the substrate 10. The vertical structures VS may include a semiconductor material or a conductive material. The vertical structures VS penetrating each of the stack structures ST may be arranged in a line along one direction when viewed from a plan view. In some example embodiments, the vertical structures VS penetrating each of the stack structures ST may be arranged in a zigzag form along one direction when viewed from a plan view.

Sidewall insulating spacers SP and a common source plug CSP may be formed between the stack structures ST extending in the first direction D1, and extend, for example, in the first direction D1.

According to an example embodiment, an upper filling insulation layer 120 covering the stack structures ST may be disposed on an entire top surface of the substrate 10. The upper filling insulation layer 120 may have a planarized top surface and may cover end portions of the stack structures ST. The upper filling insulation layer 120 may include a single insulating layer or a plurality of stacked insulating layers. A capping insulating layer 125 may be disposed on the upper filling insulation layer 120 to cover the vertical structures VS and the common source plugs CSP.

An interconnection structure for electrically connecting the vertically stacked horizontal electrodes EL to peripheral logic circuits (e.g., a decoder) may be disposed in the contact region CTR. The interconnection structure may include contact plugs PLG and connecting lines CL. The contact plugs PLG may penetrate the capping insulating layer 125 and the upper filling insulation layer 120 such that the contact plugs PLG is connected to end portions of the horizontal electrodes EL. The connecting lines CL may be disposed on the capping insulating layer 125 such that the connecting lines CL are connected to the contact plugs PLG. Vertical lengths of the contact plugs PLG may decrease as a distance from the cell array region CAR decreases. Top surfaces of the contact plugs PLG may be substantially coplanar with each other.

According to an example embodiment, the stack structure ST may include sacrificial insulating patterns SLP disposed in the dummy region DMR. Each of the sacrificial insulating patterns SLP may be disposed between the insulating layers ILD vertically adjacent to each other in the dummy region DMR. The sacrificial insulating patterns SLP may be laterally adjacent to the horizontal electrodes EL. Horizontal insulating patterns HP of the data storage layer DS may be disposed between the horizontal electrodes EL and the insulating layers ILD.

According to an example embodiment, the sacrificial insulating patterns SLP may be formed of an insulating material having a dielectric constant higher than that of the insulating layers ILD. Referring to FIG. 15, the insulating layers ILD may be porous low-k dielectric layers having pores (not illustrated in FIG. 14 for simplicity), and each of the sacrificial insulating patterns SLP may be disposed between the porous low-k dielectric layers vertically adjacent to each other in the dummy region DMR.

Figure 16:
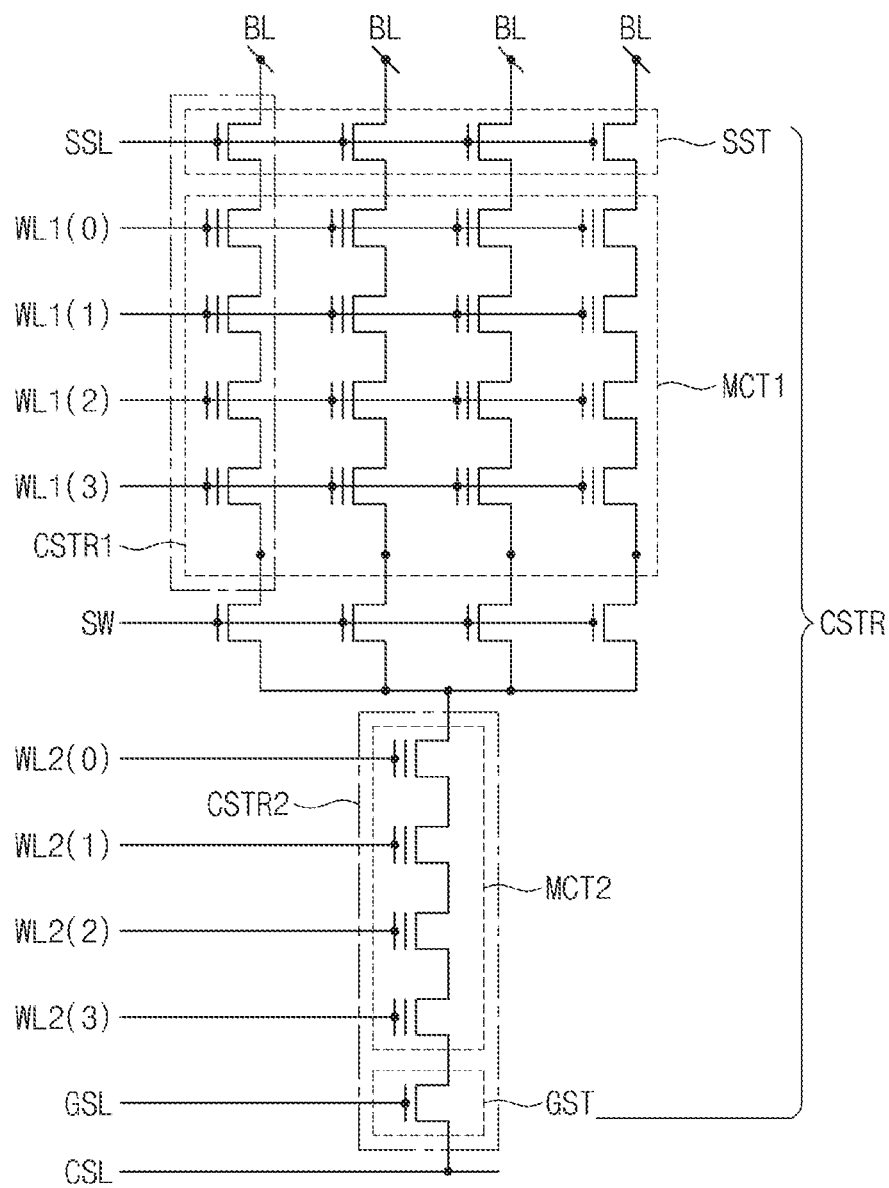
FIG. 16 is a circuit diagram illustrating a cell array of a 3D semiconductor memory device according to an example embodiment of the inventive concepts.

FIG. 16 is a circuit diagram illustrating a cell array of a 3D semiconductor memory device according to an example embodiment of the inventive concepts.

Referring to FIG. 16, a 3D semiconductor memory device according to the present embodiment may include a common source line CSL, a plurality of bit lines BL, and a cell string CSTR between the common source line CSL and the bit lines BL.

The common source line CSL may be a conductive layer disposed on a substrate, and the bit lines BL may be conductive patterns (e.g., metal lines) disposed above the substrate.

The cell string CSTR may include a plurality of upper strings CSTR1 respectively connected to the bit lines BL and one lower string CSTR2 connected to the common source line CSL. The plurality of upper strings CSTR1 may be connected in common to the one lower string CSTR2. Each of the upper strings CSTR1 may be connected to the lower string CSTR2 through a corresponding one of switching elements SW. The switching elements SW connected to the upper strings CSTR1 may be electrically controlled to receive the same control voltage.

Each of the upper strings CSTR1 may include a string selection transistor SST connected to each of the bit lines BL, and a plurality of upper memory cell transistors MCT1 disposed between the string selection transistor SST and the switching element SW. The string selection transistor SST and the upper memory cell transistors MCT1 may be connected in series. The lower string CSTR2 may include a ground selection transistor GST connected to the common source line CSL, and a plurality of lower memory cell transistors MCT2 disposed between the ground selection transistors GST and the switching elements SW. The ground selection transistor GST and the lower memory cell transistors MCT2 may be connected in series.

A string selection line SSL and upper word lines WL1(0) to WL1(3), which are disposed between the bit lines BL and the switching elements SW, may be used as gate electrodes of the string selection transistor SST and the upper memory cell transistors MCT1, respectively. A ground selection line GSL and lower word lines WL2(0) to WL2(3), which are disposed between the common source line CSL and the switching elements SW, may be used as gate electrodes of the ground selection transistor GST and the lower memory cell transistors MCT2, respectively. Each of the upper and lower memory cell transistors MCT1 and MCT2 may include a data storage element.

The plurality of upper strings CSTR1 respectively connected to the bit lines BL may be connected in common to the one lower string CSTR2 connected to the common source line CSL. Thus, the upper strings CSTR1 including the string selection transistors SST respectively connected to the bit lines BL may share the ground selection transistor GST included in the one lower string CSTR2. For example, the upper strings CSTR1, which are connected to different bit lines to be operated independently of each other, may be connected in common to the one lower string CSTR2 to share the ground selection transistor GST. Accordingly, a highly integrated semiconductor memory device may be realized.

Figure 17:
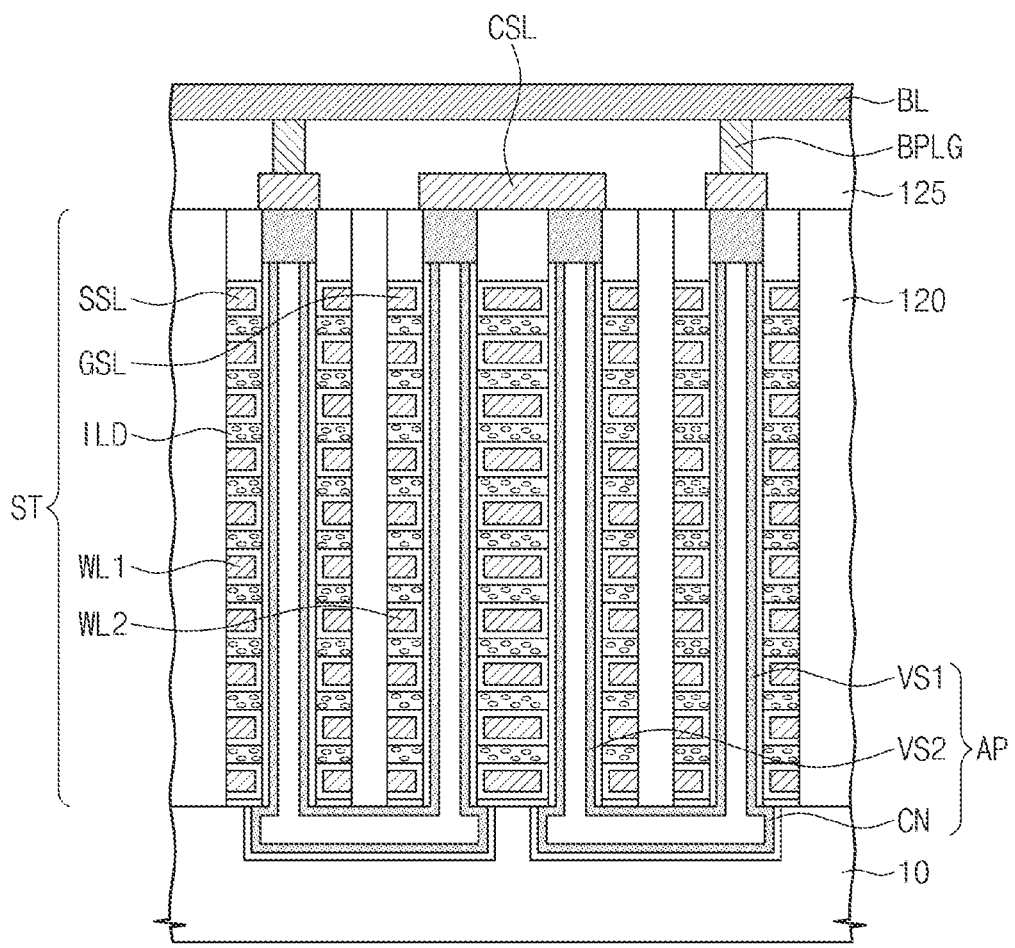
FIG. 17 is a cross-sectional view illustrating one example of the 3D semiconductor memory device illustrated in FIG. 16.

FIG. 17 is a cross-sectional view illustrating one example of the 3D semiconductor memory device illustrated in FIG. 16. In the present example embodiment, descriptions to the same technical features as in the example embodiment of FIG. 4 will be omitted or mentioned briefly for the purpose of ease and convenience of explanation.

Referring to FIG. 17, the 3D semiconductor memory device according to the present example embodiment may include a plurality of stack structures ST disposed on the substrate 10 and a plurality of active patterns AP penetrating the stack structures ST. Each of the stack structures ST may include horizontal electrodes EL and insulating layers ILD which are alternately stacked on the substrate 10. In an example embodiment, the stack structures ST may extend in one direction and a filling insulating layer 120 may be disposed between the stack structures ST.

According to some example embodiments, as described with reference to FIG. 4, the insulating layers ILD of the stack structure ST may be formed of low-k dielectric layers having a dielectric constant lower than that of an oxide layer. Further, at least one of the insulating layers ILD may be a low-k dielectric layer having pores.

In an example embodiment, the horizontal electrodes EL may include, for example, a string selection line SSL, word lines WL, and a ground selection lines GSL. The string selection line SSL may be disposed between the word lines WL and the bit lines BL. The ground selection line GSL may be disposed between the word lines WL and a common source line CSL. The word lines WL may be vertically stacked on the substrate 10. The string selection line SSL and the ground selection line GSL may be disposed on the word lines WL. Referring to FIG. 17, the string selection line SSL and the ground selection line GSL may be laterally spaced apart from each other. The word lines WL may include upper word lines WL1 disposed between the substrate 10 and the string selection line SSL, and lower word lines WL2 disposed between the substrate 10 and the ground selection line GSL. The upper word lines WL1 may be laterally spaced apart from the lower word lines WL2.

Referring again to FIG. 17, the filling insulation layer 120 may be disposed between the string selection line SSL and the ground selection line GSL and between the upper word lines WL1 and the lower word lines WL2. The filling insulation layer 120 may include, for example, at least one of a silicon oxide layer, a silicon nitride layer, and a silicon oxynitride layer.

Each of the active patterns AP may include vertical structures VS1 and VS2 penetrating the stack structures ST, and a connection portion CN disposed under the stack structures ST to connect the vertical structures VS1 and VS2 to each other. The vertical structures VS1 and VS2 may be provided in vertical holes penetrating the stack structures ST. The horizontal portion HS may be provided in a recess region formed in an upper portion of the substrate 10. One of the vertical structures VS1 and VS2 may be connected to the common source line CSL, and the other of the vertical structures VS1 and VS2 may be connected to one of the bit lines BL. The connection portion CN may be provided between the substrate 10 and the stack structures ST to connect the vertical structures VS1 and VS2 to each other.

For example, each of the active patterns AP may include a first vertical structure VS1 penetrating the string selection line SSL and the upper word lines WL1, or a second vertical structure VS2 penetrating the ground selection line GSL and the lower word lines WL2. The first vertical structure VS1 may be connected to one of the bit lines BL and the second vertical structure VS2 may be connected to the common source line CSL. The connection portion CN may extend from under the upper word lines WL1 to under the lower word lines WL2 to electrically connect the first vertical structure VS1 to the second vertical structure VS2.

Each of the active patterns AP may include a semiconductor pattern that penetrates the stack structure ST and electrically coupled to the substrate 10. The semiconductor pattern included in the vertical structures VS1 and VS2 may cover inner sidewalls of the vertical holes formed in the stack structures ST. The semiconductor pattern included in the connection portion CN may cover an inner surface of the recess region formed in the substrate 10. The semiconductor pattern may include a semiconductor material.

Figure 18:
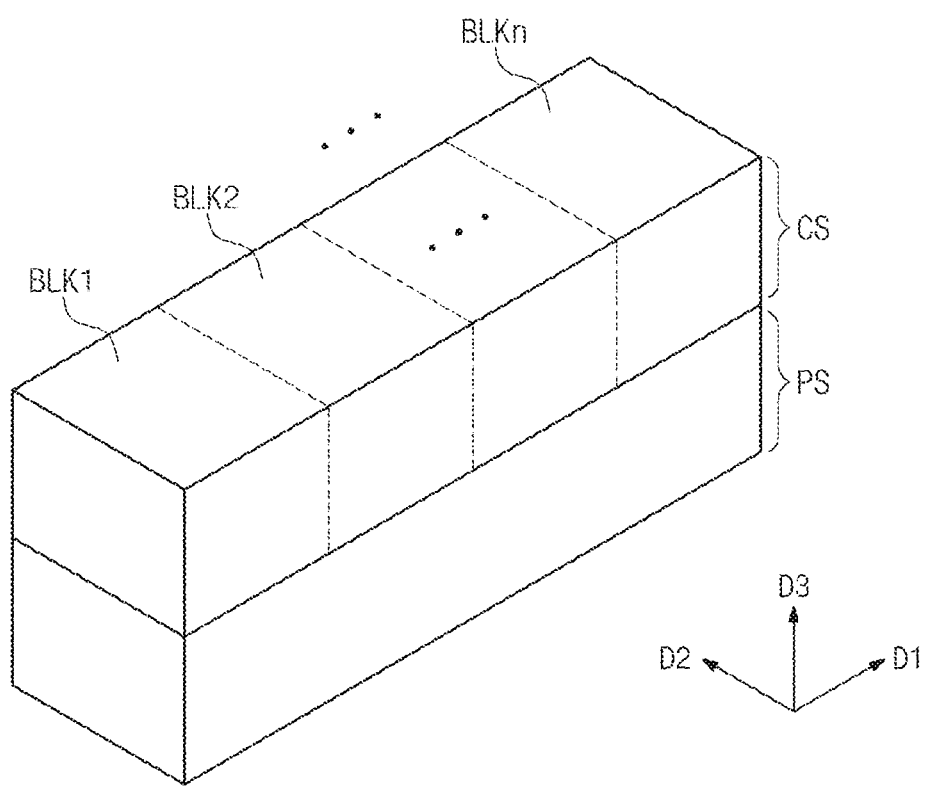
FIG. 18 is a schematic block diagram illustrating a 3D semiconductor memory device according to an example embodiment of the inventive concepts.

FIG. 18 is a schematic block diagram illustrating a 3D semiconductor memory device according to an example embodiment of the inventive concepts.

Referring to FIG. 18, a 3D semiconductor memory device according to embodiments may include a peripheral logic structure PS and a cell array structure CS. The cell array structure CS may be stacked on the peripheral logic structure PS. For example, the cell array structure CS may overlap with the peripheral logic structure PS when viewed from a plan view.

In some example embodiments, the peripheral logic structure PS may include the row and column decoders 2 and 4, the page buffer 3, and the control circuit 5, which are described with reference to FIG. 1. The cell array structure CS may include memory blocks BLK1 to BLKn, each of which corresponds to a data erase unit. Each of the memory blocks BLK1 to BLKn may include a structure stacked on a plane defined by first and second directions D1 and D2, while extending along a third direction D3. Each of the memory blocks BLK1 to BLKn may include a memory cell array having a 3D structure (or a vertical structure). The memory cell array may include the plurality of three-dimensionally arranged memory cells and the word and bit lines electrically connected to the memory cells, which are described with reference to FIG. 2.

Figure 19:
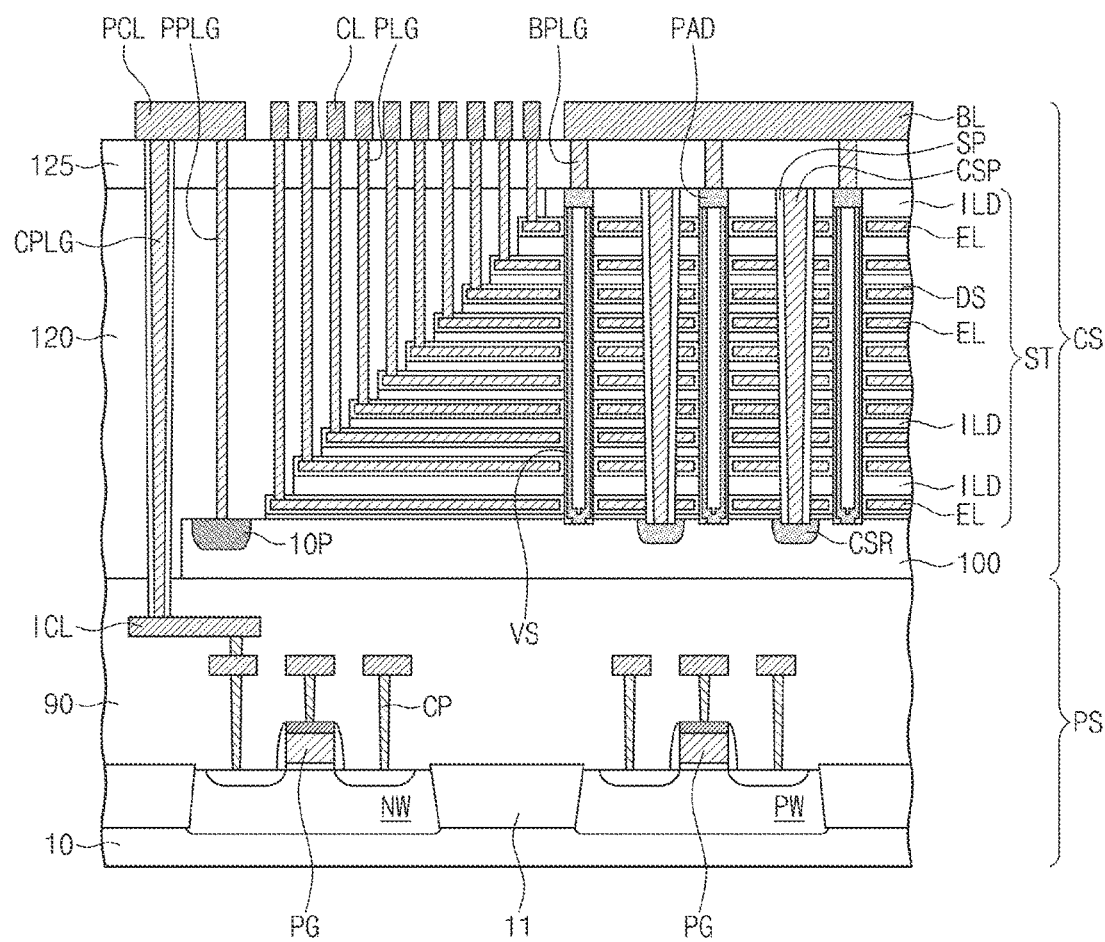
FIG. 19 is a cross-sectional view illustrating a 3D semiconductor memory device according to an example embodiment of the inventive concepts.

FIG. 19 is a cross-sectional view illustrating a 3D semiconductor memory device according to an example embodiment of the inventive concepts.

Referring to FIG. 19, a peripheral logic structure PS and a cell array structure CS may be sequentially stacked on a semiconductor substrate 10. For example, the peripheral logic structure PS may be disposed between the semiconductor substrate 10 and the cell array structure CS. The peripheral logic structure PS may overlap with the cell array structure CS when viewed from a plan view.

The semiconductor substrate 10 may be, for example, a bulk silicon substrate, a silicon-on-insulator (SOI) substrate, a germanium substrate, a germanium-on-insulator (GOI) substrate, a silicon-germanium substrate, or a substrate including an epitaxial layer obtained by performing a selective epitaxial growth (SEG) process.

The peripheral logic structure PS may include the row and column decoders 2 and 4, the page buffer 3, and the control circuit 5, which are described with reference to FIG. 1. For example, peripheral logic structure PS may include NMOS and PMOS transistors, a resistor and a capacitor which are electrically connected to the cell array structure CS. These peripheral circuits of the peripheral logic structure PS may be formed on the top surface of the semiconductor substrate 10. Further, the semiconductor substrate 10 may include an N-well region NW doped with N-type dopants and a P-well region PW doped with P-type dopants. Active regions may be defined in the N-well region NW and the P-well region PW by a device isolation layer 11.

The peripheral logic structure PS may include peripheral gate electrodes PG, source/drain regions at both sides of each of the peripheral gate electrodes PG, peripheral contact plugs CP, peripheral circuit interconnections ICL, and a lower filling insulation layer 90 covering the peripheral circuits. For example, PMOS transistors may be formed on the N-well region NW, and NMOS transistors may be formed on the P-well region PW. The peripheral circuit interconnections ICL may be electrically connected to the peripheral circuits through the peripheral contact plugs CP. For example, the peripheral contact plugs CP and the peripheral circuit interconnections ICL may be electrically connected to the NMOS and PMOS transistors.

The lower filling insulation layer 90 may cover the peripheral circuits, the peripheral contact plugs CP, and the peripheral circuit interconnections ICL. The lower filling insulation layer 90 may include a plurality of stacked insulating layers.

The cell array structure CS may be disposed on the lower filling insulation layer 90 and may include a horizontal semiconductor layer 100, stack structures ST, and vertical structures VS.

The horizontal semiconductor layer 100 may be formed on the lower filling insulation layer 90 covering the peripheral circuits. For example, a bottom surface of the horizontal semiconductor layer 100 may be in contact with the lower filling insulation layer 90. The horizontal semiconductor layer 100 may overlap with a cell array region and a contact region adjacent to the cell array region when viewed from a plan view.

The horizontal semiconductor layer 100 may be formed of a semiconductor material. For example, the horizontal semiconductor layer 100 may include at least one of silicon (Si), germanium (Ge), silicon-germanium (SiGe), gallium-arsenic (GaAs), indium-gallium-arsenic (InGaAs), aluminum-gallium-arsenic (AlGaAs), or any combination thereof. Further, the horizontal semiconductor layer 100 may include a semiconductor doped with dopants of a first conductivity type and/or an intrinsic semiconductor not doped with dopants. The horizontal semiconductor layer 100 may have a crystal structure including at least one of a single-crystalline structure, an amorphous structure, and a poly-crystalline structure.

The stack structures ST may extend in parallel in a first direction D1 on the horizontal semiconductor layer 100 and may be spaced apart from each other in a second direction D2. Each of the stack structures ST may include horizontal electrodes EL vertically stacked on the horizontal semiconductor layer 100 and insulating layers ILD disposed between the horizontal electrodes EL. Thicknesses of the insulating layers ILD may be changed according to characteristics of the semiconductor memory device. In an example embodiment, the lowermost one of the insulating layers ILD may be thinner than other one(s) of the insulating layers ILD. In an example embodiment, one or some of the insulating layers ILD may be thicker than other one(s) of the insulating layers ILD. The insulating layers ILD of the stack structure ST may be formed of a low-k dielectric layer having a lower dielectric constant than an oxide layer. For example, at least one of the insulating layers ILD may be a low-k dielectric layer having pores, as described with reference to FIG. 4.

The stack structures ST may have stepwise structures for electrically connecting the horizontal electrodes EL to the peripheral logic structure PS, and the stepwise structures may be disposed in the contact region. An upper filling insulation layer 120 may be disposed on the horizontal semiconductor layer 100 to cover end portions of the horizontal electrodes EL which have the stepwise structure. A capping insulating layer 125 may cover the stack structures ST and the upper filling insulating layer 120. Bit lines BL may be disposed on the capping insulating layer 125 and may extend in the second direction D2 to intersect the stack structures ST. The bit lines BL may be electrically connected to the vertical structures VS through bit line contact plugs BPLG.

The vertical structures VS may penetrate each of the stack structures ST and connected to the horizontal semiconductor layer 100. In an example embodiment, the vertical structures VS may include a semiconductor material. Bottom surfaces of the vertical structures VS may be disposed at a level between a top surface and a bottom surface of the horizontal semiconductor layer 100. Contact pads PAD may be disposed on top ends of the vertical structures VS and connected to the bit line contact plugs BPLG.

A data storage layer DS may be disposed between the vertical structure VS and the stack structure ST. The data storage layers DS each may include a vertical insulating pattern VP penetrating the stack structure ST and a horizontal insulating pattern HP. The horizontal insulating patterns HP may extend between the horizontal electrodes EL and the insulating layers ILD onto top and bottom surfaces of the horizontal electrodes EL, as described with reference to FIG. 4.

A common source region CSR may be disposed in the horizontal semiconductor layer 100 between the stack structures adjacent to each other. The common source regions CSR may extend in the first direction D1 in parallel to the stack structures ST. The common source regions CSR may be formed by doping the horizontal semiconductor layer 100 with dopants of a second conductivity type. For example, the common source regions CSR may be doped with N-type dopants (e.g., arsenic (As) or phosphorus (P)).

A common source plug CSP may be connected to each of the common source region CSR, and sidewall insulating spacers SP may be disposed between the common source plug CSP and the stack structures ST, respectively. In an example embodiment, the common source plug CSP may extend in the first direction D1, and the sidewall insulating spacers SP may also extend in the first direction D1 between the common source plug CSP and the stack structures ST. According to other example embodiment, an insulating layer may be formed on a sidewall and a bottom of a space provided between the stack structures ST adjacent to each other, and the common source plug CSP may be formed to penetrate the insulating layer on the bottom of the space to form the sidewall insulating spacer SP. Thus, the common source plug CSP may be locally connected to the common source region CSR.

Pickup regions 10P may be disposed in the horizontal semiconductor layer 100 in the contact region. The contact region may be provided in plurality at both sides of the cell array region. For example, the pickup regions 10P may be spaced apart from each other in the first direction D1. The pickup regions 10P may be formed by doping portions of the horizontal semiconductor layer 100 with dopants of the first conductivity type. For example, the pickup regions 10P may have the same conductivity type as the horizontal semiconductor layer 100, and a dopant concentration of the pickup region 10P may be higher than that of the horizontal semiconductor layer 100.

An interconnection structure for electrically connecting the cell array structure CS to the peripheral logic structure PS may be disposed in the contact region, which includes the end portions of the stack structures ST constituting the stepwise structures. As described above, the upper filling insulation layer 120 may be disposed on the horizontal semiconductor layer 100 to cover the end portions of the stack structures ST. The interconnection structure may include contact plugs PLG penetrating the upper filling insulation layer 120 connected to the end portions of the horizontal electrodes EL, and connecting lines CL disposed on the upper filling insulation layer 120 connected to the contact plugs PLG. Vertical lengths of the contact plugs PLG may decrease as a distance from the cell array region decreases.

Pickup contact plugs PPLG may penetrate the upper filling insulation layer 120 and connected to the pickup regions 10P, respectively. Top surfaces of the pickup contact plugs PPLG may be substantially coplanar with top surfaces of the contact plugs PLG. The pickup contact plug PPLG may be electrically connected to the peripheral logic structure PS through a well conductive line PCL and a connecting plug CPLG.

The connecting plug CPLG may electrically connect the cell array structure CS to the peripheral logic structure PS. The connecting plug CPLG may penetrate the upper filling insulation layer 120 and the horizontal semiconductor layer 100 so as to be connected to the peripheral circuit interconnection ICL of the peripheral logic structure PS.

Figure 20:
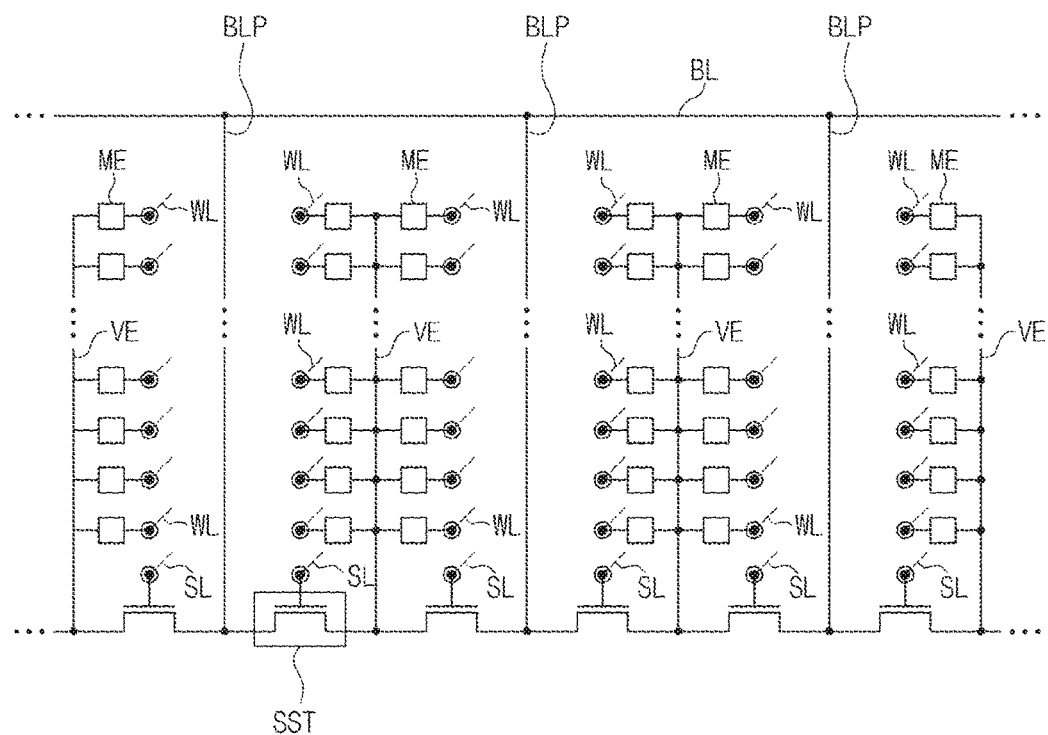
FIG. 20 is a schematic circuit diagram illustrating a cell array of a 3D semiconductor memory device according to an example embodiment of the inventive concepts.

FIG. 20 is a schematic circuit diagram illustrating a cell array of a 3D semiconductor memory device according to an example embodiment of the inventive concepts.

Referring to FIG. 20, a plurality of selection transistors SST may be connected in parallel to a bit line BL through a plurality of bit line plugs BLP. Each of the bit line plugs BLP may be connected in common to a pair of the selection transistors SST adjacent to each other.

A plurality of word lines WL and a plurality of vertical electrodes VE may be disposed between the bit line BL and the selection transistors SST. Each of the vertical electrodes VE may be disposed between the bit line plugs BLP adjacent to each other. For example, the vertical electrodes VE and the bit line plugs BLP may be alternately arranged along a longitudinal direction of the bit line BL. Each of the vertical electrodes VE may be connected in common to a pair of the selection transistors SST adjacent to each other.

A plurality of memory elements ME may be connected in parallel to each of the vertical electrodes VE. Each of the memory elements ME may be connected to a corresponding one of the word lines WL. For example, each of the word lines WL may be connected to a corresponding one of the vertical electrodes VE through the corresponding one of the memory elements ME.

Each of the selection transistors SST may include a selection line SL used as a gate electrode thereof. In an example embodiment, the selection lines SL may be parallel to the word lines WL.

Figure 21:
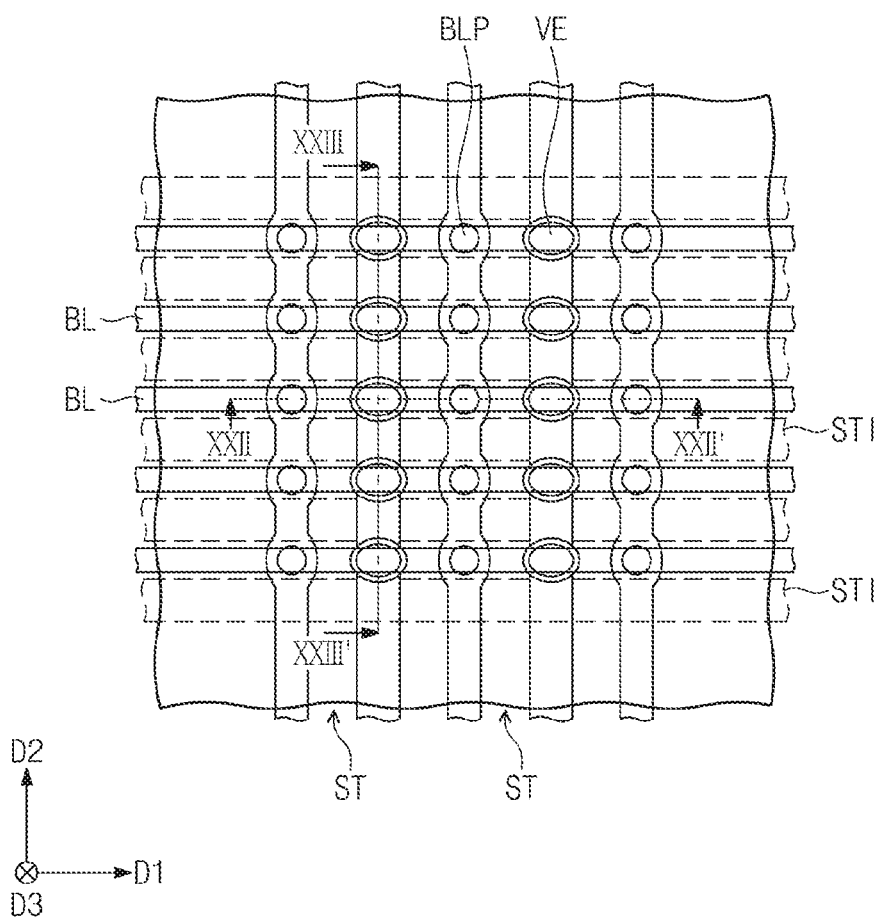
FIG. 21 is a plan view illustrating a 3D semiconductor memory device according to an example embodiment of the inventive concepts.
Figure 22:
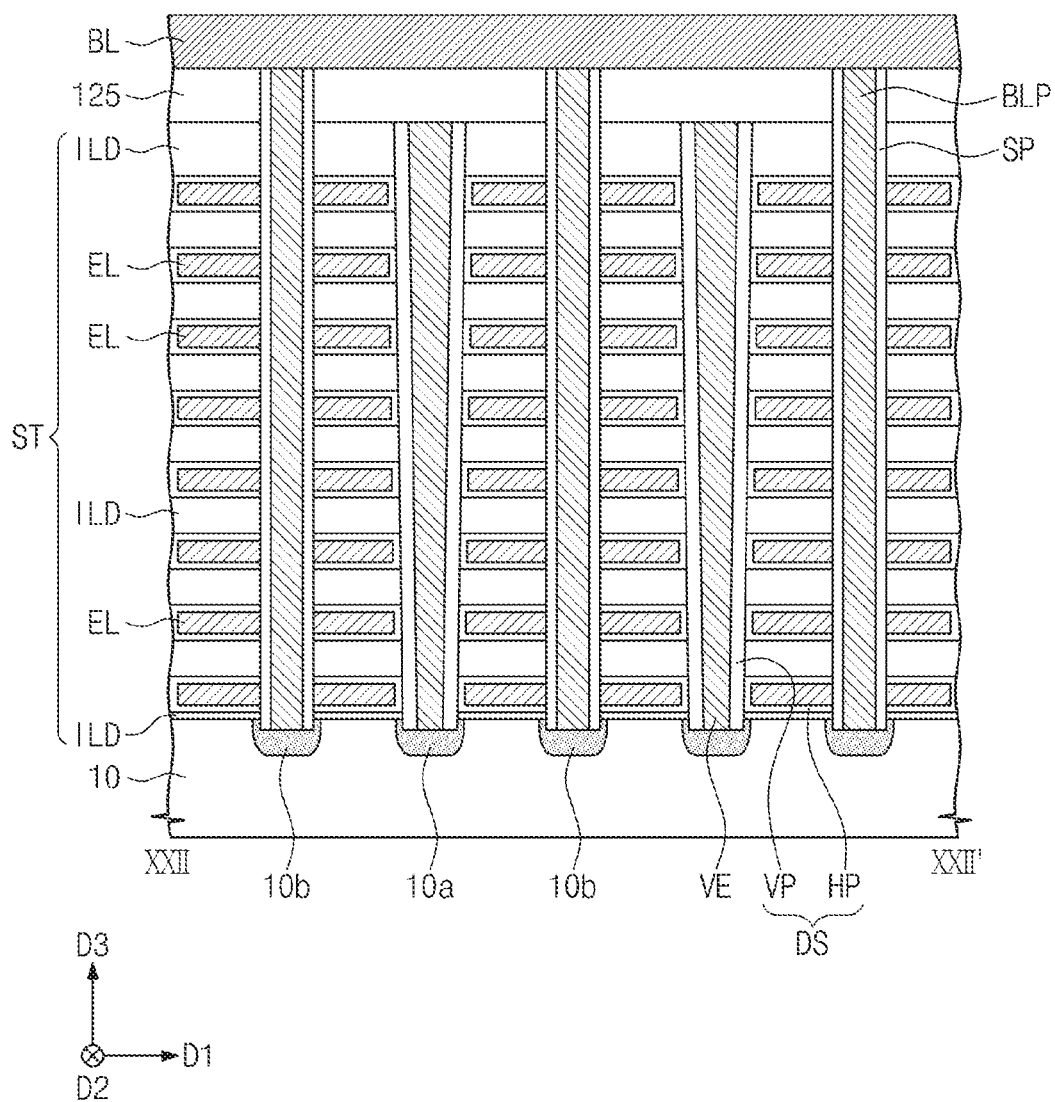
FIGS. 22 and 23 are cross-sectional views taken along lines XXII-XXII' and XXIII-XXIII' of FIG. 21, respectively.
Figure 23:
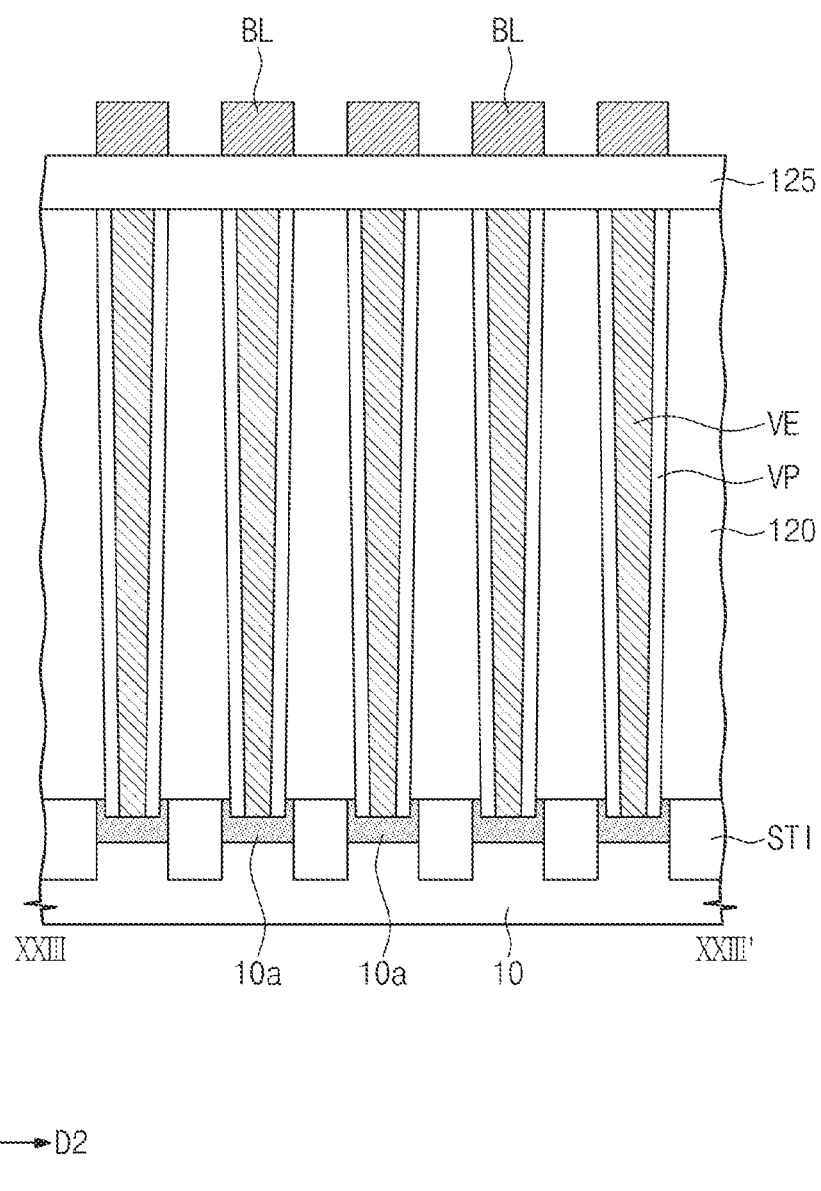

FIG. 21 is a plan view illustrating a 3D semiconductor memory device according to an example embodiment of the inventive concepts. FIGS. 22 and 23 are cross-sectional views taken along lines XXII-XXII' and XXIII-XXIII' of FIG. 21, respectively.

Referring to FIGS. 21, 22, and 23, a plurality of bit lines BL functioning as the bit line BL illustrated in FIG. 20 may be disposed on a substrate 10. The substrate 10 may have a plurality of active regions parallel to the bit lines BL. The active regions may be defined by a plurality of device isolation patterns STI formed in an upper portion of the substrate 10. Each of the device isolation patterns STI may be disposed between the bit lines BL adjacent to each other when viewed from a plan view. The device isolation patterns STI may be parallel to the bit lines BL.

A plurality of dopant regions 10a and 10b may be formed in each of the active regions and arranged in a line along a direction parallel to the bit line BL. The dopant regions 10a and 10b may be spaced apart from each other to define channel regions therebetween in each of the active regions. The dopant regions 10a and 10b may include a plurality of first dopant regions 10a and a plurality of second dopant regions 10b which are alternately arranged in the direction parallel to the bit line BL.

A plurality of vertical electrodes VE may be two-dimensionally arranged on the substrate 10 and may be connected to the first dopant regions 10a, respectively. Bit line plugs BLP may be two-dimensionally arranged on the substrate 10 and may be connected to the second dopant regions 10b, respectively.

Stack structures ST may be disposed on the substrate 10 to intersect the device isolation patterns STI. Each of the stack structures ST may include horizontal electrodes EL and insulating layers ILD which are alternately stacked on the substrate 10 in a direction perpendicular to the top surface of the substrate 10. The horizontal electrodes EL may function as the word lines WL and the selection lines illustrated in FIG. 20. The horizontal electrodes EL may be sequentially stacked on each of the channel regions. In an example embodiment, the lowermost ones of the horizontal electrodes EL may function as the selection lines SL, and the others of the horizontal electrodes EL may function as the word lines WL. The insulating layers ILD of the stack structure ST may be formed of the low-k dielectric layer having a lower dielectric constant than an oxide layer. For example, at least one of the insulating layers may be the low-k dielectric layer having pores, as described with reference to FIG. 4.

The horizontal electrodes EL may be laterally spaced apart from the vertical electrodes VE and the bit line plugs BLP. For example, a data storage layer DS may be disposed between the horizontal electrodes EL and the vertical electrodes VE, and a sidewall insulating spacer SP may be disposed between the horizontal electrodes EL and the bit line plugs BLP.

Each of the vertical electrodes VE may be used as a conductive path between a corresponding one of the first dopant regions 10a and one of the horizontal electrodes EL. Thus, the vertical electrodes VE may be connected to the first dopant regions 10a but may be spaced apart from the bit lines BL. Each of the bit line plugs BLP may be used as a conductive path between a corresponding one of the second dopant regions 10b and a corresponding one of the bit lines BL. At this time, each of the bit line plugs BLP may be spaced apart from the horizontal electrodes EL by the sidewall insulating spacer SP.

FIGS. 24 to 30 are cross-sectional views taken along the line IV-IV' of FIG. 3 to illustrate a method of manufacturing a 3D semiconductor memory device according to an example embodiment of the inventive concepts.

Figure 24:
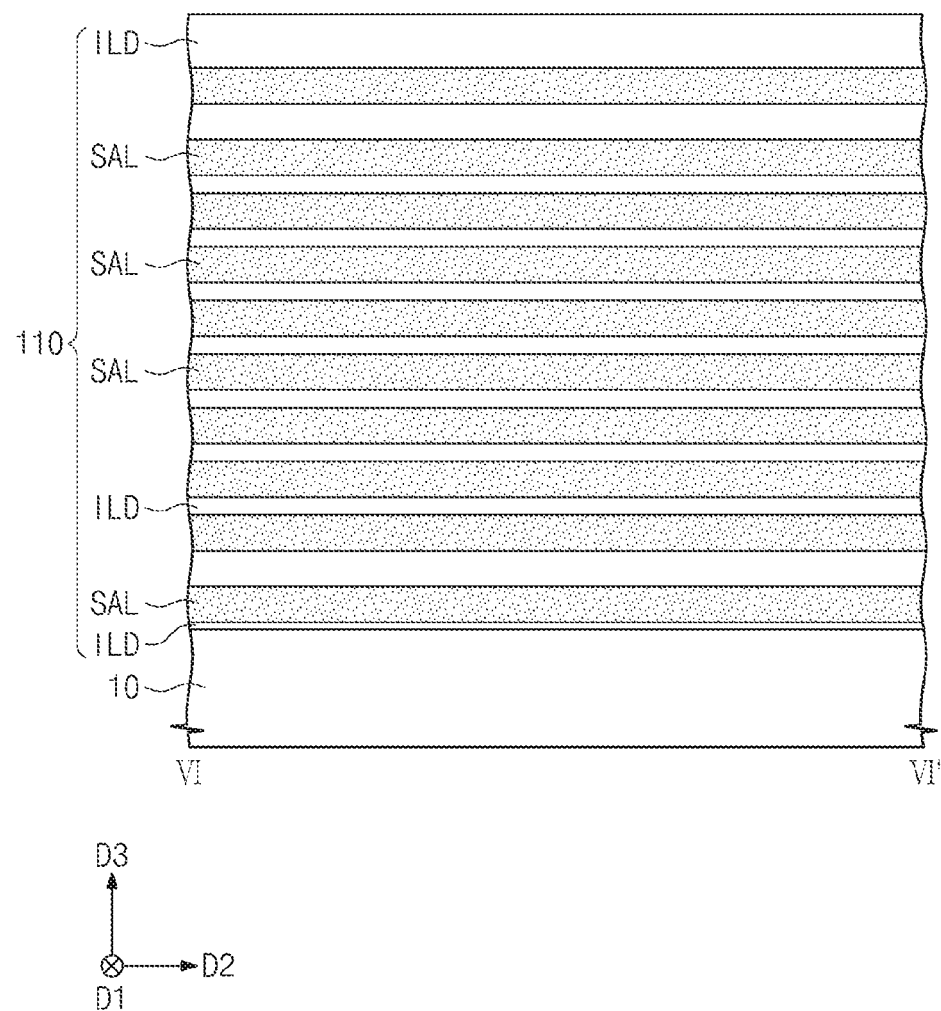
FIGS. 24 to 30 are cross-sectional views taken along the line VI-VI' of FIG. 3 to illustrate a method of manufacturing a 3D semiconductor memory device according to an example embodiment of the inventive concepts.

Referring to FIGS. 3 and 24, a thin layer structure 110 may be formed on the substrate 10. The thin layer structure 110 may include sacrificial layers SAL and insulating layers ILD which are alternately and repeatedly stacked on the substrate 10.

The semiconductor substrate 10 may be a bulk silicon substrate, a silicon-on-insulator (SOI) substrate, a germanium substrate, a germanium-on-insulator (GOI) substrate, a silicon-germanium substrate, or a substrate including an epitaxial layer obtained by performing a selective epitaxial growth (SEG) process.

In the thin layer structure 110, the sacrificial layers SAL may be formed of a material having an etch selectivity with respect to the insulating layers ILD. For example, a difference between an etch rate of the sacrificial layers SAL and an etch rate of the insulating layers ILD may be relatively great in a wet etching process using a chemical solution, and a difference between an etch rate of the sacrificial layers SAL and an etch rate of the insulating layers ILD may be relatively small in a dry etching process using an etching gas.

In some example embodiments, the sacrificial layers SAL and the insulating layers ILD may be formed of insulating materials having an etch selectivity with respect to each other. For example, each of the sacrificial layers SAL may include at least one of an insulating silicon layer, a silicon oxide layer, an insulating silicon carbide layer, an insulating silicon-germanium layer, a silicon oxynitride layer, or a silicon nitride layer. Each of the insulating layers ILD may include at least one of an insulating silicon layer, a silicon oxide layer, an insulating silicon carbide layer, a silicon oxynitride layer, a silicon nitride layer, or a low-k dielectric layer. At this time, the insulating layers ILD may be formed of a different material from the sacrificial layers SAL. For example, the sacrificial layers SAL may be formed of silicon nitride layers, and the insulating layers ILD may be formed of the low-k dielectric layers. In a different example, the sacrificial layers SAL may be formed of a conductive material, and the insulating layers ILD may be formed of an insulating material.

For example, each of the sacrificial layers SAL and the insulating layers ILD may be deposited by one of a thermal CVD technique, a plasma-enhanced CVD (PE-CVD) technique, a physical CVD technique, or an ALD technique.

In some example embodiments, thicknesses of the sacrificial layers SAL may be equal to each other. In other example embodiments, the lowermost one and the uppermost one of the sacrificial layers SAL may be thicker than other sacrificial layers SAL disposed between the lowermost sacrificial layer and the uppermost sacrificial layer. In some example embodiments, thicknesses of the insulating layers ILD may be equal to each other. In other example embodiments, thicknesses of one or some of the insulating layers ILD may be different from those of other insulating layers ILD. In some example embodiments, the lowermost insulating layer ILD of the thin layer structure 110 may be thinner than the sacrificial layers SAL and the insulating layers ILD disposed on the lowermost insulating layer ILD. The lowermost insulating layer ILD may include a silicon oxide layer formed by a thermal oxidation process.

According to some example embodiments of the inventive concepts, at least one of the insulating layers ILD may be a dielectric layer including porogens. For example, the porogen may be hydrocarbon having a structure expressed as CHx-CHy, where each of "x" and "y" is a number greater than 0 (zero). Sizes and a porosity of pores to be formed in the insulating layers in a subsequent process may be varied according to the amount and concentration of the porogens in the insulating layers ILD.

For example, the porogen may include at least one of branched poly(p-xylene), linear poly(p-phenylene), linear polybutadiene, branched polyethylene, poly(ethylene terephthalate) (PET), polyamide-6,6 (Nylon6/6), syndiotactic polystyrene (PS-syn), polycaprolactone (PCL), poly(propylene oxide) (PPO), polycarbonates, poly(phenylene sulfide) (PPS), polyamideimide (PAI), polyphthalamide (PPA; Amodel), polymethylstyrene (PMS), polyetheretherketone (PEEK), poly(ether sulfone) (PES), poly(etherketone) (PEK), polyoxymethylene (POM), poly(butylene terephthalate) (PBT), polystyrene (PS), poly(norbornene), cetyltrimethylammonium bromide (CTAB), poly(ethylene oxide-b-propylene oxide-b-ethyleneoxide) (PEO-b-PPO-b-PEO), or cyclodextrin (CD).

Forming the insulating layers ILD may include performing a deposition process using a mixture of an organic silicon precursor, an oxidizing agent, and the porogens. In an example embodiment, the insulating layer ILD may be a silicon oxide layer including hydrocarbon. When the insulating layers ILD are formed, the organic silicon precursor may include at least one of trimethylsilane (3MS,(CH3)3-Si—H), tetramethylsilane (4MS, (CH3)4-Si), or vinyltrimethylsilane (VTMS, CH2=CH—Si(CH3)3). The oxidizing agent for oxidizing the precursor may include oxygen. For example, the oxidizing agent may include a gas including hydrogen peroxide. The silicon oxide layer containing carbon may be formed by, for example, a PE-CVD process or an ALD process.

In some example embodiments, the insulating layers ILD of the thin layer structure 110 may include the porogens, the amount or concentration of the porogens of one or some of insulating layers ILD may be different from the amount or concentration of the porogens of other(s) of the insulating layers ILD. In some example embodiments, one or some of the insulating layers ILD of the thin layer structure 110 may include the porogens, and other(s) of the insulating layers ILD may not include the porogens. Accordingly, the pores may be generated in one or some of the insulating layers ILD but may not be generated in other(s) of the insulating layers ILD.

Figure 25:
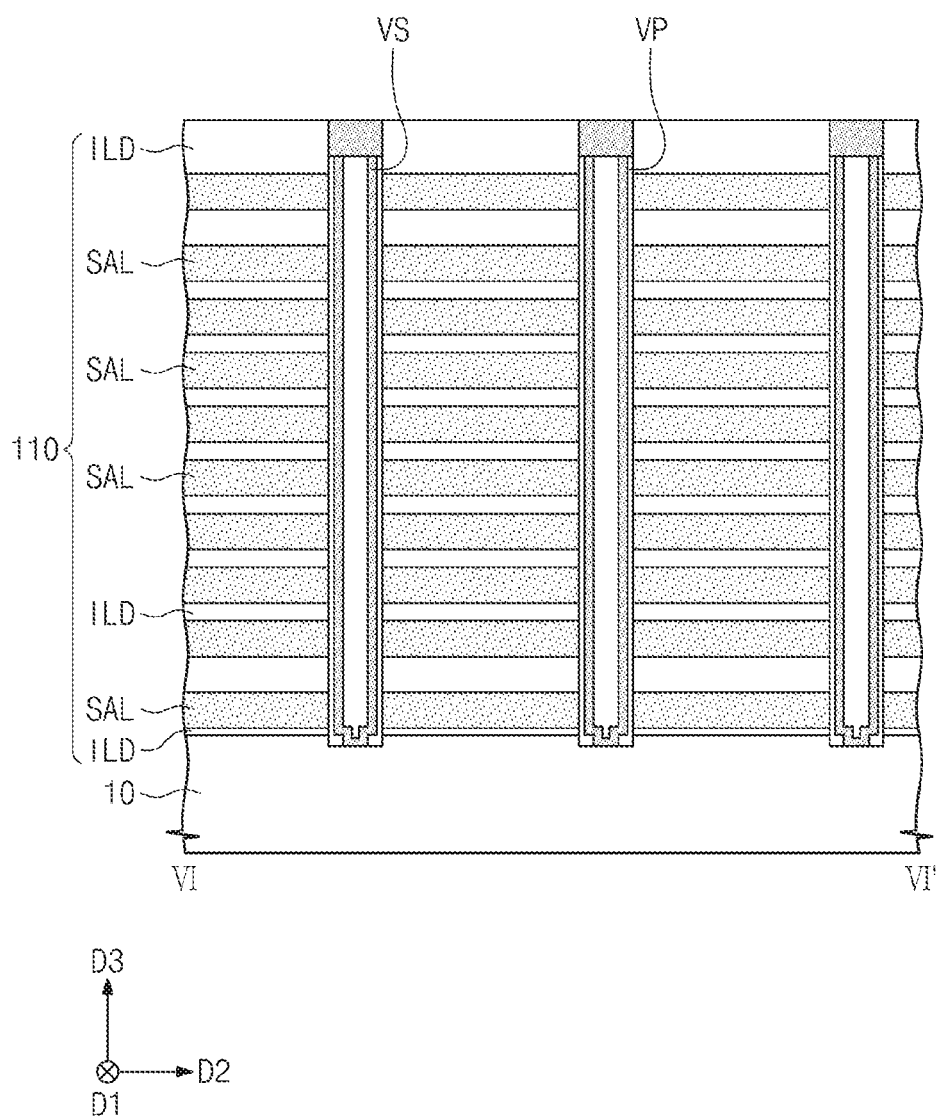

Referring to FIGS. 3 and 25, vertical structures VS may be formed to penetrate the thin layer structure 110. The vertical structures VS may be connected to the substrate 10 and may be formed of, for example, a semiconductor material or a conductive material.

In some example embodiments, forming the vertical structures VS may include forming openings penetrating the thin layer structure 110, and forming semiconductor patterns in the openings, respectively. Forming the openings may include forming a mask pattern (not shown) on the thin layer structure 110, and performing an anisotropic etching process on the thin layer structure 110 using the mask pattern (not shown) as an etch mask. The top surface of the substrate 10 under the openings may be over-etched during the anisotropic etching process, and thus the top surface of the substrate 10 exposed by the openings may be recessed to a desired (or alternatively, predetermined) depth. A width of a lower region of the opening may be smaller than a width of an upper region of the opening. The openings may be arranged in a line or in a zigzag from along one direction.

Forming the semiconductor patterns in the openings may include forming semiconductor spacers, which covers sidewalls of the openings while exposing the substrate 10, and forming semiconductor layer body portions connected to the substrate 10 in the openings. The semiconductor pattern may have, for example, a hollow pipe (e.g., a cylinder) shape or a hollow macaroni shape. At this time, a bottom end of the semiconductor pattern may be in a closed state. The semiconductor pattern may include silicon (Si), germanium (Ge), or a mixture thereof and may be a semiconductor doped with dopants or an intrinsic semiconductor not doped with dopants. The semiconductor pattern may have a crystal structure including at least one of a single-crystalline structure, an amorphous structure, and a poly-crystalline structure. A conductive pad PAD may be formed on a top end of the vertical structure VS. The conductive pad PAD may be a dopant region doped with dopants or may be formed of a conductive material. In an example embodiment, before the semiconductor patterns are formed in the openings, a vertical insulating pattern VP may be formed in each of the openings. The vertical insulating pattern VP may include a single thin layer or a plurality of thin layers. The vertical insulating pattern VP may correspond to a portion of the data storage layer.

Referring to FIG. 8, forming the vertical structures VS may include forming openings penetrating the thin layer structure 110, forming lower semiconductor patterns LSP filling lower regions of the openings, forming vertical insulating patterns VP in the openings having the lower semiconductor patterns LSP, and forming upper semiconductor patterns USP connected to the lower semiconductor patterns LSP in the openings. The vertical insulating pattern VP may be disposed between the upper semiconductor pattern USP and the sidewall of the opening. The lower semiconductor pattern LSP may be used as a channel region of the ground selection transistor GST described above. The lower semiconductor pattern LSP may be formed of a semiconductor material having the same conductivity type as the substrate 10. In an example embodiment, the lower semiconductor pattern LSP may include an epitaxial pattern formed by an epitaxial or laser crystallization technique using the substrate 10 as a seed. In this case, the lower semiconductor pattern LSP may have a single-crystalline structure or may have a poly-crystalline structure, a grain size of which is greater than that of a semiconductor material formed using a CVD technique. In an example embodiment, the lower semiconductor pattern LSP may be formed of a poly-crystalline semiconductor material (e.g., poly-crystalline silicon). In an example embodiment, the insulating layer ILD1 adjacent to the lower semiconductor pattern LSP may be in direct contact with one sidewall of the lower semi-conductor pattern LSP. In an example embodiment, the lower semiconductor pattern LSP may have a pillar shape penetrating the lowermost sacrificial layer SAL. A bottom surface of the lower semiconductor pattern LSP may be lower than the top surface of the substrate 10, and a top surface of the lower semiconductor pattern LSP may be higher than a top surface of the lowermost sacrificial layer SAL.

Figure 26:
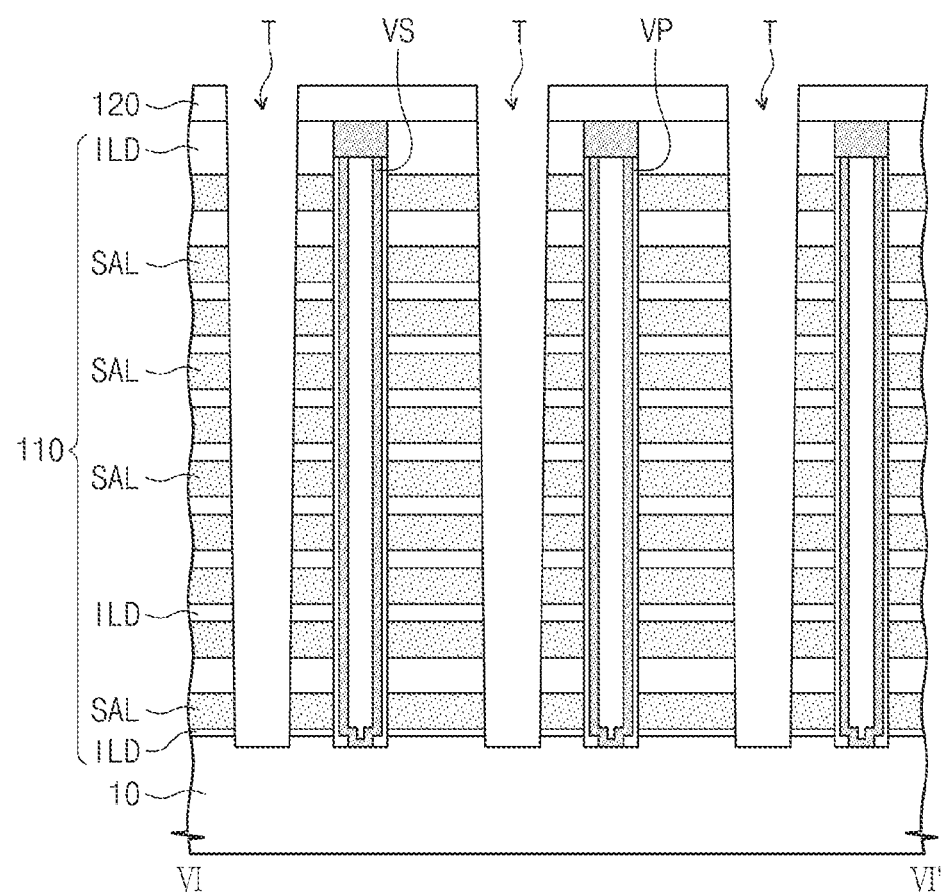
Figure 26:
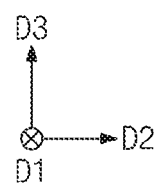

Referring to FIGS. 3 and 26, an upper filling insulation layer 120 may be formed to cover the vertical structures VS and the thin layer structure 110 after the formation of the vertical structures VS. The upper filling insulation layer 120 and the thin layer structure 110 may be patterned to form trenches T exposing the substrate 10. The trenches T may be spaced apart from the vertical structures VS.

Forming the trenches T may include forming a mask pattern (not shown) defining planar positions of the trenches T on the thin layer structure 110, and anisotropically etching the thin layer structure 110 using the mask pattern (not shown) as an etch mask.

The trench T may be spaced apart from the vertical structures VS and may expose sidewalls of the sacrificial layers SAL and the insulating layers ILD. The trench T may have a linear or rectangular shape extending in the first direction D1 when viewed from a plan view. As described above, the trench T may expose the substrate 10 in a cross-sectional view. The top surface of the substrate 10 exposed by the trench T may be recessed to a desired (or alternatively, predetermined) depth by over-etching during the formation of the trench T. In an example embodiment, the trench T may have an inclined sidewall.

In the event that the trenches T are formed, the thin layer structure 110 may be divided into line-shaped structures extending in the first direction D1. A plurality of the vertical structures VS may penetrate each of the line-shaped structures of the thin layer structure 110.

Figure 27:
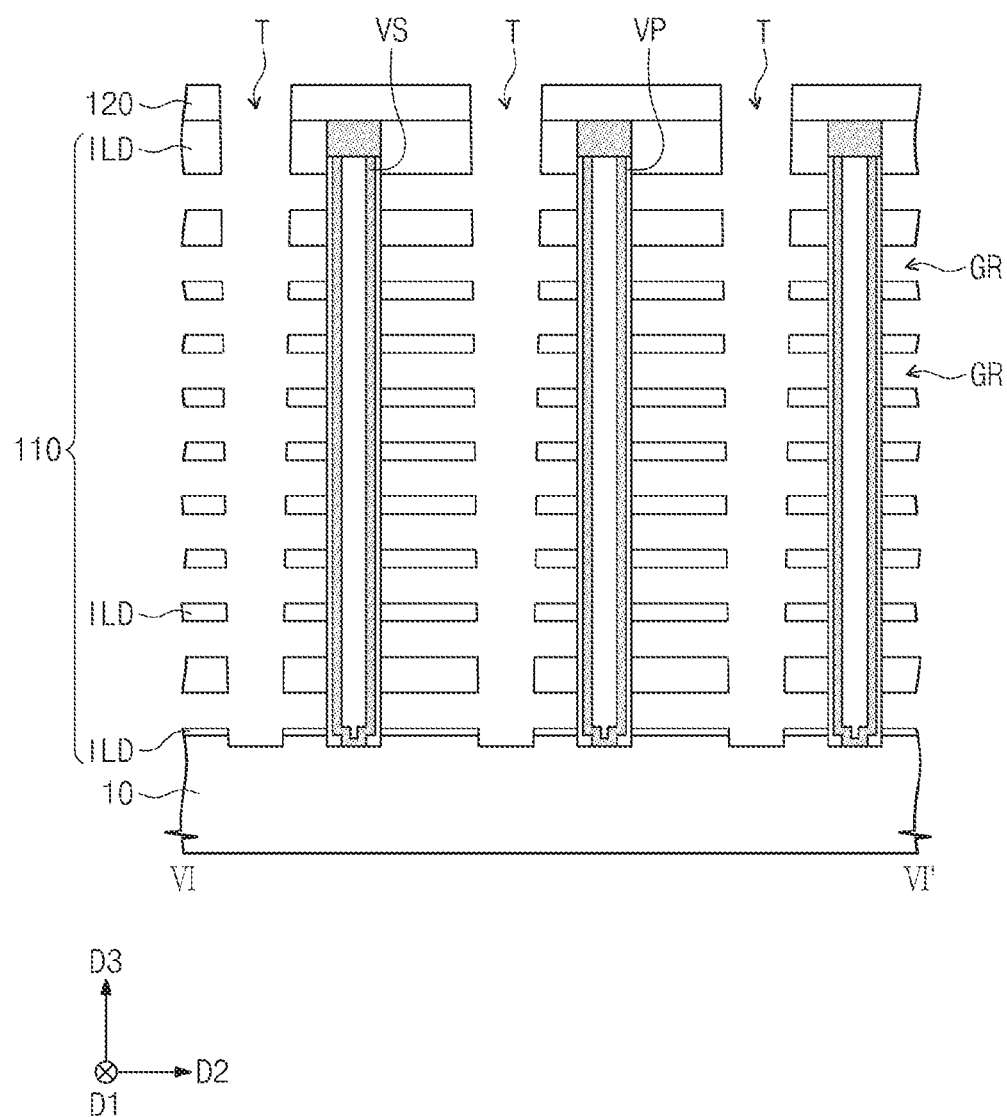

Referring to FIGS. 3 and 27, the sacrificial layers SAL exposed by the trenches T may be removed to form gate regions GR between the insulating layers ILD.

The gate regions GR may be formed by isotropically etching the sacrificial layers SAL using an etch recipe having an etch selectivity with respect to the insulating layers ILD, the vertical structures VS, and the substrate 10. At this time, the sacrificial layers SAL may be completely removed by the isotropic etching process. For example, when the sacrificial layers SAL are silicon nitride layers and the insulating layers ILD are silicon oxide layers, the sacrificial layers SAL may be isotropically etched using an etching solution including phosphoric acid. Further, the vertical insulating pattern VP may be used as an etch stop layer during the isotropic etching process for forming the gate regions GR. The gate regions GR may laterally extend from the trench T into between the insulating layers ILD and may expose portions of the sidewall of the vertical insulating pattern VP or portions of the sidewall of the vertical structure VS. For example, each of the gate regions GR may be defined by the sidewall of the vertical insulating pattern VP and the insulating layers ILD vertically adjacent to each other.

Figure 28:
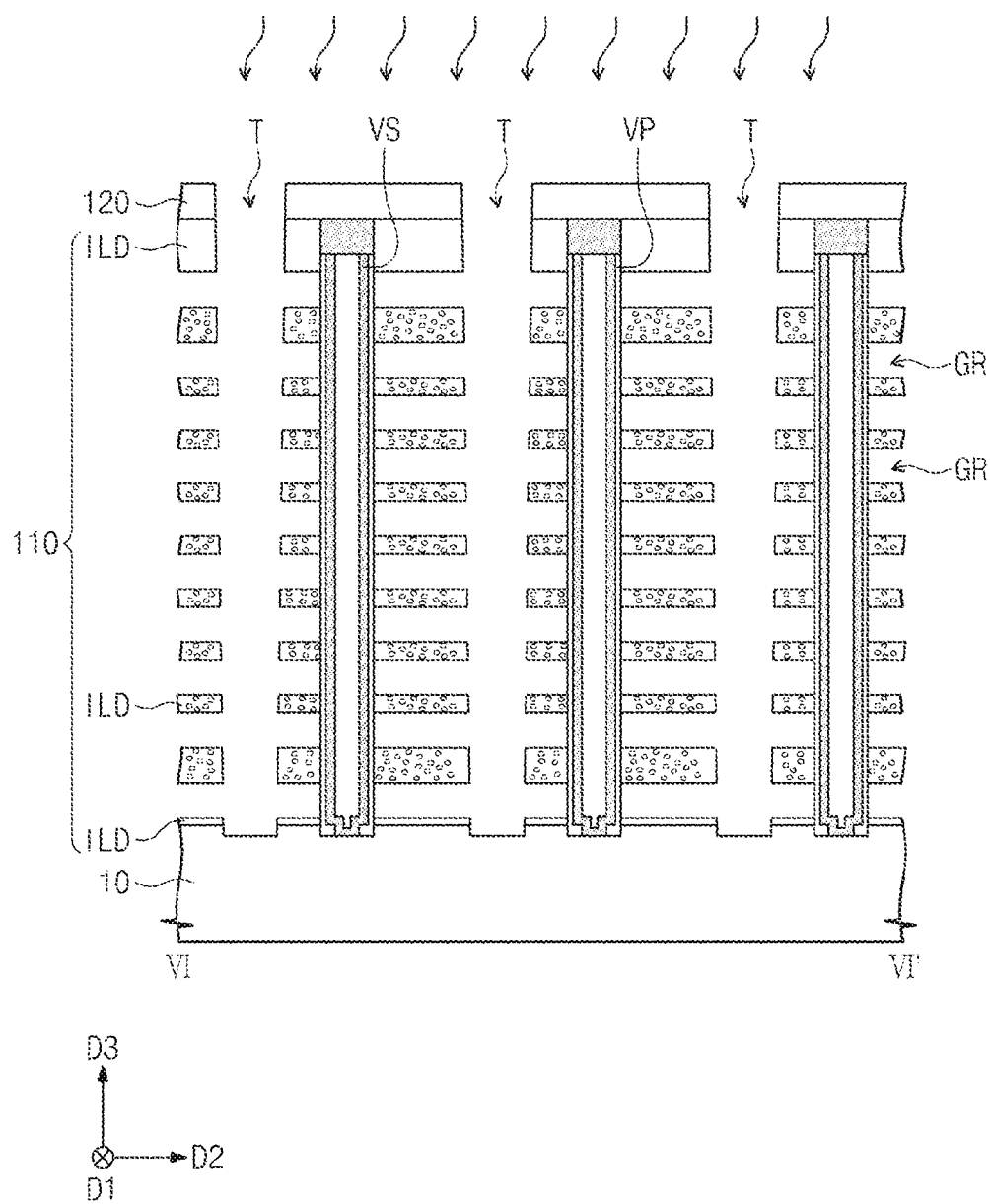

Referring to FIGS. 3 and 28, the porogens contained in the insulating layers ILD of the line-shaped structures of the thin layer structure 110 may be removed to form pores in the insulating layers ILD. For example, a curing process may be performed on the thin layer structure 110 having the gate regions GR to remove the porogens. In some example embodiments, the curing process may be performed by one of an ultraviolet (UV) irradiation process, an e-beam irradiation process, a thermal treatment process, and any combination thereof. Because the porogens are removed by the curing process, the pores may be formed at positions at which the porogens existed. As a result, the insulating layer ILD may be converted into a porous low-k dielectric layer. In an example embodiment, when the curing process is performed using the UV irradiation process, a wavelength of ultraviolet (UV) may be determined depending on a kind of the porogens and/or a kind of the insulating layer ILD. For example, in the event that the porogens include hydrocarbon having the structure expressed as CHx-CHy (where each of "x" and "y" is a number greater than 0), the curing process may be performed using the UV having the wavelength of about 200 nm to about 600 nm at a temperature of about 200 degrees Celsius to about 600 degrees Celsius.

In some example embodiments, one or some of the insulating layers ILD may include the porogens, and other(s) of the insulating layers ILD may not include the porogens. In this case, the pores may be formed in the one or some of the insulating layers ILD of the line-shaped structures of the thin layer structure 110. Further, in some example embodiments, the uniformity of the pores P in the insulating layers ILD may be controlled.

In the above mentioned example embodiments, the pores may be formed in the insulating layers ILD after the formation of the gate regions GR. However, example embodiments of the inventive concepts are not limited thereto. The process of forming the pores in the insulating layers ILD may be performed before the formation of the gate region GR or after a subsequent process of forming horizontal electrodes EL. In the event that the pores are formed in the insulating layers ILD after the formation of the horizontal electrodes EL, the e-beam irradiation process and/or the thermal treatment process may be used as the curing process.

In some example embodiments, the insulating layer ILD may be a silicon oxide layer containing hydrocarbon, i.e., a SiCOH layer. In this case, carbon contained in the silicon oxide layer may be combined with silicon by the curing process, and thus the SiCOH layer having a cage-like structure, a density of which is lower than that of $SiO_2$, may be converted into a p-SiCOH layer having the pores. Sizes of the pores may be in a range of several nm to several hundred nm.

Figure 29:
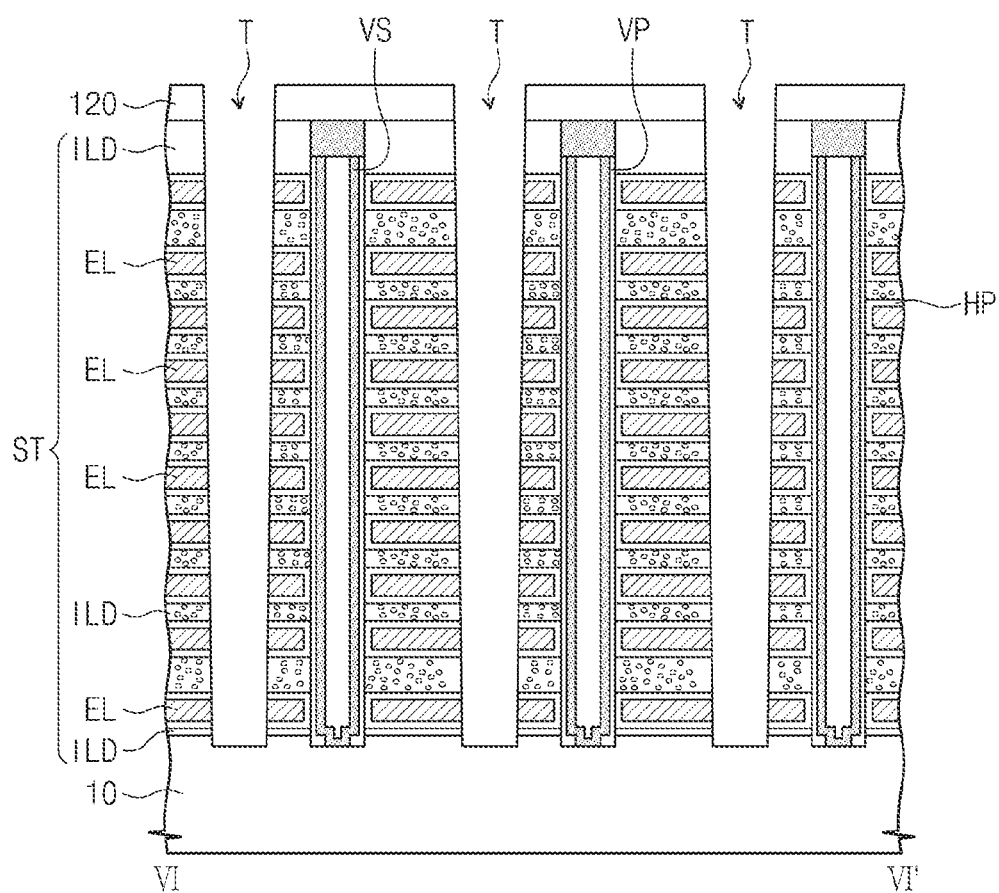
Figure 29:
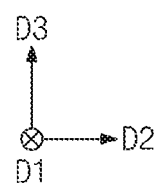

Referring to FIGS. 3 and 29, a horizontal insulating pattern HP may be formed to conformally cover inner surfaces of the gate regions GR.

The horizontal insulating pattern HP may have a substantially uniform thickness on the inner surface of the gate region GR. The horizontal insulating pattern HP may be formed of a single thin layer or a plurality of thin layers. In an example embodiment, the horizontal insulating pattern HP may be a portion of a data storage layer of a charge trap-type flash memory transistor. Subsequently, a gate conductive layer may be formed to fill the gate regions GR having the horizontal insulating pattern HP. The gate conductive layer may partially or completely fill the trench T. In an example embodiment, forming the gate conductive layer may include sequentially depositing a barrier metal layer and a metal layer. For example, the barrier metal layer may include a metal nitride layer (e.g., TiN, TaN, or WN). For example, the metal layer may include a metal material (e.g., W, Al, Ti, Ta, Co, or Cu). Next, the gate conductive layer disposed in the trench T may be removed to locally form horizontal electrodes EL in the gate regions GR, respectively.

Because the horizontal electrodes EL are formed in the gate regions GR, stack structures ST may be formed on the substrate 10. Each of the stack structures ST may include the insulating layers ILD and the horizontal electrodes EL, which are alternately and repeatedly stacked on the substrate 10. The stack structures ST may extend in the first direction D1, and sidewalls of the stack structures ST may be exposed through the trenches T. The substrate 10 may be exposed between the stack structures ST adjacent to each other.

Figure 30:
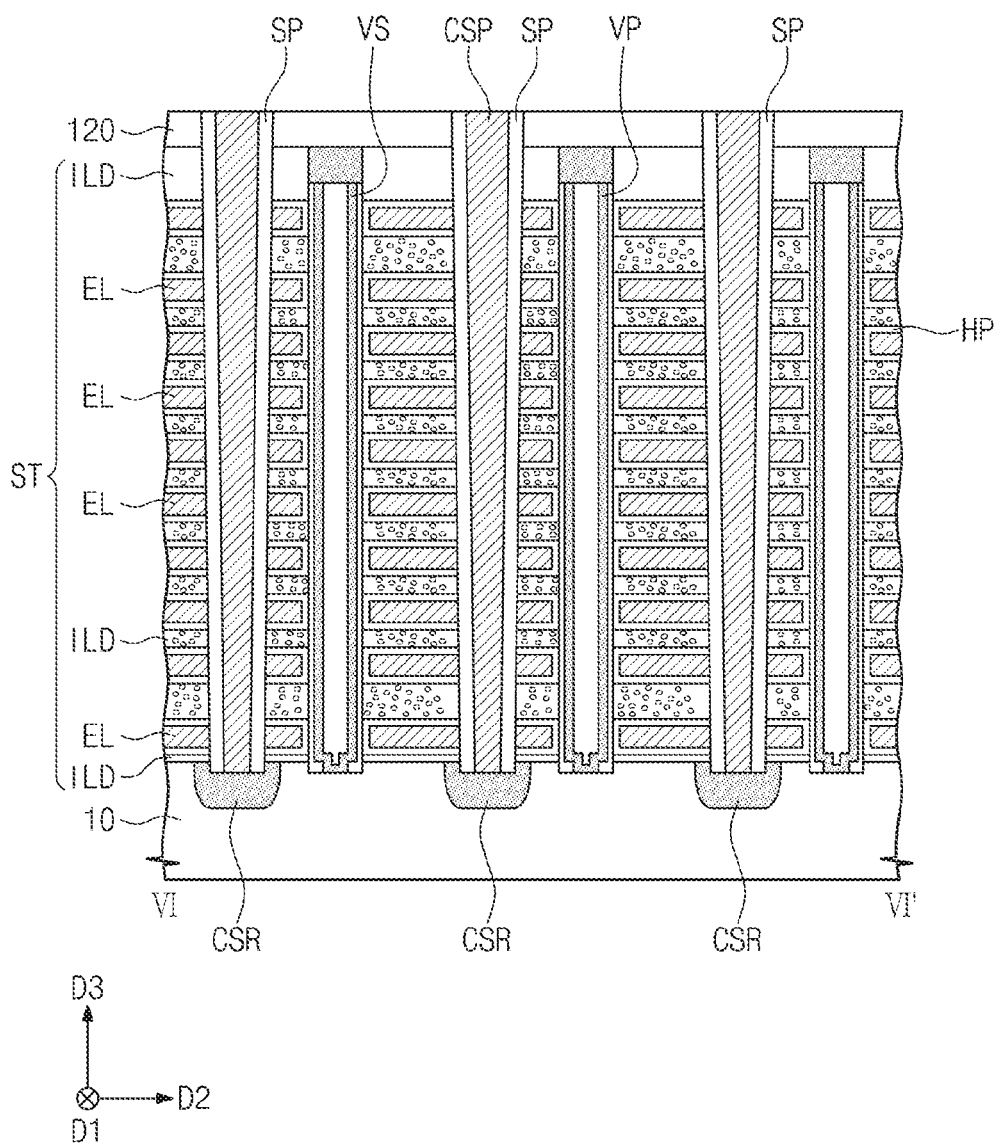

Referring to FIGS. 3 and 30, common source regions CSR may be formed in the substrate 10 between the stack structures ST. The common source regions CSR may extend in parallel along the first direction D1 and may be spaced apart from each other in the second direction D2. Dopants of a different conductivity type from the substrate 10 may be injected into the substrate 10 to form the common source regions CSR.

Sidewall insulating spacers SP may be formed to cover the sidewalls of the trenches T. Forming the sidewall insulating spacers SP may include conformally depositing a spacer layer on the substrate 10 having the stack structures ST, and performing an etch-back process on the spacer layer to expose the common source regions CSR. The spacer layer may be formed of an insulating material, and a thickness of the deposited spacer layer may be less than about a half of the minimum width of the trench T. For example, the spacer layer may be formed of, for example, at least one of a silicon oxide layer, a silicon nitride layer, a silicon oxynitride layer, and a low-k dielectric layer having a low dielectric constant.

Common source plug CSP may be formed in each of the trenches T having the sidewall insulating spacers SP. According to an example embodiment, the common source plug CSP may be disposed between the horizontal electrodes EL laterally adjacent to each other. The sidewall insulating spacers SP may be disposed between the common source plug CSP and the horizontal electrodes EL. Accordingly, the sidewall insulating spacers SP may cover sidewalls of the common source plug CSP. The common source plug CSP may extend in parallel to the horizontal electrodes EL.

Subsequently, referring again to FIGS. 3 and 4, a capping insulating layer 125 may be formed on the stack structures ST and the common source plugs CSP.

Bit line contact plugs BPLG may be formed to penetrate the capping insulating layer 125. The bit line contact plugs BPLG may be connected to the vertical structures VS, respectively. Next, bit lines BL may be formed on the capping insulating layer 125. The bit lines BL may extend in the second direction D2 and may be connected to the bit line contact plugs BPLG.

According to some example embodiments of the inventive concepts, because low-k dielectric layer having pores is disposed between horizontal electrodes vertically stacked on the substrate, the parasitic capacitance between the horizontal electrodes may be reduced. Further, the stress applied to the substrate by a stack structure formed by stacking insulating layers and horizontal electrodes in a alternating manner may be reduced or relaxed due to an inclusion of pores in one or some of the insulating layers.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three dimensional (3D) memory device, in which a plurality of memory cell strings are vertically arranged, comprising:
    a substrate;
    a stack structure on the substrate, the stack structure including a plurality of interlayer dielectric (ILD) layers and a plurality of gate electrodes alternately stacked on each other, at least one of the ILD layers including pores;
    a vertical structure penetrating the stack structure and electrically connected to the substrate; and
    a data storage layer between the stack structure and the vertical structure.

2. The 3D memory device of claim 1, wherein the pores have different densities with respect to regions in the at least one of the ILD layers.

3. The 3D memory device of claim 1, wherein the at least one of the ILD layers includes a material having a dielectric constant smaller than silicon oxide.

4. The 3D memory device of claim 1, wherein the at least one of the ILD layers includes a first sub-ILD layer and a second sub-ILD layer, and the first and second sub-ILD layers are different from each other in terms of at least one of dielectric constants, thicknesses, porosities, and pore sizes.

5. The 3D memory device of claim 1, wherein the at least one of the ILD layers includes a first sub-ILD layer and a second sub-ILD layer, the first sub-ILD layer has a dielectric constant comparable to silicon oxide, and the second sub-ILD layer includes the pores and has a dielectric constant smaller than the first sub-ILD layer.

6. The 3D memory device of claim 1, wherein a first ILD layer from among the ILD layers, one gate electrode from among the gate electrodes on the first ILD layer, and a second ILD layer from among the ILD layers on the one gate electrode have a thickness relationship such that thicknesses of the first ILD layer, the gate electrode, and the second ILD layer increase in an order named.

7. The 3D memory device of claim 1, wherein at least two of the ILD layers have substantially different thicknesses from each other.

8. The 3D memory device of claim 1, wherein side surfaces of the ILD layers protrude past side surfaces of the gate electrodes.

9. The 3D memory device of claim 1, wherein the at least one of the ILD layers including pores includes at least one of:
    a top ILD layer including the pores and being located at a top of the stack structure;
    a center ILD layer including the pores and being at a center of the stacked structure;
    a bottom ILD layer including the pores and being located at a bottom of the stack structure.

10. The 3D memory device of claim 1, wherein the at least one of the ILD layers including the pores is provided in plurality in a sparse manner.

11. The 3D memory device of claim 1, wherein
the vertical structure includes a first portion and a second portion,
the first portion has a pipe shape and is closed at a bottom thereof,
the second portion has a pipe shape and is connected to the first portion, and
the first portion electrically connects the second portion to the substrate.

12. The 3D memory device of claim 11, wherein the closed bottom of the first portion is lower than a top surface of the substrate.

13. The 3D memory device of claim 1, wherein the data storage layer includes a first portion extending between the vertical structure and the stack structure and a second portion horizontally extending between the ILD layers and the gate electrodes.

14. The 3D memory device of claim 1, wherein a dielectric constant of the at least one of the ILD layers is lower than a dielectric constant of the data storage layer.

15. A three dimensional (3D) memory device, in which a plurality of memory cell strings are vertically arranged, comprising:
peripheral circuitry; and
a cell array structure on the peripheral circuitry and electrically connected to the peripheral circuitry, the cell array structure including,
a substrate;
a stack structure including a plurality of interlayer dielectric (ILD) layers and a plurality of gate electrodes alternately stacked, at least one of the ILD layers including pores;
a vertical structure penetrating the stack structure and electrically connected to the substrate; and
a data storage layer between the stack structure and the vertical structure.

16. The 3D memory device of claim 15, wherein the pores are distributed in different densities according to regions in the at least one of the ILD layers.

17. The 3D memory device of claim 15, wherein the at least one of the ILD layers includes a material having a dielectric constant smaller than silicon oxide.

18. The 3D memory device of claim 15, wherein when the at least one of the ILD layers includes a first sub-ILD layer and a second sub-ILD layer, and the first and second sub-ILD layers are different from each other in terms of at least one of dielectric constants, thicknesses, porosities, and pore sizes.

19. The 3D memory device of claim 15, wherein the at least one of the ILD layers includes a first sub-ILD layer and a second sub-ILD layer, the first sub-ILD layer has a dielectric constant comparable to silicon oxide, and the second sub-ILD layer includes the pores and has a dielectric constant smaller than silicon oxide.

20. A three dimensional (3D) memory device, in which a plurality of memory cell strings are vertically arranged, comprising:
a substrate;
a stack structure on the substrate, the substrate including a plurality of interlayer dielectric (ILD) layers and a plurality of gate electrodes alternately stacked on each other, the ILD layers including at least one non-porous ILD layer having a first dielectric constant and at least one porous ILD layer having a second dielectric constant, the second dielectric constant being smaller than the first dielectric constant;
a vertical structure penetrating the stack structure and electrically connected to the substrate; and
a data storage layer between the stack structure and the vertical structure.

* * * * *